US009705450B2

(12) United States Patent
Swanson et al.

(10) Patent No.: US 9,705,450 B2
(45) Date of Patent: Jul. 11, 2017

(54) APPARATUS AND METHODS FOR TIME DOMAIN MEASUREMENT OF OSCILLATION PERTURBATIONS

(75) Inventors: Paul D. Swanson, Santee, CA (US); Richard L. Waters, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 993 days.

(21) Appl. No.: 13/168,603

(22) Filed: Jun. 24, 2011

(65) Prior Publication Data

US 2012/0326700 A1  Dec. 27, 2012

(51) Int. Cl.
*G01P 15/02* (2013.01)
*H03B 5/30* (2006.01)
(Continued)

(52) U.S. Cl.
CPC ........... *H03B 5/30* (2013.01); *G01C 19/5705* (2013.01); *G01P 15/097* (2013.01);
(Continued)

(58) Field of Classification Search
CPC ...... G01P 15/02; G01P 15/097; G01L 5/0057; G01R 19/0092; G01R 19/0084; G01R 19/00; G01R 19/165
(Continued)

(56) References Cited

U.S. PATENT DOCUMENTS 3,505,494 A * 4/1970 Reutschi ............... B23K 9/007
                                                            219/95
3,783,601 A   1/1974 Curran
(Continued)

FOREIGN PATENT DOCUMENTS

CN  101529993   9/2009
DE  102009001856  9/2010
(Continued)

OTHER PUBLICATIONS

Engineering Toolbox, Centripetal and Centrifugal Force and Acceleration, p. 1-7, Dec. 27, 2015, http://www.engineeringtoolbox.com/centripetal-acceleration-d_1285.html.*
(Continued)

*Primary Examiner* — Jermele M Hollington
*Assistant Examiner* — Christopher McAndrew
(74) *Attorney, Agent, or Firm* — SPAWAR Systems Center Pacific; Kyle Eppele; Ryan J. Friedl

(57) ABSTRACT

An oscillatory apparatus and methods of utilizing the same. In one embodiment, the apparatus comprises a force sensor having a proof mass, with one or more sensing electron tunneling electrodes disposed thereon, and a frame comprising one or more reference electron tunneling electrodes. Conductive plates disposed on the sensor base and capping wafers induce oscillations of the proof mass. The sensing and the reference electrode pairs are disposed in a face-to-face configuration, thus forming a digital switch characterized by one or more closed states. In the closed state, the switch generates triggering events, thereby enabling the sensing apparatus to generate a digital output indicative of the mass position. The time period between consecutive trigger events is used to obtain mass deflection due to external forcing. Time separation between the triggering events is based on the physical dimensions established
(Continued)

during fabrication, thus not requiring ongoing sensor calibration.

19 Claims, 32 Drawing Sheets

(51) Int. Cl.
  *G01P 15/097* (2006.01)
  *G01P 15/125* (2006.01)
  *G01P 15/135* (2006.01)
  *G01C 19/5705* (2012.01)
  *H03K 17/955* (2006.01)

(52) U.S. Cl.
  CPC .......... *G01P 15/125* (2013.01); *G01P 15/135* (2013.01); *H03K 17/955* (2013.01)

(58) Field of Classification Search
  USPC ..................................................... 324/76.11
  See application file for complete search history.

(56) References Cited

U.S. PATENT DOCUMENTS

| | | | |
|---|---|---|---|
| 4,244,336 A * | 1/1981 | Fitzner | F02P 5/1556 |
| | | | 123/406.57 |
| 5,359,893 A | 11/1994 | Dunn | |
| 5,646,346 A | 7/1997 | Okada | |
| 5,962,845 A | 10/1999 | Yee | |
| 6,050,393 A | 4/2000 | Murai | |
| 6,491,647 B1 * | 12/2002 | Bridger et al. | 600/585 |
| 6,838,806 B2 | 1/2005 | Chua et al. | |
| 7,279,760 B2 * | 10/2007 | Viefers | G11C 11/56 |
| | | | 200/181 |
| 7,591,201 B1 | 9/2009 | Bernstein | |
| 7,612,424 B1 * | 11/2009 | Espinosa | B81B 3/0054 |
| | | | 200/181 |
| 7,668,153 B2 | 2/2010 | Zavadsky | |
| 7,750,746 B2 | 7/2010 | Onuma | |
| 8,490,462 B2 * | 7/2013 | Swanson | G01P 21/00 |
| | | | 73/1.38 |
| 2001/0022486 A1 | 9/2001 | Shibatani | |
| 2002/0174660 A1 * | 11/2002 | Venkatasubramanian | B01L 7/52 |
| | | | 62/3.7 |
| 2006/0062420 A1 | 3/2006 | Araki | |
| 2006/0196253 A1 | 9/2006 | Crawley et al. | |
| 2008/0223138 A1 | 9/2008 | Kurihara | |
| 2009/0071247 A1 | 3/2009 | Konaka | |
| 2009/0085683 A1 | 4/2009 | Morita et al. | |
| 2009/0206953 A1 | 8/2009 | Pavlov | |
| 2010/0103493 A1 | 4/2010 | Ide et al. | |
| 2010/0116630 A1 | 5/2010 | Pinkerton | |
| 2010/0132463 A1 | 6/2010 | Caminada et al. | |
| 2010/0207584 A1 | 8/2010 | Spartano | |
| 2010/0271314 A1 | 10/2010 | Rofougaran | |
| 2011/0084771 A1 | 4/2011 | Nagaraj et al. | |
| 2014/0062567 A1 * | 3/2014 | Waters | G01P 15/097 |
| | | | 327/306 |

FOREIGN PATENT DOCUMENTS

| | | |
|---|---|---|
| EP | 2360448 | 8/2011 |
| JP | 2009250929 | 9/1997 |
| JP | 2000500870 | 1/2000 |
| JP | 2000055670 | 2/2000 |
| JP | 2008224509 | 9/2008 |
| JP | 2009210324 | 9/2009 |
| JP | 2010169532 | 8/2010 |
| TW | 1269520 | 12/2006 |

OTHER PUBLICATIONS

European Patent Office Search Report, dated Mar. 18, 2016, PCT/US2013/025199.

* cited by examiner

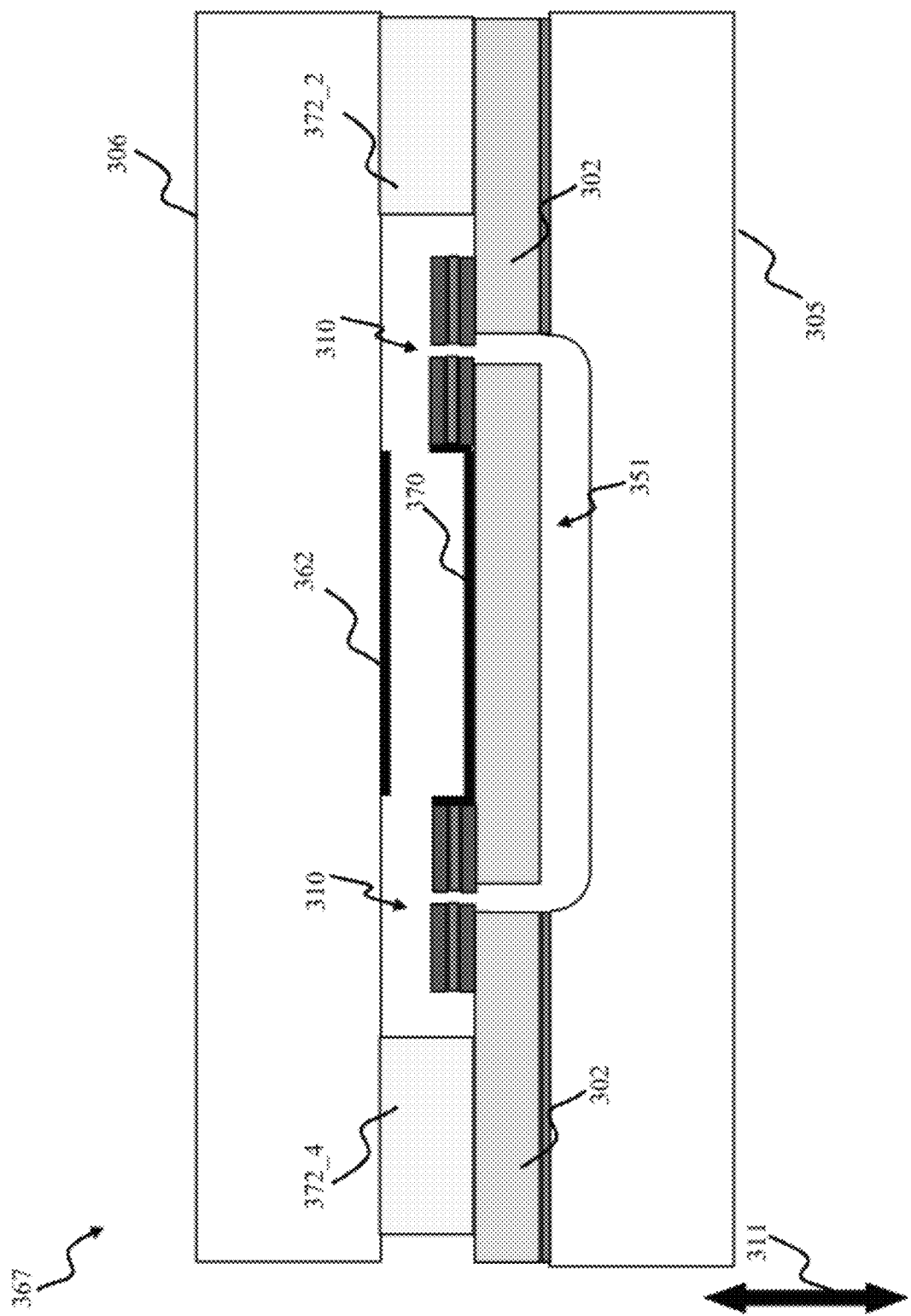

APPARATUS AND METHODS FOR TIME DOMAIN MEASUREMENT OF OSCILLATION PERTURBATIONS

RELATED APPLICATIONS

The present application is related to U.S. patent application Ser. No. 12/571,958, filed Oct. 1, 2009 and entitled "Nanoelectromechanical Tunneling Current Switch Systems", which is incorporated herein by reference in its entirety.

FIELD OF THE INVENTION

The present invention relates generally to oscillatory apparatus for use in sensing applications, and more particularly in one exemplary aspect to a time domain sensing apparatus, and methods of utilizing the same.

DESCRIPTION OF RELATED TECHNOLOGY

Accurate measurements of parameters (such as for example force) are often required in a wide variety of applications. Micro-electromechanical sensors (MEMS) devices such as accelerometers have been extensively used in, e.g., dynamic distance and speed measurements, inclination, machine vibration, buildings and structural monitoring, component placement in manufacturing, process control systems and safety installations. Angular rotation rate MEMS (also referred to as the gyroscope or the rate sensors) are useful in, inter alia, navigation, automotive (e.g., electronic stability control), entertainment (e.g., user motion detection for game consoles), photography (e.g., image stabilization), animal behavior studies and many other applications. Pressure sensors are similarly widely used in applications such as weather, industrial monitoring and control, aircraft and automotive, oil and gas exploration, flow sensing, acoustics, etc. Many other parameter measurement applications exist (such as for example, magnetic force measurements used in navigation and mineral exploration, or electrostatic force measurements used in microscopy, etc.).

However, most presently available inertial sensors of sufficient resolution for a given application are costly, thereby limiting their use and widespread adoption. Conversely, more inexpensive inertial sensor solutions currently available do not provide sufficient accuracy and stability required for many applications, such as industrial measurement. Existing sensor solutions (whether of the more costly or more inexpensive variety) also require periodic recalibration and dedicated signal conditioning circuitry, and are generally susceptible to noise interference, thus limiting installation flexibility.

Yet another drawback of these prior art solutions relates to their limited dynamic range; generally speaking, two or more separate sensors are required for sensing or measurement of parameter values of significantly different amplitude, thereby further increasing the cost and complexity of systems capable of measurement over wide dynamic ranges.

In the context of a force measurement, the typical prior art force sensor measures displacement (also often referred to as "deflection") of a spring-suspended proof mass in order to estimate a force acting on the proof mass. The methods of measuring such deflection vary in accuracy, variability, and cost of implementation. Various measurement approaches may be used, such as for example capacitive, piezo-resistive, electron tunneling sensing, and optical interferometry, in order to determine the proof mass deflection. In all of these approaches, the deflection (and thus the force) is inferred as a function of a measured voltage (or electric current), and therefore is inevitably subject to measurement errors due to, inter alia, thermal and electromagnetic noise. As a result, most existing force sensor solutions require very accurate signal conditioning circuitry (such as precision amplifiers, filters, voltage references, etc.), as well as periodic recalibrations to account for sensor aging (including e.g., changes in the physical properties or characteristics of the "spring" and/or proof mass with time), and electrical component drift.

Accordingly, there is a salient need for an improved high-accuracy and high-resolution force sensing apparatus having an increased dynamic range, that at the same time is both lower in cost and complexity as compared to existing solutions. Ideally, such improved sensing apparatus would also mitigate or completely obviate the need for calibration (i.e., be "self-calibrating"), and could be used in a wide variety of parametric sensing, measurement, or other applications.

SUMMARY OF THE INVENTION

The present invention satisfies the foregoing needs by providing, inter alia, a time-domain sensing apparatus and methods of use of the same.

In a first aspect of the invention, an oscillatory sensing apparatus is disclosed. In one embodiment, the apparatus includes: an oscillation apparatus; a driving circuit configured to drive the oscillation apparatus; at least one switch apparatus comprising a first element and a second element, and characterized by at least a first closed state; and a sensing circuit coupled to the at least one switch.

In one variant, the driving circuit drives the oscillation apparatus in a substantially pulsed fashion. In another variant, the driving circuit drives the oscillation apparatus in a substantially continuous fashion using a driving frequency.

In another variant, the sensing circuit generates a substantially digital output signal during oscillation of the oscillation apparatus.

In a further variant, the at least one switch apparatus includes a single electron tunneling tip pair, the first and second elements comprising the pair. Alternatively, the at least one switch apparatus includes a plurality of electron tunneling tip pairs, the first and second elements comprising one of the plurality of pairs.

In yet another variant, the apparatus comprises a Microelectro mechanical sensor (MEMS)-based apparatus.

In another embodiment, the apparatus includes: an oscillator; a driving circuit configured to drive the oscillator; a switch apparatus comprising a first element and a second element; and a sensing circuit coupled to the switch. In one variant, at least one of the first element or the second element is disposed on the oscillator, and the sensing circuit is configured to output a substantially digital signal indicative of a first closed state, the first closed state corresponding to the oscillator being placed substantially in a first reference position such that the first and second elements are aligned. The signal includes a first event and a second event, the second event separated from the first event by a first time period, the first period of time being related at least in part to a frequency of oscillation of the oscillator and an applied force.

In one variant, the applied force is substantially irregular, and the oscillation of the oscillator motion is characterized by a substantially non-linear restoring force.

In another aspect of the invention, a time-domain force sensing apparatus is disclosed. In one embodiment, the apparatus includes: a first structure comprising: a proof mass comprising a plurality of sides; at least one movable electrode disposed on the proof mass; and at ground element disposed on a first side of the plurality of sides of the proof mass, and coupled to a ground plane; a second structure comprising: at least one reference electrode; and a first conductive element disposed along a first side of the second structure; a driving circuit electrically coupled to the first conductive element and the ground plane, and configured to induce oscillatory motion of the proof mass relative to the reference electrode at a first frequency; and a sensing circuit coupled to the at least one reference electrode and to the at least one movable electrode, the sensing circuit configured to output a signal indicative of at least one predetermined spatial configuration between the at least one reference electrode and the at least one movable electrode.

In one variant, the signal includes at least a first pulse associated with a first time value, and a second pulse associated with a second time value; and a difference between the second time value and the first time value is configured based at least in part on the first frequency and a displacement of the proof mass caused by the inertial force.

In another aspect of the invention, a method for measuring an external parameter using an oscillator is disclosed. In one embodiment, the oscillator is capable of undergoing an oscillatory motion with respect to a reference position, the motion characterized by a first time period, and a switch characterized by at least a first closed state. The method includes: inducing an oscillatory motion within the oscillator; and using a sensing circuit coupled to the switch to output a signal indicative of the switch being in the at least the first closed state, and a first event and a second event, the second event separated from the first event by a second period, the second period being related at least in part to the first time period and the external parameter.

In one variant of the method, the first time period substantially matches a natural resonance frequency of the oscillator.

In another variant, the oscillatory motion of the oscillator is due to a substantially non-linear restoring force.

In another variant, the step of inducing includes applying a sinusoidal driving force to the oscillator for a first time interval.

Alternatively, the step of inducing includes applying a substantially intermittent driving force to the oscillator.

In another aspect of the invention, a sensor is disclosed. In one embodiment, the sensor is made operable by the method comprising: coupling a sensing circuit to at least one reference element and to at least one sensing element, the at least one sensing element being capable of oscillatory motion relative to the at least one reference element, the oscillatory motion characterized by a first time period and a reference position; and configuring the sensing circuit to output a signal indicative of the least one sensing element being positioned at a first position relative to the at least one reference element.

In yet a further aspect of the invention, a method of sensing a parameter is disclosed. In one embodiment, the method includes: inducing an oscillation in an oscillator; applying the parameter to the oscillator to induce an influence thereon; generating signals from electrodes associated with the oscillator, the signals corresponding to the position of the electrodes as a function of time, the position being related at least in part to the influence; and estimating the parameter based at least on the generated signals.

In another aspect of the invention, an oscillatory apparatus is disclosed. In one embodiment, the apparatus includes: an oscillator configured to oscillate based at least in part on a drive signal; and a switch comprising at least first and second sensing elements.

In one variant, when the oscillator is in a first position, the apparatus generates a first substantially digital output signal; and when the oscillator is in a second position, the apparatus generates a second substantially digital output signal.

In another variant, the first and the second sensing elements comprise a pair of tunneling electrodes.

In a second embodiment, the oscillatory apparatus includes: an oscillator configured to oscillate based at least in part on a drive signal; and a switch comprising at least first and second sensing elements. The position of the oscillator can be determined as function of time based on an output signal generated by the switch.

In one variant, the oscillator includes at least one cantilever and a proof mass associated therewith.

In yet another embodiment, the oscillatory apparatus includes: an oscillator; a driving circuit in communication with the oscillator; and a switch circuit in communication with the oscillator. The apparatus generates a substantially digital output signal that is related at least in part to an externally applied influence; and the accuracy of the digital output signal does not substantially drift or vary as a function of changes in one or more physical properties of the oscillator over time. In another embodiment, the apparatus includes: an oscillator; a driving circuit in communication with the oscillator; and a switch circuit in communication with the oscillator; the apparatus generates a substantially digital output signal that is related at least in part to an externally applied influence; and the driving circuit is configured to vary a driving signal applied to the oscillator so as to vary the amplitude of oscillations of the oscillator, the varying of amplitude enabling a change of dynamic range of the sensor apparatus.

In still a further aspect of the invention, a method of operating an oscillatory device is disclosed. In one embodiment, the method includes: inducing an oscillation in an oscillator of the device using a driving signal; and generating a substantially digital output from the device using at least first and second electrodes, the output being generated based at least in part on a clock signal, the clock signal having a predetermined jitter. The jitter substantially eliminates aliasing of the output.

In another embodiment, the method includes: inducing an oscillation in an oscillator of the device using a driving signal; intentionally inducing jitter within the driving signal; generating a substantially digital output from the device using at least first and second electrodes, the output being generated based at least in part on a clock signal, the clock signal having an intentionally induced jitter associated therewith, the generating including an averaging of signals. The jitter substantially increases precision of the digital output by substantially eliminating quantization error.

In another aspect of the invention, an oscillatory microelectro mechanical sensor (MEMS) apparatus is disclosed. In one embodiment, the apparatus includes: a micro-scale oscillator; a driving circuit in communication with the oscillator; and a switch circuit in communication with the oscillator. The apparatus generates a substantially digital output signal that is related at least in part to an externally applied influence; and the accuracy of the digital output signal does not substantially drift or vary as a function of time based at least in part on use of the micro-scale oscillator.

In still a further aspect of the invention, a method of operating an oscillatory apparatus so as to be able to sense a parameter over a varying dynamic range is disclosed. In one embodiment, the method includes: inducing a first oscillation in an oscillator of the apparatus, the oscillation having a first amplitude associated therewith; applying the parameter of a first value to the oscillator to induce a first influence thereon; generating first signals from electrodes associated with the oscillator, the signals corresponding to the position of the electrodes as a function of time, the position being related at least in part to the first influence; and estimating the first value based at least on the generated first signals. The method further includes: inducing a second oscillation in the oscillator, the oscillation having a second amplitude associated therewith; applying the parameter of a second value to the oscillator to induce a second influence thereon, the second value not being within the dynamic range of the oscillator when the first amplitude is applied; generating second signals from electrodes associated with the oscillator, the signals corresponding to the position of the electrodes as a function of time, the position being related at least in part to the second influence; and estimating the second value based at least on the generated second signals.

In another aspect of the invention, a method of estimating an externally applied parameter using an oscillatory device is disclosed. In one embodiment, the method includes: inducing an oscillation in an oscillator of the device using a driving signal; generating an output from the device using at least first and second electrodes, the output relating to a plurality of displacement values; and estimating a value of the applied parameter from the output, the plurality of displacement values being fit to a predetermined mathematical function.

In one variant, the predetermined function includes a substantially sinusoidal function. Alternatively, the predetermined function may comprise a substantially non-sinusoidal function.

Further features of the present invention, its nature and various advantages will be more apparent from the accompanying drawings and the following detailed description.

BRIEF DESCRIPTION OF THE DRAWINGS

The features, objectives, and advantages of the invention will become more apparent from the detailed description set forth below when taken in conjunction with the drawings, wherein:

FIG. 2A-1 through 2A-9 are a series of plots depicting the simulation of acceleration measurement relative error as a function of acceleration for different values of oscillation amplitude and trigger position separation, according to one embodiment of the invention.

FIG. 3 is a top perspective view of one embodiment of a time-domain sensing apparatus comprising a tunneling position indicator switch according to the invention.

FIGS. 3B-1 and 3B-2 are top plan views illustrating various embodiments of switch spatial configurations for use with the time-domain sensing apparatus of the invention.

FIG. 3F is a side cross-section view illustrating one embodiment of a time-domain sensing apparatus comprising a suspended proof mass assembly and two sets of dual-electrode switches according to the invention.

FIG. 4 is a block diagram depicting one embodiment of a time-domain force sensing apparatus according to the invention, comprising two dual-electrode switches and a bipolar driver apparatus.

FIG. 5 is a functional block diagram depicting one embodiment of a system employing the time-domain sensing apparatus of the invention.

FIG. 6 is a timing diagram illustrating an exemplary operational sequence for the time-domain force sensing system of FIG. 5.

DETAILED DESCRIPTION

Figure 1:
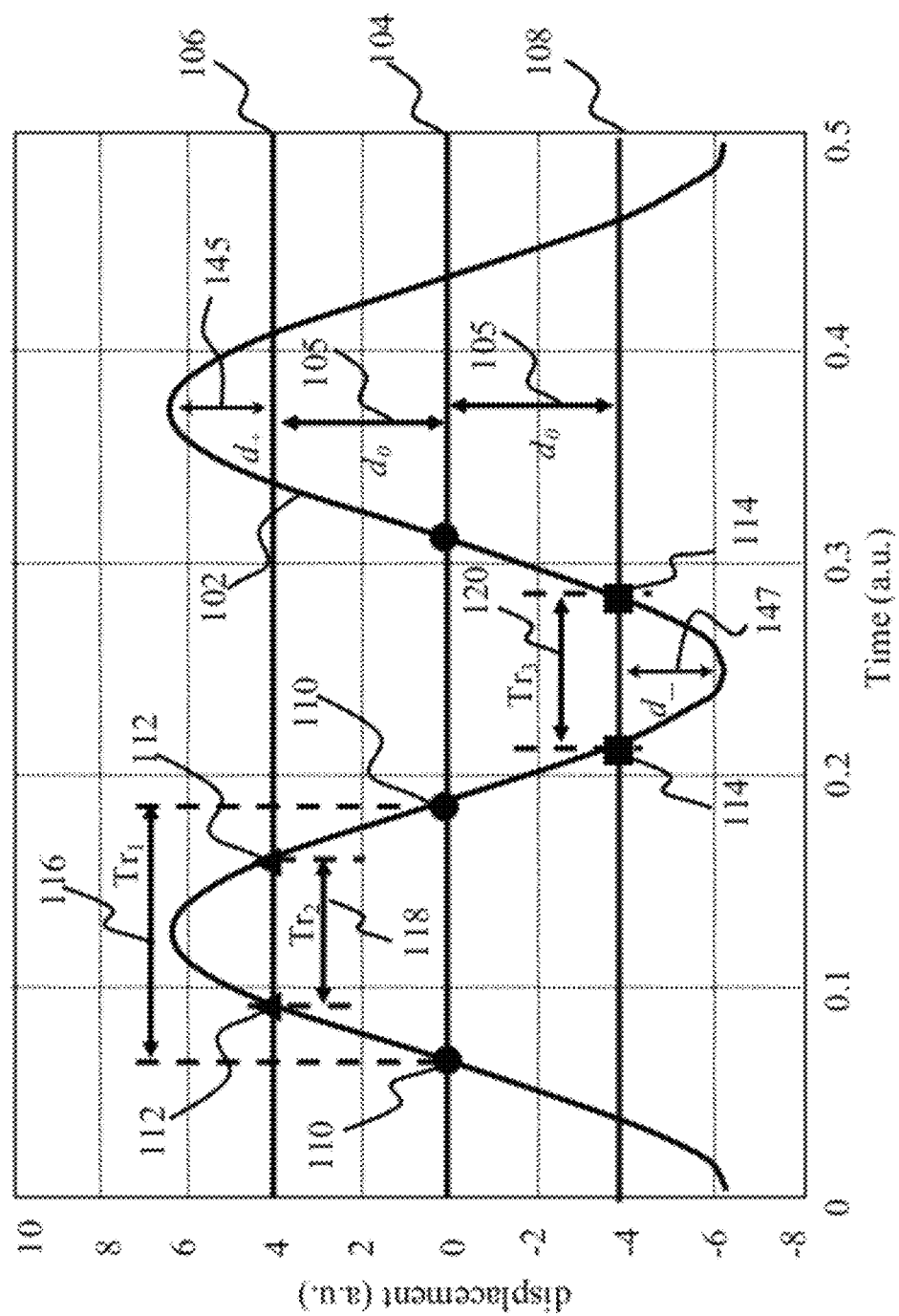
FIG. 1 is a plot illustrating one embodiment of a method for detecting oscillator position using trigger events in the absence of external forcing.

Reference is now made to the drawings wherein like numerals refer to like parts throughout.

As used herein, the terms "computer", "computing device", and "computerized device", include, but are not limited to, mainframe computers, workstations, servers, personal computers (PCs) and minicomputers, whether desktop, laptop, or otherwise, personal digital assistants (PDAs), handheld computers, embedded computers, programmable logic devices, digital signal processor systems, personal communicators, tablet computers, portable navigation aids, J2ME equipped devices, cellular telephones, smartphones, personal integrated communication or entertainment devices, or literally any other device capable of executing a set of instructions and processing an incoming data signal.

As used herein, the term "computer program" or "software" is meant to include any sequence or human or machine cognizable steps which perform a function. Such program may be rendered in virtually any programming language or environment including, for example, C/C++, C#, Fortran, COBOL, MATLAB™, PASCAL, Python, Verilog, VHDL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Binary Runtime Environment (e.g., BREW), and the like.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, "flash" memory (e.g., NAND/NOR), memrister memory, and PSRAM.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the term "proof mass" refers generally, and without limitation, to a sensor assembly configured for oscillatory motion due to an external influence (e.g., force), and subject to a restorative influence.

As used herein, the terms "oscillator", and "oscillating mass" refer generally, and without limitation, to an assembly configured for periodic or aperiodic displacement with respect to a reference position.

As used herein, the terms "top", "bottom", "side", "up", "down", "left", "right", and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

As used herein, the term "spring" refers generally, and without limitation, to an element configured to provide a restorative force to an oscillator or oscillating mass.

Overview

The present invention provides, in one salient aspect, a robust, low-cost and high resolution oscillatory apparatus (such as might be used in sensing or measurement applications), and methods of implementing and using the same.

In one exemplary embodiment, the oscillatory apparatus includes a controlled oscillator coupled to a switch apparatus (having at least one first element and at least one second element, which form one (or more) closed switch states), a driving circuit, and a sensing circuit. The driving circuit provides a driving signal configured to induce the oscillatory motion, which, in turn, displaces the one (or more) first switch element with respect to the one (or more) second element.

In one approach, the driving signal includes a time-gated (or "pinged") signal that is turned on and off (e.g., periodically). In another approach, the oscillator is driven in a continuous fashion, such as via a time varying wave function.

When the first element is aligned with the second element of the switch, a trigger signal is generated by the sensing circuit, indicating a closed switch state. In one exemplary implementation, two electron tunneling electrodes (one fixed and one movable) are used as the switch and the signal includes a tunneling discharge pulse caused by the close proximity of electrode tips when the electrodes are aligned in the closed switch position. By measuring the time interval between successive trigger events (indicative of the oscillator passing through a reference position) the period of oscillations is determined, and thereby the external force acting upon the apparatus can be derived.

In another implementation, additional tunneling electrodes are used in order to indicate when the oscillator passes through additional trigger positions. By combining time periods corresponding to the oscillator passing through successive trigger positions, the period and the amplitude of oscillator motion is estimated, hence advantageously enabling parameter (e.g., force) measurements that are independent of the oscillation amplitude.

The exemplary time-domain oscillatory apparatus is configured to provide digital (time-based) output, rather than an analog signal output. Such configuration ensures that the accuracy of the device is only dependent on the consistency of the triggering events, the nature of the oscillation (whether harmonic, or alternatively non-harmonic), and the accuracy of the time measurement of adjacent triggered events. Since the triggering events are based on the physical dimensions established during fabrication, the proposed design advantageously does not require continuing calibration; i.e., is "self calibrating".

Moreover, the exemplary device also advantageously can measure parameters varying over a wide dynamic range. In one variant, such wide dynamic range capability is achieved through variation of the driving signal (and resulting in variation of the amplitude of the oscillation); greater amplitude oscillations allow for measurement of greater external influences (e.g., forces). In this fashion, a single oscillatory sensor according to the invention can be used to measure a broad range of values, thereby obviating use of multiple sensors tuned to particular (more narrow) ranges as in the prior art.

Methods and apparatus for using jitter to enhance device accuracy are also disclosed.

DETAILED DESCRIPTION OF EXEMPLARY EMBODIMENTS

Detailed descriptions of the various embodiments and variants of the apparatus and methods of the invention are now provided. While primarily discussed in the context of an exemplary Micro-electro mechanical sensors (MEMS) device with electron tunneling sensing tip elements, it will be appreciated that the apparatus and methodologies discussed herein are not so limited. In fact, the oscillatory apparatus and methodologies described herein (MEMS or otherwise) may be used in any number of different contexts and applications, including but not limited to: sensing of optical, magnetic, piezoelectric, thermal, capacitive, chemical, and biological parameters, and signal domain conversion.

Sensing Method

One embodiment of a method of sensing is described with respect to FIG. 1. The exemplary time domain-based method of FIG. 1 is in the context of sensing a force, and relies on measuring deflection (also referred to as the bias) of a proof mass/spring-based oscillator that is being driven at a frequency $f_{drv}$. In one configuration, the oscillations of the oscillator are substantially harmonic. Alternatively, the oscillations may be substantially non-harmonic or (e.g., not perfect sinusoids).

As a brief aside, in classical mechanics, a harmonic oscillator is a system that, when displaced from its equilibrium position, experiences a restoring force F that is proportional to the displacement x as:

$$F = -kx \quad \text{(Eq. 1)}$$

If the restoring force is the only force acting on the oscillator system, the system is referred to as a simple harmonic oscillator, and it undergoes simple harmonic motion, characterized by sinusoidal oscillations about the equilibrium point, with constant amplitude and constant frequency $f_0$ (which does not depend on the amplitude):

$$f_0 = \frac{1}{T_0} = \frac{1}{2\pi}\sqrt{\frac{k}{m}} \quad \text{(Eq. 2)}$$

where:
k is the spring constant;
m is the oscillator mass
$f_0$ is the oscillator resonant frequency; and
$T_0$ is the corresponding period of oscillations.

In the method of FIG. 1 ("harmonic" variant), the driving frequency $f_{drv}$ is configured to match the natural resonance frequency $f_0$ of the proof mass/spring-based harmonic oscillator causing a sinusoidal motion of the proof mass, as shown by the trace 102 of FIG. 1. A system driven in-resonance typically requires a high-quality factor (Q) oscillating proof-mass system. It will be appreciated, however, that for this embodiment, literally any driving signal that maintains the oscillator in resonance may be used.

In another embodiment (not shown), the proof mass of the oscillator is driven "off-resonance", which provides, inter alia, precise control of the oscillation period and, hence, control of sensor accuracy. Off-resonance driven systems typically require a lower Q oscillator.

In the absence of any external forcing, the proof mass trajectory is centered at a reference position 104, as shown in FIG. 1. The oscillatory motion of the proof mass is measured using "triggering" events that are generated when the mass passes through trigger points corresponding to predefined physical locations. In the embodiment of FIG. 1, these locations comprise: (i) a neutral (also referred to as a zero-force) point 104; (ii) a positive trigger point 106; and (iii) a negative trigger point 108. In the embodiment of FIG. 1, the trigger positions 106, 108 are configured at the same predetermined distance $d_0$ 105 (also referred to as the trigger gap or trigger spacing) away from the reference position 104. As will be appreciated by those skilled in the art, other trigger configurations are compatible with the invention, such as, for example, asymmetric and/or multiple sets of positive and or negative trigger points 106, 108. In one specific variant, a single trigger position (such as the reference position 104 for example) is utilized.

In the embodiment of FIG. 1, the harmonic oscillations of the proof mass (as shown for example by the zero-force trace 102 of FIG. 1) causes each of the triggering points 104, 106, 108 to generate a pair of triggering events marked by the circles 110, triangles 112, and squares 114, respectively, for each full cycle of mass oscillation.

Timing of the triggering events 110, 112, 114 is measured using the same reference clock, and periods between successive crossings of the respective trigger points are computed. That is, the period $Tr_1$ (denoted by the arrow 116) is determined by subtracting the times of the successive trigger events 110 (which correspond to the mass crossing of the reference trigger point 104). The period $Tr_2$ (denoted by the arrow 118) is determined by subtracting the times of the successive trigger events 112 (which correspond to the mass crossing of the positive trigger point 106). The period $Tr_3$ (denoted by the arrow 120) is determined by subtracting the times of the successive trigger events 114 (which correspond to the mass crossing of the reference point 108).

When the proof mass is subjected to an external force $F_{ext}$ of a frequency $f_{ext} < f_{drv}$, the equilibrium point of the proof mass harmonic oscillations is shifted from the reference zero-force position. That is, a low frequency forces acting on the proof mass results in a low frequency shift (also referred to as the deflection) of the equilibrium point. Because applied inertial forces impact the DC bias of the simple harmonic oscillator, it is by definition immune to other zero-mean frequencies that may be coupled into the harmonic oscillator; that is, any high frequency oscillation centered around mean value (e.g., zero) will average to that mean value.

Figure 1A:
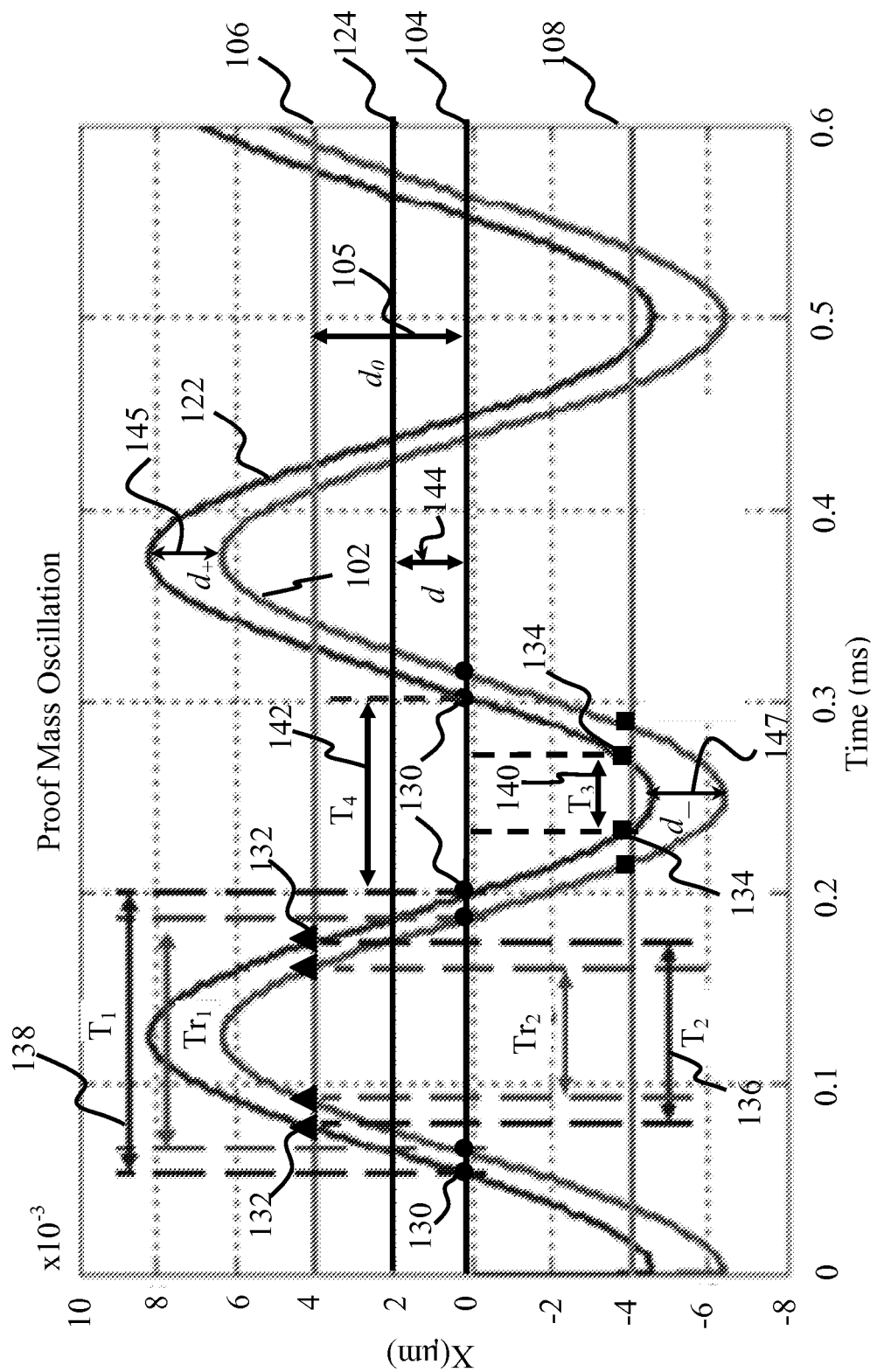
FIG. 1A is a plot illustrating one embodiment of a method detecting oscillator position using trigger events in presence of external forcing.

As indicated by the trace 122 in FIG. 1A, the oscillations of the proof mass in the presence of external forcing are shifted from the zero-force oscillations trajectory. As a result, the forced oscillation trace 122 is centered around a level (indicated by the line 124) that is deflected from the reference point 104.

Similar to the mass motion described with respect to FIG. 1, harmonic oscillations of the proof mass in the presence of external forcing (e.g., the trace 122 in FIG. 1A) cause each of the triggering points 104-108 to generate a pair of triggering events marked by circles 130, triangles 132, and squares 134, respectively, for each full cycle of mass oscillation. The external force acts to create an offset (bias) in the oscillator, which is detected by measuring the time periods between successive triggering points (such as the points 130, 132, 134 in FIG. 1A), as described in detail below.

Measured timing of the triggering events 130 is used to compute the period $T_1$ (denoted by the arrow 138), which corresponds to the forced mass crossing of the reference trigger point 104 on the upswing of the mass oscillation. The period $T_2$ (denoted by the arrow 136) is determined by subtracting the times of the successive trigger events 132, and T2 corresponds to the mass crossing of the positive trigger point 106. The period $T_3$ (denoted by the arrow 140) is determined by subtracting the times of the successive trigger events 134, and it corresponds to the mass crossing of the reference point 108. The period $T_4$ (denoted by the arrow 142) is determined by subtracting the times of the successive trigger events 130 and corresponds to the forced mass crossing of the reference trigger point 104 on the downswing of the mass oscillation, as illustrated in FIG. 1A.

In one exemplary approach, the measured periods between successive trigger events (i.e., $T_1$ through $T_4$) are used to obtain an estimate of the proof mass deflection d (denoted by the arrow 144 in FIG. 1A) from the reference point. The proof mass deflection $d_+$ around the oscillation maximum (as depicted by the arrow 145 in FIG. 1A) is obtained by combining the upswing reference point crossing period $T_1$ and the positive trigger point 106 crossing period $T_2$ as follows:

$$d_+ = A_+ \cos\frac{\pi T_1}{P}, \text{ where } A_+ = \frac{d_{0+}}{\cos\frac{\pi T_2}{P} - \cos\frac{\pi T_1}{P}} \quad \text{(Eq. 3)}$$

where:
- $d_0$ is the distance between the reference trigger point and the positive trigger point (the trigger gap);
- $A_+$ is the amplitude of the oscillations at the oscillation maxima;
- P is the period of oscillations defined as $P=T_1+T_3$;
- $d_+$ is the proof mass deflection estimate around the oscillation maxima;
- $T_1$ is the upswing reference point crossing period; and
- $T_2$ is the positive trigger point crossing period.

Similarly, the proof mass deflection $d_-$ around the oscillation minimum is (as depicted by the arrow 147 in FIG. 1A) obtained by combining the upswing reference point crossing period $T_3$ and the negative trigger point crossing period $T_4$ as follows:

$$d_- = A_- \cos\frac{\pi T_3}{P}, A_- = \frac{d_{0-}}{\cos\frac{\pi T_4}{P} - \cos\frac{\pi T_3}{P}} \quad \text{(Eq. 4)}$$

where:
- $d_0$ is the trigger gap;
- $A_-$ is the amplitude of the oscillations at the oscillation minima;
- P is the period of oscillations defined as $P=T_1+T_3$;
- $d_-$ is the proof mass deflection estimate around the oscillation minima;
- $T_3$ is the downswing reference point crossing period; and
- $T_4$ is the negative trigger point crossing period.

In one variant, two independent estimates, $d_+$ and $d_-$, are used to provide deflection measurements twice in each cycle (which may or may not be every half cycle) of oscillations, hence improving sensor frequency response. In another variant, the independent estimates $d_+$, $d_-$ are combined to produce an averaged deflection d thereby reducing measurement short term error. In yet another variant, an averaging window of variable length is used to further improve measurement precision.

In the deflection estimations according to Eqns. 3 and 4, the period of oscillation P is measured every oscillation cycle and the periods $T_1$ through $T_4$ are defined in FIG. 1A. Note that the calculated deflection is independent of the amplitude of oscillation.

In one embodiment useful for acceleration force measurements, the accelerations corresponding to the deflection derived from the Eqns. 3 and 4 are obtained as follows:

$$a_+ = d_0\left(\frac{2\pi}{P}\right)^2 \frac{\cos\frac{\pi T_1}{P}}{\cos\frac{\pi T_1}{P} - \cos\frac{\pi T_2}{P}} \quad \text{(Eq. 5)}$$

$$a_- = d_0\left(\frac{2\pi}{P}\right)^2 \frac{\cos\frac{\pi T_3}{P}}{\cos\frac{\pi T_4}{P} - \cos\frac{\pi T_3}{P}} \quad \text{(Eq. 6)}$$

The derivation of Eqns. 3 and 4 assumes that the external force is constant throughout the measurements of $T_1$ through $T_4$, which places a limit on the highest frequency of the external force that can be accurately resolved using these equations. Therefore, in the case of a continuous driving signal, it is necessary to select a driving frequency $f_{drv}$ that is higher than the maximum expected forcing frequency: i.e., $f_{ext} < f_{drv}$.

As is seen from Eqns. 3 and 4, the deflection estimates utilize ratios of measured period between reference events $T_1$ through $T_4$ and the period of forced oscillations P. Provided that all of these time intervals are obtained using the same reference clock, the final deflection (and, therefore, force) estimate advantageously becomes insensitive to clock systematic errors, such as, for example, drift due to aging, temperature, or other environmental changes. The calculation method of Eqns. 3 and 4 is also insensitive to changes in resonant frequency with temperature or other environmental effects.

In another embodiment of the invention, a clock jitter or variation (e.g., on the order of no more than a half clock cycle in one implementation) is purposely introduced into the reference clock such that low frequency inertial forces applied to the sensor can be averaged over time. As is well known, quantization noise or error cannot be averaged; introduction of such jitter advantageously mitigates or eliminates such quantization error, thereby allowing for effective averaging (and hence increasing the accuracy of the device).

Figure 1B:
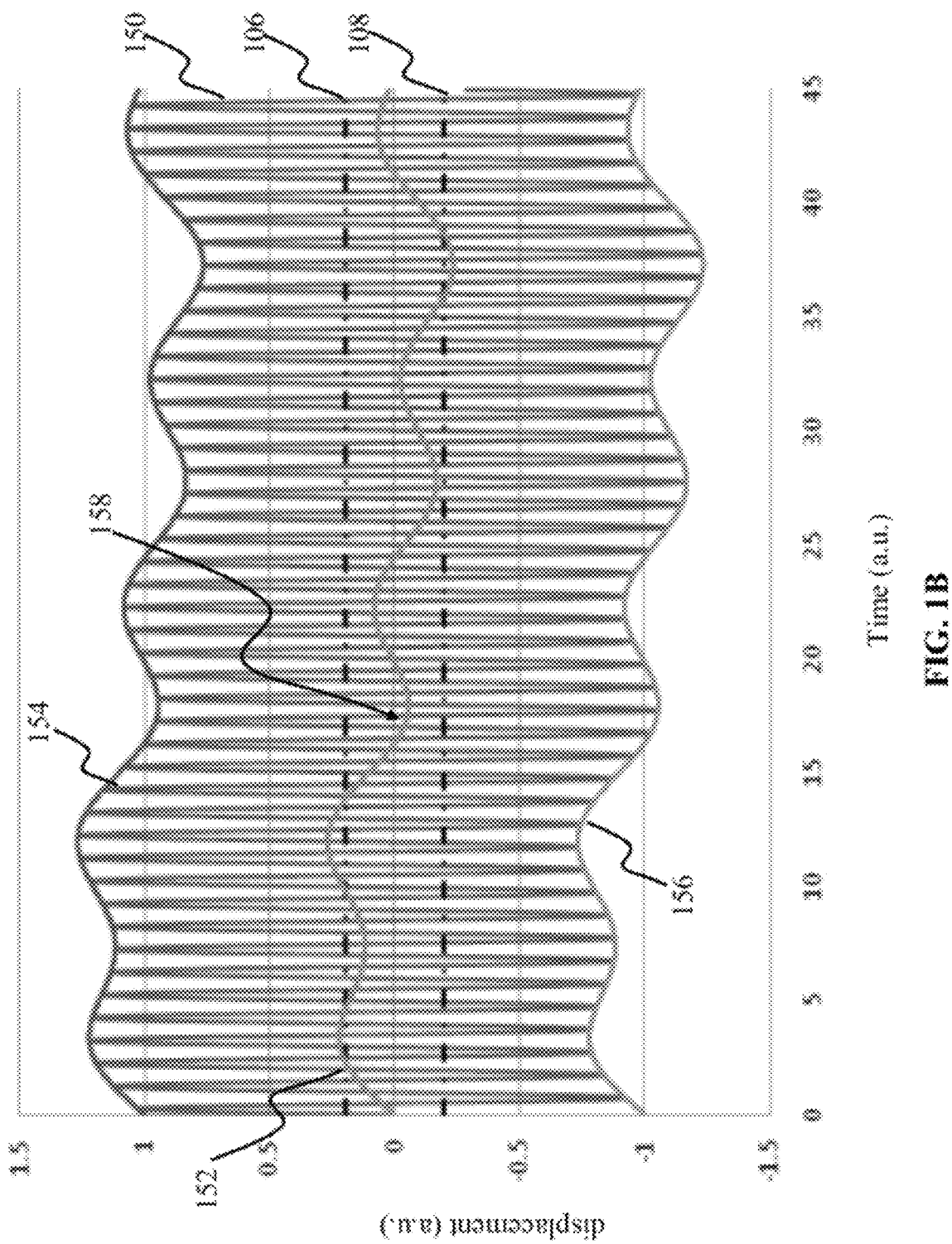
FIG. 1B is a plot illustrating one exemplary oscillator trajectory in the presence of time varying external forcing.

FIG. 1B illustrates one exemplary case of oscillations (harmonic in this instance) in the presence of external forcing. The trace 152 in FIG. 1B depicts the time-varying external forcing, and the trace 150 depicts the oscillator trajectory, which is a superposition of the oscillator high frequency constant amplitude oscillations and the variable amplitude forcing. The traces 154, 156 depict the upper and the lower extent of the oscillator motion, respectively. Note that by selecting the proof mass driving amplitude to exceed the span between the upper and the lower trigger points 106, 108, measurements of proof mass deflections due to external forcing are possible even when the deflection magnitude is smaller than the spacing between, the trigger points (as depicted by the arrow 158).

Figure 1C:
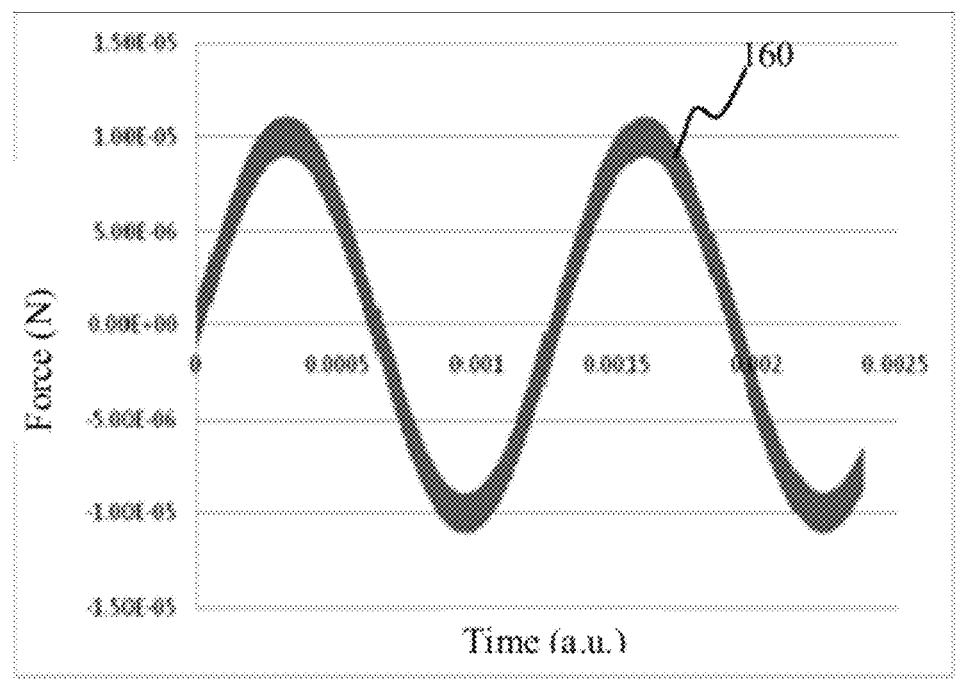
FIGS. 1C and 1D are plots illustrating one embodiment of a method of detecting oscillator position using trigger events in presence of random noise.
Figure 1D:
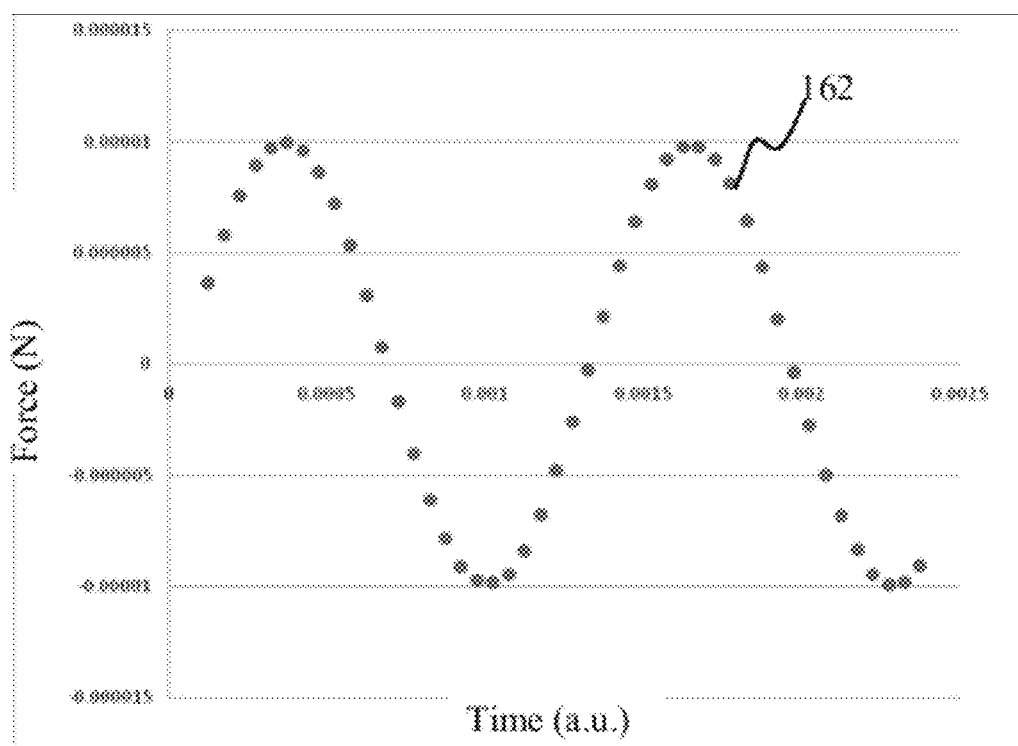

FIGS. 1C and 1D illustrate proof mass deflection measurements in the presence of high frequency white additive noise according to an embodiment of the invention. The trace 160 in FIG. 1C depicts exemplary input comprising a random noise signal that is superimposed on a sinusoidal input (acceleration) force signal. As previously noted, the driving force for the oscillator can be anything that keeps the device in resonance. The trace 162 shows the output of the measurement algorithm based on the change in timing between successive "triggering" events. Note that the original input force is reconstructed accurately (as indicated by the output 162) even when the input 160 has significant random variations.

In another approach, a generalized regression technique is applied to the equation of sinusoidal oscillations of a time varying amplitude A(t) and a period P. The fit equation in one exemplary implementation is defined as:

$$x_i = d + A(t)\cos\left(\frac{2\pi t_i}{P} + \varphi\right) \quad \text{(Eq. 7)}$$

where:
- d is the deflection from the reference trigger point;
- A(t) is the time-varying oscillation amplitude;
- P is the period of oscillations;
- $x_i$ are the positions of the oscillator at time $t_i$, and
- φ is a phase shift.

Eqn. 7 is a generic equation from which Eqns 3-6 herein may be derived.

It will be appreciated by those skilled in the art that many specific "curve fitting" models, describing amplitude changes with time A(t), may be used consistent with the invention, including but not limited to exponential, trigonometric, polynomial, or any combinations thereof. These may be used to, inter alia, take into account the effects of e.g., "jerk" (rapid non-linear acceleration events) or damping of the oscillator.

Furthermore, although Eqns. 1-7 describe a linear harmonic oscillator, the methodology described above is extendable to non-harmonic oscillators. For example, one such non-harmonic oscillator might be governed by a non-linear equation of motion, such as:

$$Fn(k) = -kG(x) \quad \text{(Eq. 8)}$$

where:
- x is the oscillator displacement; and
- G(x) is a non-linear function of displacement.

Similarly to the methodology of Eqns. 3-4, the non-linear equation of motion (Eqn. 8) is approximated using a polynomial (or another function) and the oscillator deflection as a function of period is obtained.

Figure 2:
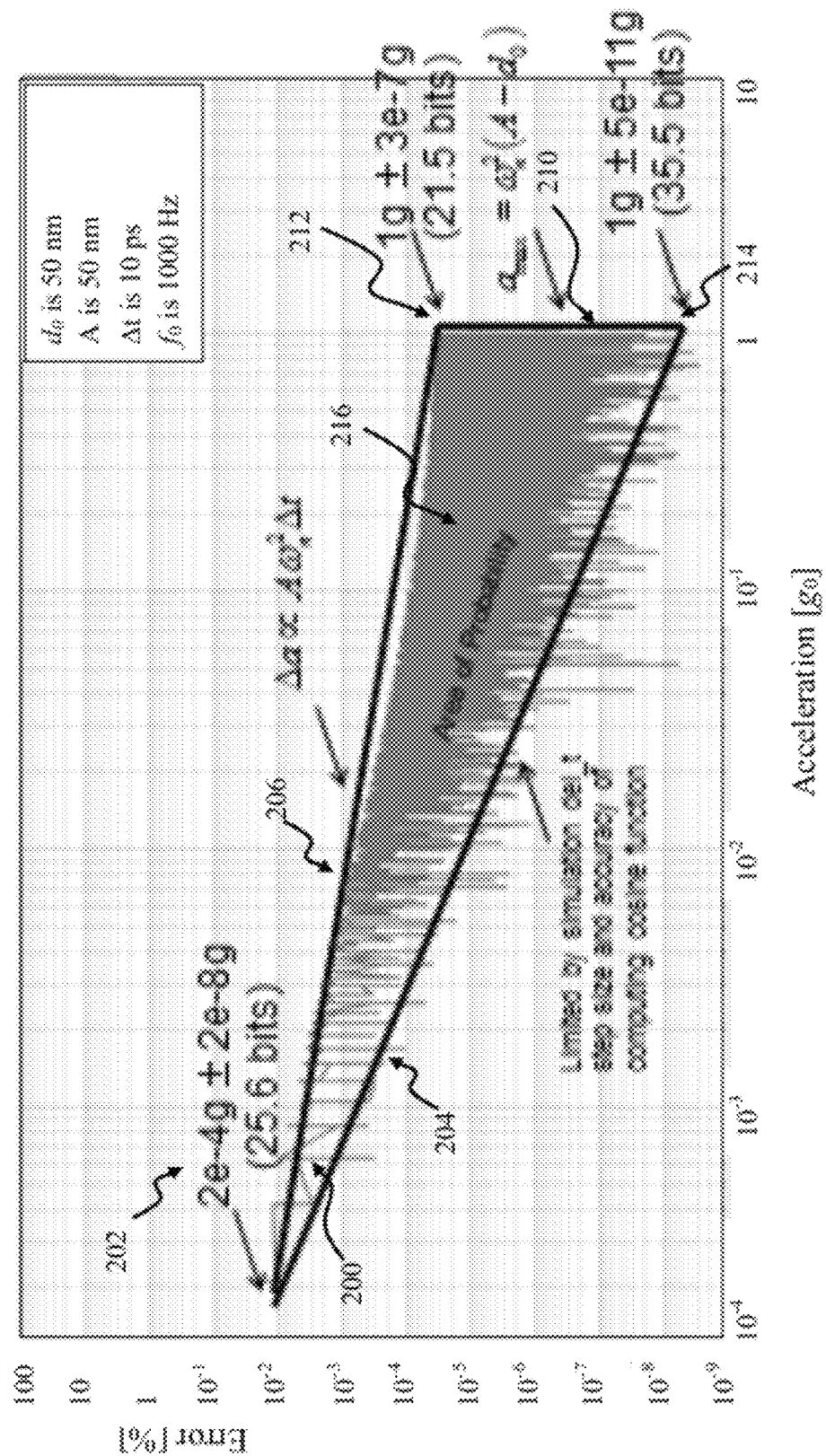
FIG. 2 is a plot depicting an exemplary simulation of acceleration measurement relative error as a function of acceleration according to one embodiment of the time-domain sensing method of the invention.
Figures 1, 2A:
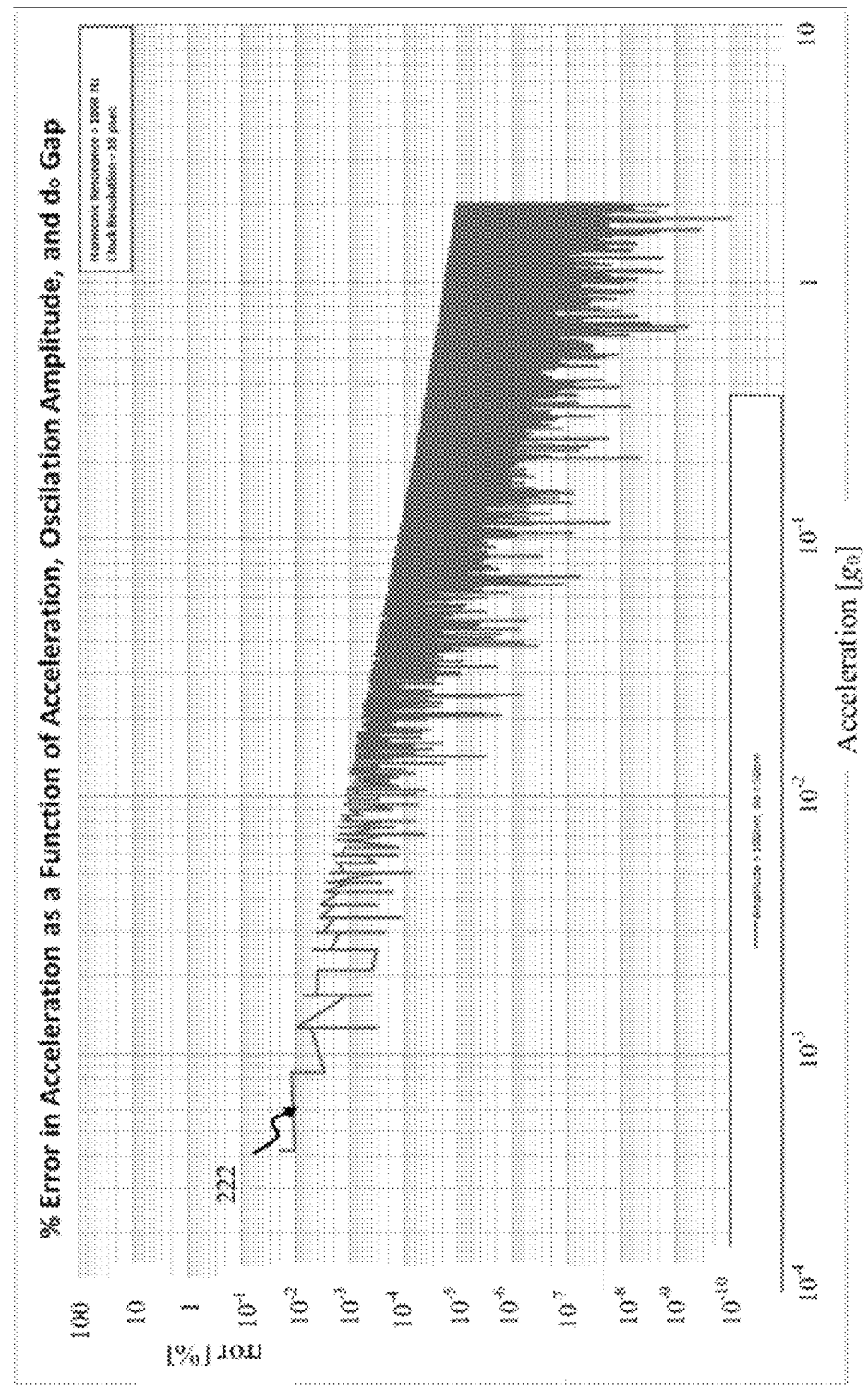
Figures 2, 2A:
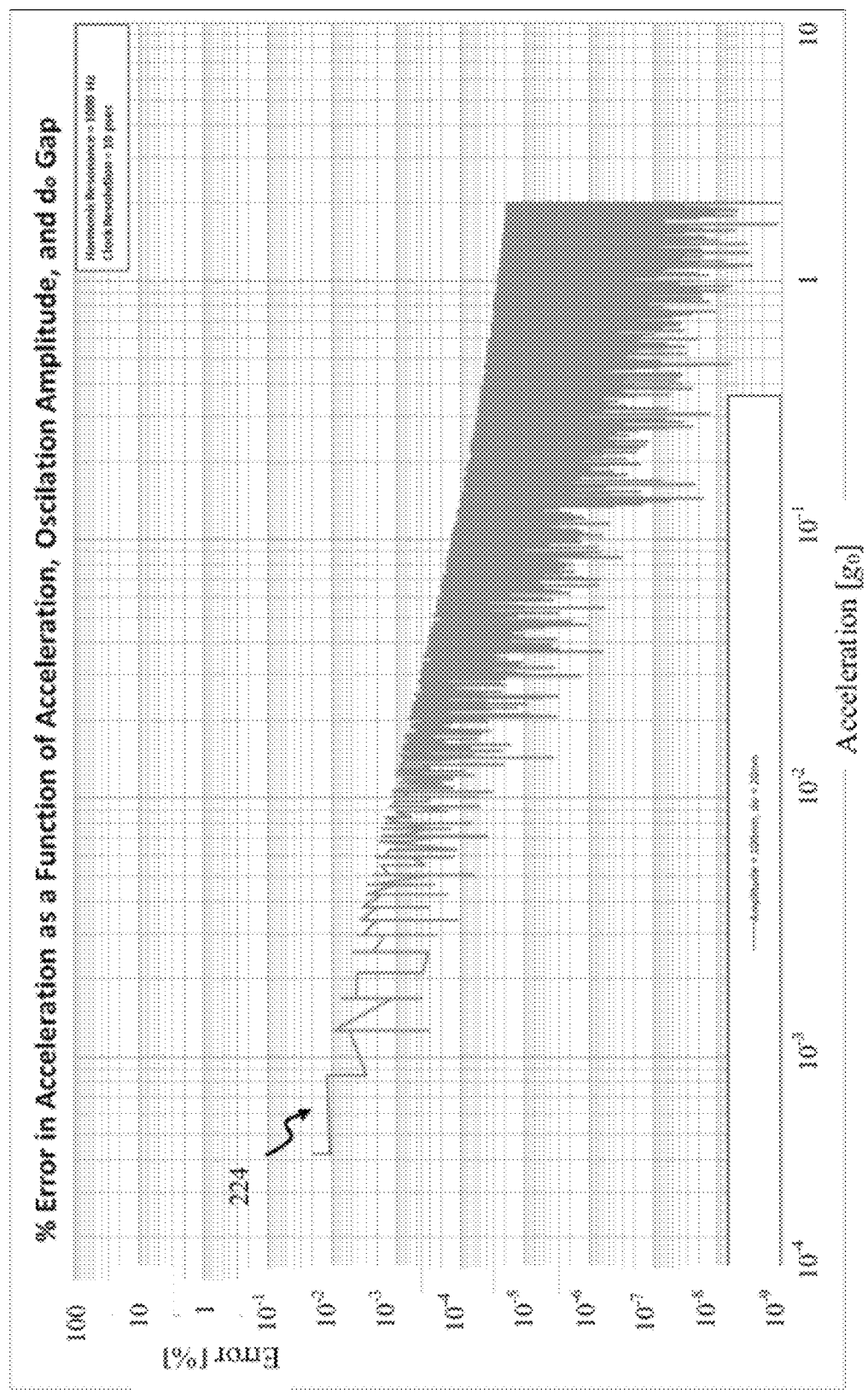
Figures 2, 2A, 3:
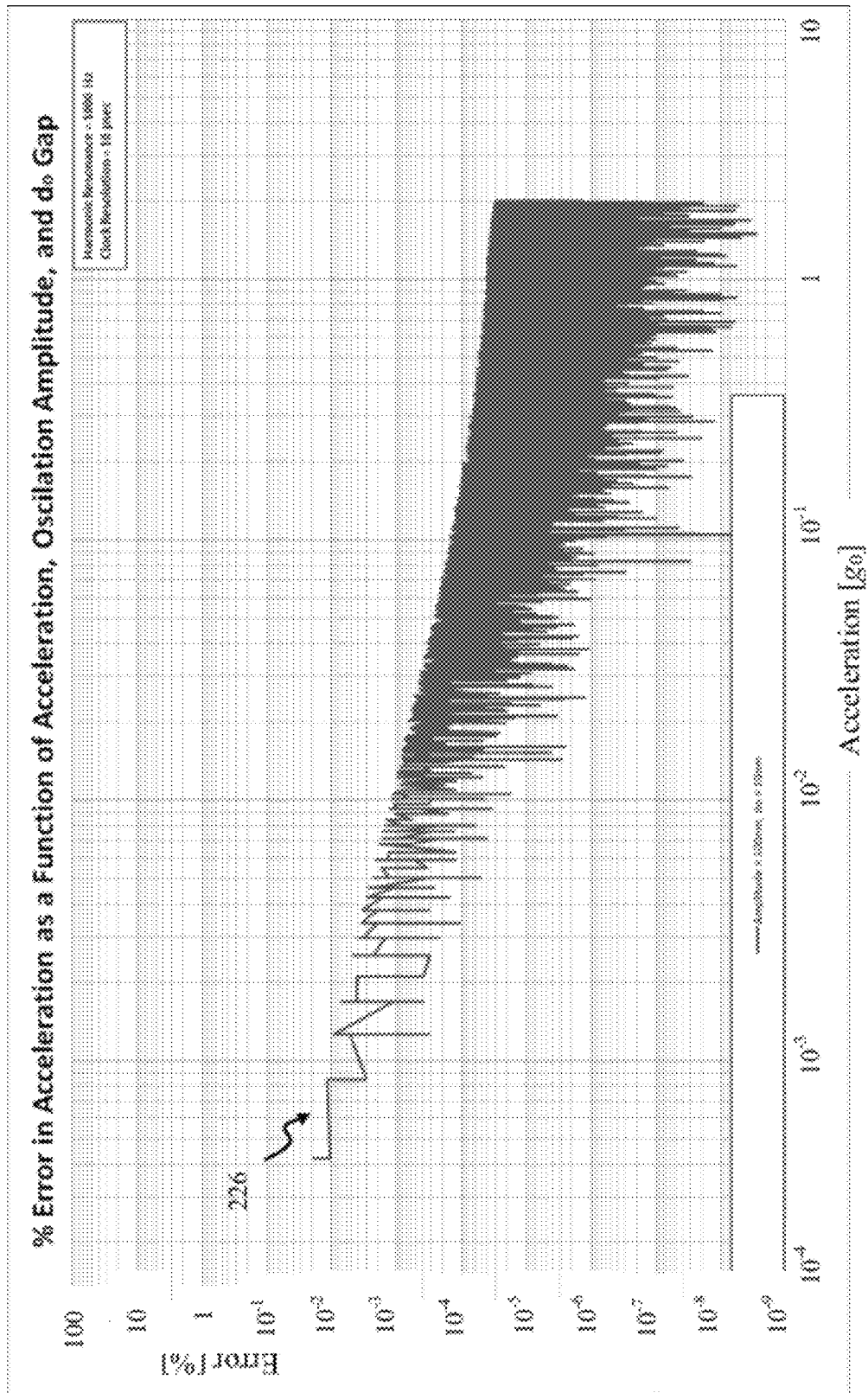
Figures 2, 2A, 3, 4:
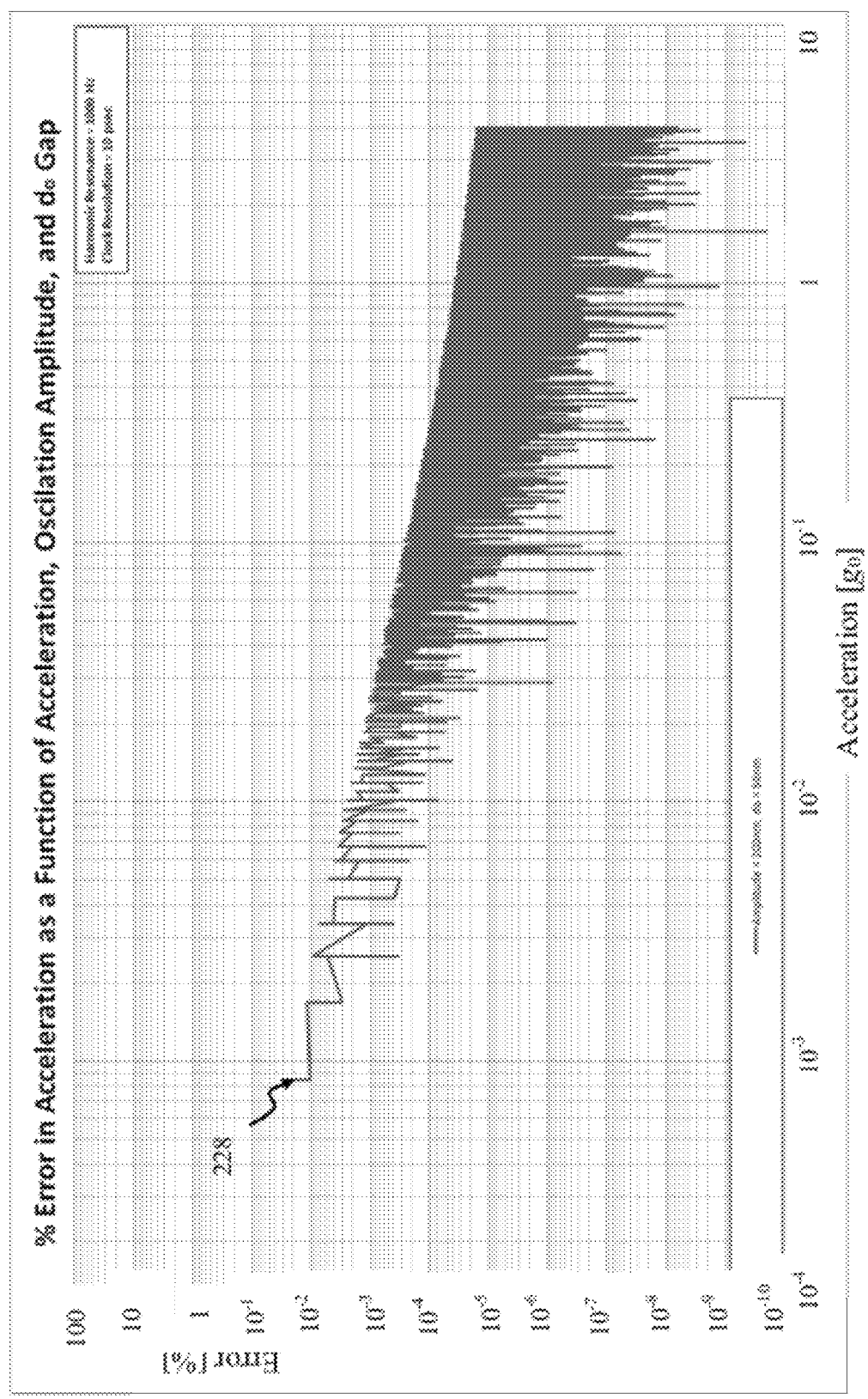
Figures 2, 2A, 3, 4, 5:
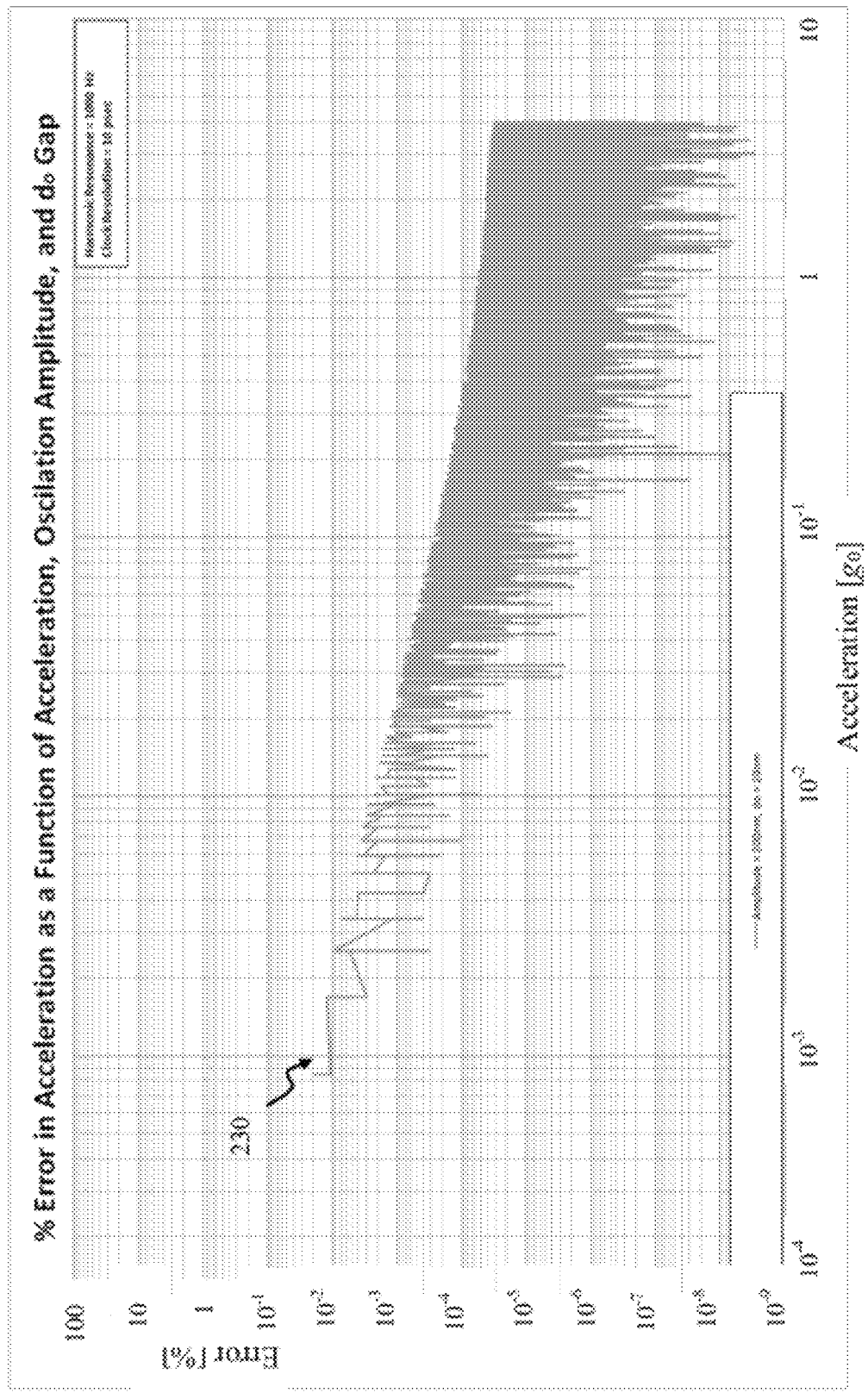
Figures 2, 2A, 3, 4, 5, 6:
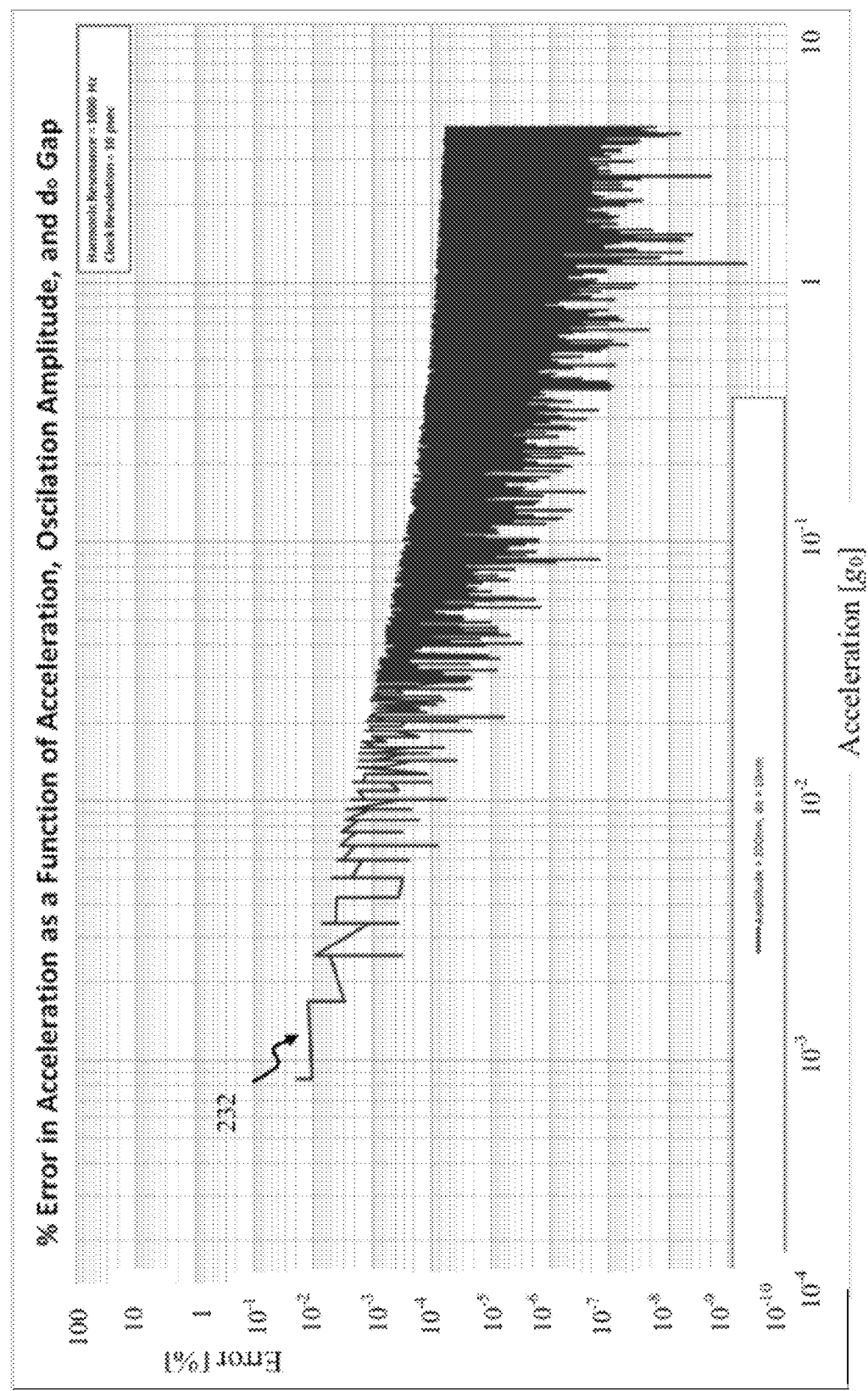
Figures 2, 2A, 3, 4, 5, 6, 7:
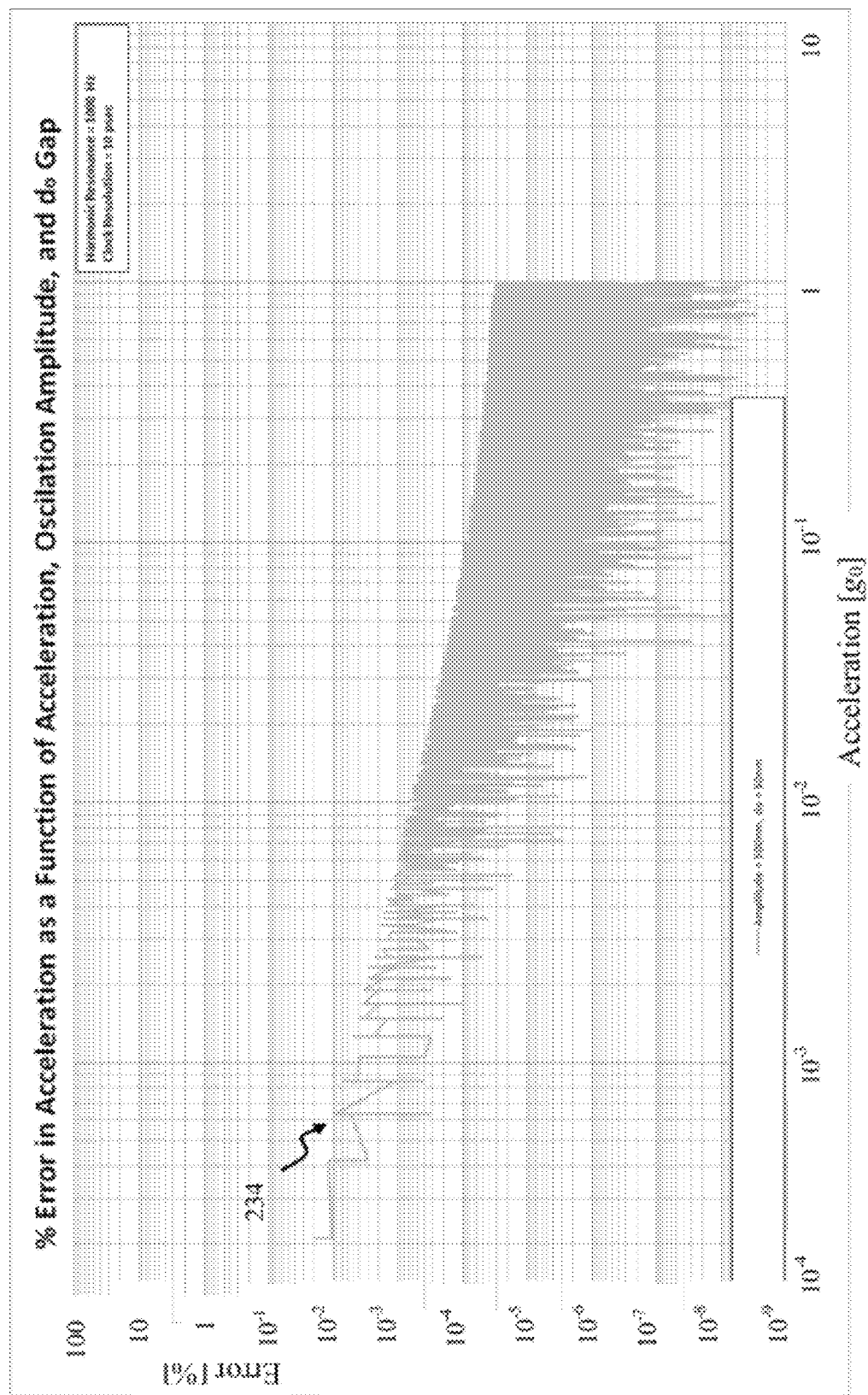
Figures 2, 2A, 3, 4, 5, 6, 7, 8:
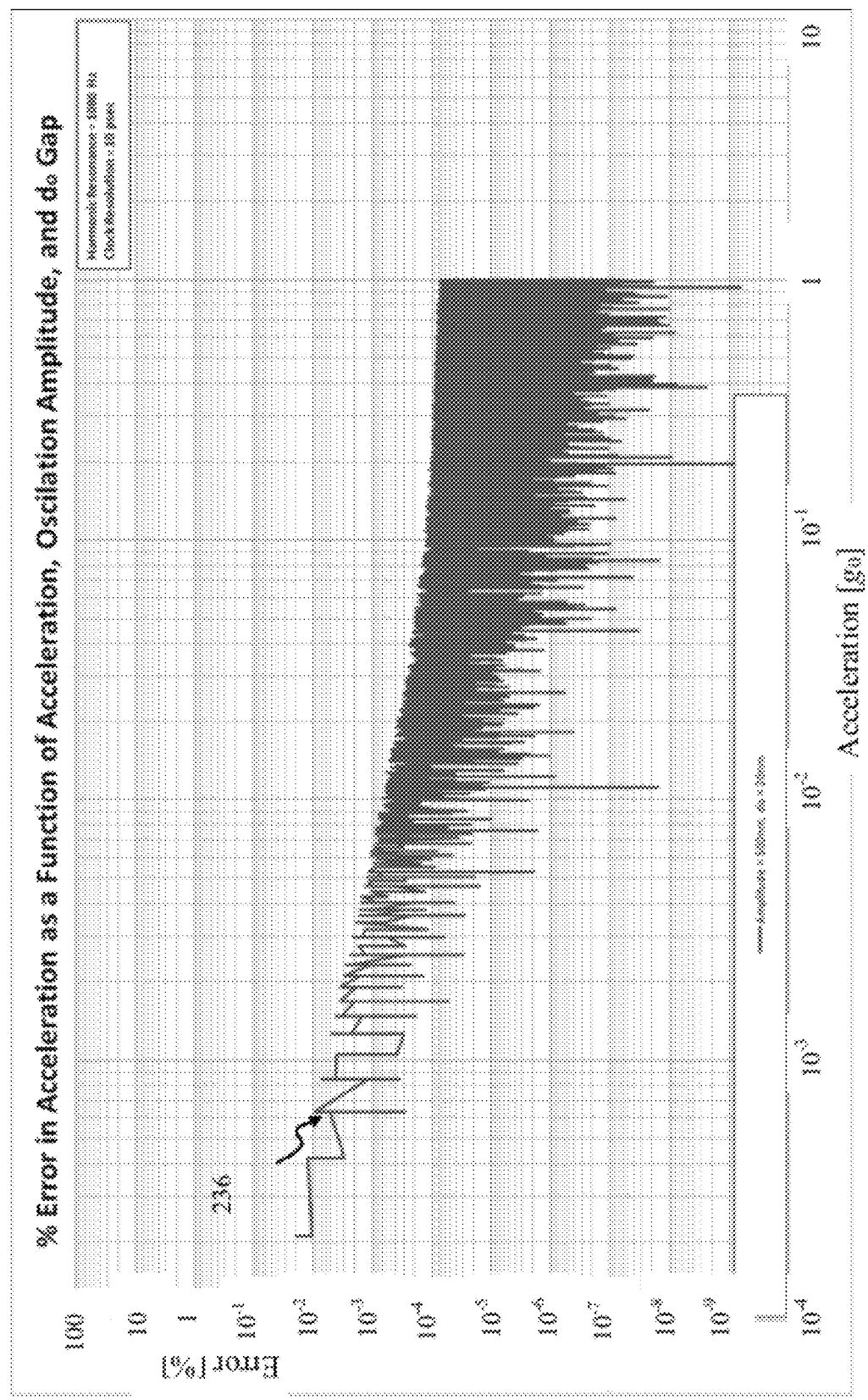
Figures 2, 2A, 3, 4, 5, 6, 7, 8, 9:
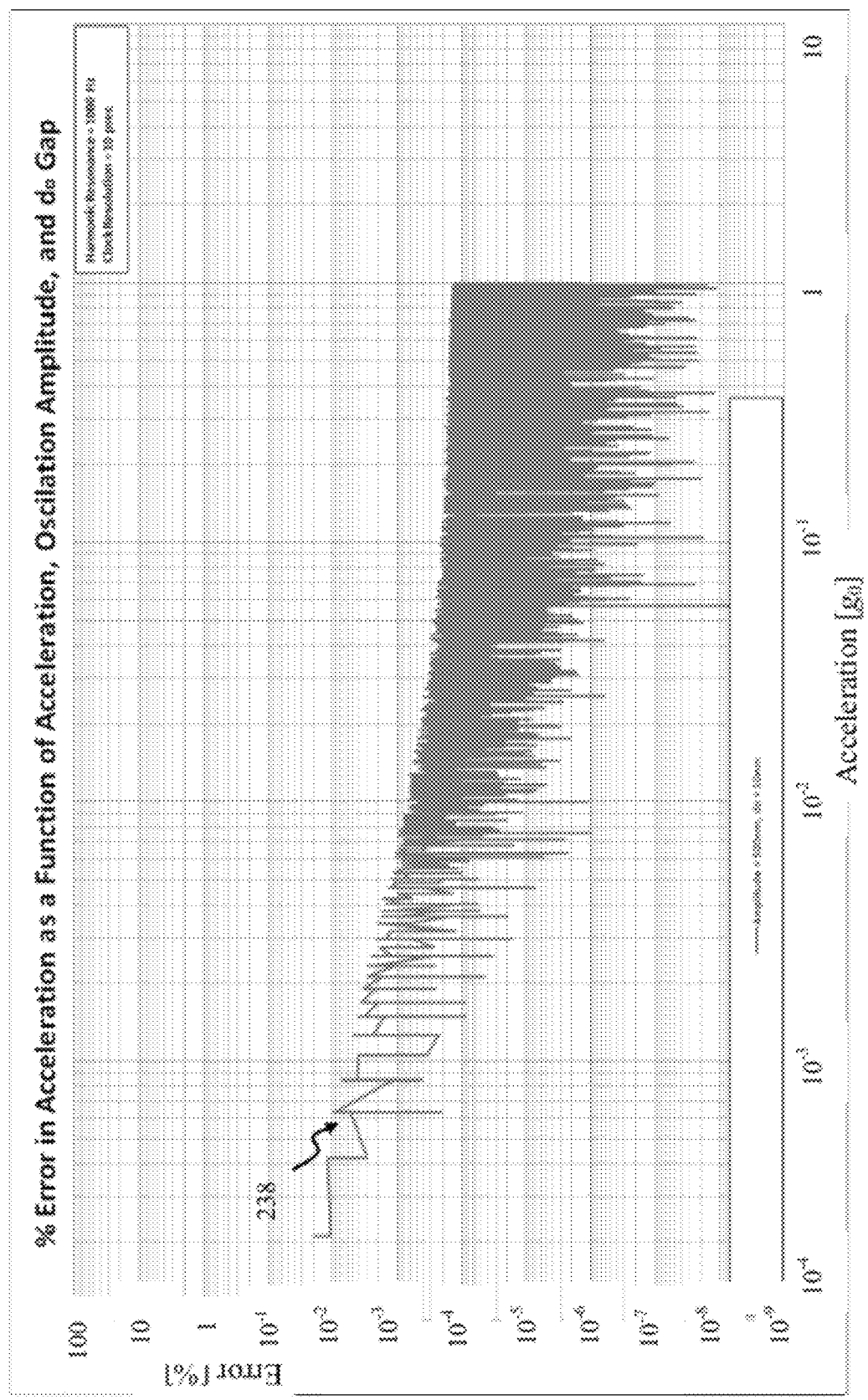
Figure 2B:
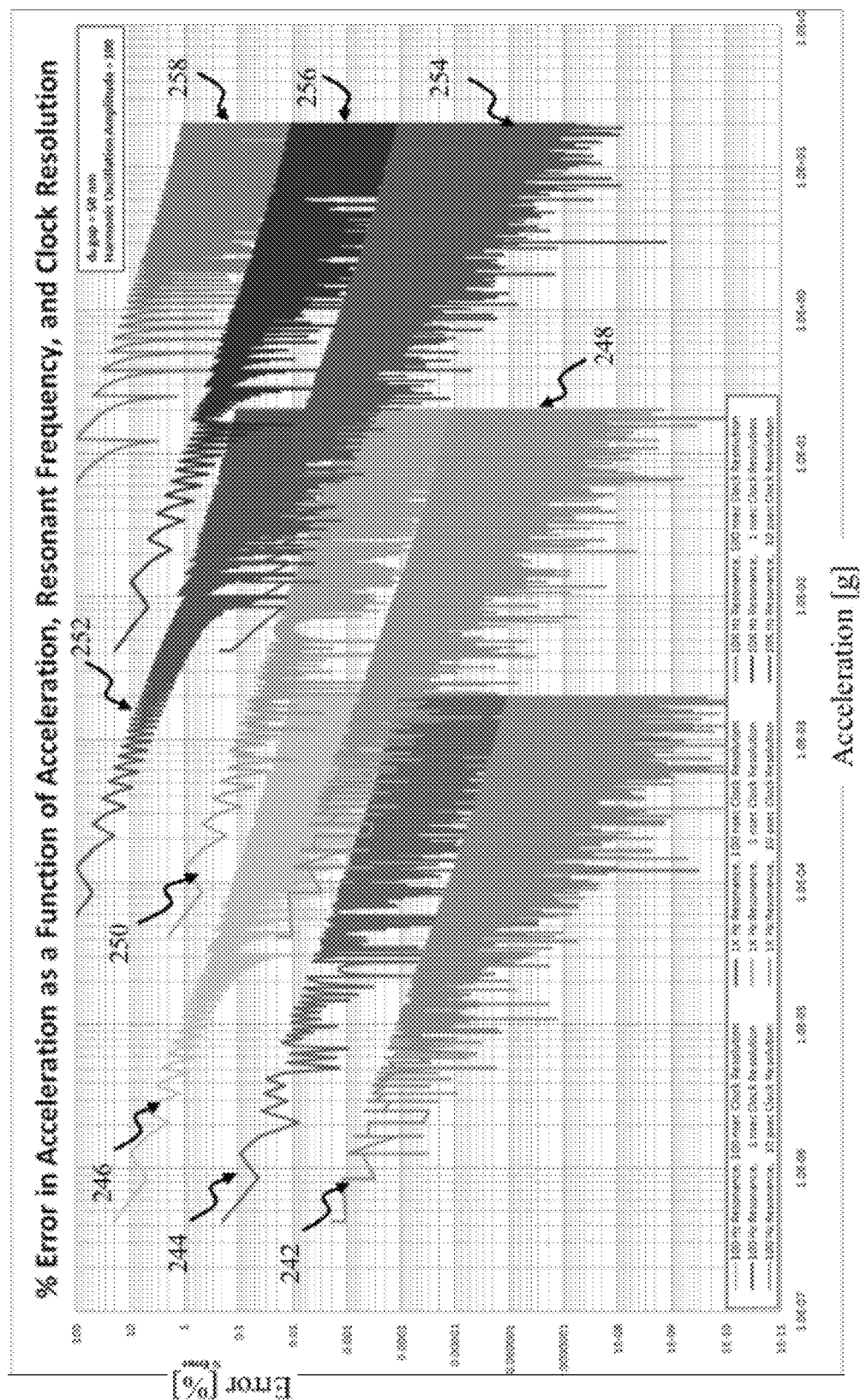
FIG. 2B is a plot depicting the simulation of acceleration measurement relative error as a function of acceleration for different values of resonant frequency and clock resolution, according to one embodiment of the invention.

FIGS. 2-2B present simulation data related to the accuracy of the time-domain acceleration force sensing illustrating one embodiment of the proof mass deflection measurement method of Eqns. 3-4. FIG. 2 presents simulated relative error as a function of acceleration computed using the time-domain acceleration measurement method of Eqns. 5-6 and the following model parameters of the time-domain oscillator: the trigger gap $d_0$ of 50 nm and the driving frequency of 1000 Hz, drive amplitude of 500 nm, and clock resolution of 10 ps. The acceleration in FIG. 2 is expressed in the units of standard gravity $g_0$=9.8 m/s² and it ranges from $10^{-4}$ $g_0$ to about 1 $g_0$. The trace 200 shows the relative measurement error of $2\times10^{-8}$ for an input signal of magnitude $2\times10^{-4}$ $g_0$ (denoted with the arrow 202), to about $3\times10^{-7}$ for a 1 $g_0$ input signal (or 21.5 bits) at the upper acceleration range (denoted with the arrow 214).

The error roll-off of is approximated with the following equation:

$$\Delta a \propto \Delta \omega^2 \Delta t \quad \text{(Eq. 9)}$$

as shown by the line 206, where:
- A is the oscillator amplitude;
- ω is the oscillator resonant frequency $2\pi f_0$; and
- Δt is the clock resolution.

As seen from the Eqn. 9, larger oscillation amplitude A allows measurement of larger accelerations, and hence larger force.

The resolution of the method used in FIG. 2 simulations is estimated at 25.6 bits at the lower acceleration range (denoted by the arrow 202); it ranges between 21.5 bits and 35.5 bits at higher accelerations, as denoted by the arrows 212, 214, respectively. The area 216 within the triangle formed by the lines 204, 206, 210 is referred to the probability area, and denotes how closely a measured time period is an integer multiple of clock cycles. In general, the trigger condition can occur anywhere within a given clock cycle, implying that the measured time period can be off by a maximum of one clock cycle. For the case where the trigger event coincides with the clock cycle, the error is limited by the ability to accurately compute the cosine function as given in Eqns 3-6. In general, any given measured time period will result in an error between zero (0) and one (1) clock cycle, and will therefore lie somewhere within the triangle 216.

FIG. 2A-1 through 2A-9 present data related to the relative error sensitivity to the oscillation amplitude A and the trigger gap $d_0$. The data in FIG. 2A are obtained for a fixed oscillation frequency of 1000 Hz and sampling clock resolution of 10 picoseconds (ps). The lines in FIGS. 2A-1 through 2A-9 marked with the arrows 222, 224, 226, 228, 230, 232, 234, 236, and 238 respectively are computed as follows:

- FIGS. 2A-1 through 2A-3 correspond to the oscillation amplitude of 100 nm and the trigger gap of 50 nm, 20 nm, and 10 nm, respectively;
- FIGS. 2A-4 through 2A-6 correspond to the oscillation amplitude of 200 nm, and the trigger gap of 50 nm, 20 nm, and 10 nm, respectively; and
- FIGS. 2A-7 through 2A-9 correspond to the oscillation amplitude of 500 nm, and the trigger gap of 50 nm, 20 nm, and 10 nm, respectively.

As seen from the data presented in FIGS. 2A-1 through 2A-9, smaller electrode spacing $d_0$ generally corresponds to a higher relative error (as, for example, illustrated by the curve 238 in FIG. 2A-9 being shifted upward relative to the curve 236 in FIG. 2A-8), while smaller oscillation amplitude corresponds to a lower relative error and lower acceleration range, (as, for example, illustrated by the curve 222 in FIG. 2A-1 being shifted downward and to the left relative to the curve 238 of FIG. 2A-9).

FIG. 2B presents exemplary simulation data related to the relative error sensitivity to the oscillation frequency $f_{drv}$ and the reference clock resolution. The data in FIG. 2B are obtained for a fixed trigger spacing of 50 nm and fixed oscillation amplitude of 100 nm. The different lines in FIG. 2B (marked with the arrows 242-258) are computed as follows:

- the lines marked with the arrows 242, 244, 246 correspond to the oscillation frequency of 100 Hz and the clock resolution of 10 ps, 1 ns, and 100 ns, respectively;
- the lines marked with the arrows 248, 250, 252 correspond to the oscillation frequency of 1 kHz and the clock resolution of 10 ps, 1 ns, and 100 ns, respectively; and
- the lines marked with the arrows 254, 256, 258 correspond to the oscillation frequency of 10 kHz and the clock resolution of 10 ps, 1 ns, and 100 ns, respectively.

As seen from the data presented in FIG. 2B, higher clock resolution generally corresponds to lower relative errors (as, for example, illustrated by the curve 254 being shifted downward relative to the curve 258), while lower oscillation frequency corresponds to lower relative errors and lower acceleration range, (as, for example, illustrated by the curve 252 being shifter downward and to the left relative to the curve 258).

Using Eqns. 5-6, acceleration dependence on the oscillator amplitude A and period can be expressed as follows:

$$a = d_0 \left(\frac{2\pi}{P}\right)^2 \frac{\cos\frac{\pi T_1}{P}}{\cos\frac{\pi T_2}{P} - \cos\frac{\pi T_1}{P}} \propto A\omega^2 \quad \text{(Eq. 10)}$$

where:
a is the acceleration;
A is the oscillator amplitude;
P is the period of oscillations;
$d_0$ is the trigger gap;
ω is the radial frequency of oscillations expressed as 2π/P;
$T_1$ is the upswing reference point crossing period; and
$T_2$ is the positive trigger point crossing period.

As seen from Eqn. 10, higher oscillation amplitude produces higher acceleration (for the same frequency). Lower oscillator frequency implies that a smaller force and, hence, lower acceleration is required to produce a given displacement of the oscillator. The maximum force measured by the sensor is based on the difference between the oscillator amplitude and the trigger spacing. Therefore the maximum allowed acceleration range changes with the oscillator frequency, when the other model parameters are kept fixed.

It is noted that the exemplary time-domain sensing apparatus describes by Eqns. 3-6 and 10 advantageously provides for a dynamically adjustable measurement system. Specifically, the sensor dynamic range (e.g., the range of measurable accelerations in Eqn. (10)) can be dynamically adjusted by changing the amplitude of the oscillator motion; e.g., by adjusting the driving signal.

It is further noted that although, the illustrated embodiments described above with respect to FIGS. 1 and 1A use three different trigger positions (e.g., 104, 106, 108 in FIG. 1A) in order to obtain force estimates (via Eqns. 3-6), any number of known trigger points may be used consistent with the principles of the invention. For example, in one approach, a single trigger point is used, and oscillation amplitude is assumed constant and is estimated from the magnitude of the harmonic driving force $F_{drv}$. Provided that the oscillator has low losses (high Q-factor), such implementation is capable of providing accuracy well in excess the presently available sensors of similar size, bandwidth, and power consumption. In one implementation, a width of the amplified tunneling pulse is used to further improve accuracy of the single, trigger point approach. The width of the amplified tunneling pulse serves generally the same purpose as the fixed spading between tunneling tip pairs, thereby enabling the single tunneling tip configuration to provide measurements that are independent of the oscillation amplitude.

Furthermore, various other techniques of determining the deflection of a driven proof mass (that comprise, for example, multiple sets of trigger points) may be used with the time-domain force sensing methods of the invention.

Sensing Apparatus

Referring now to FIG. 3, one embodiment of the time domain inertial force sensing apparatus of the invention is shown and described. The exemplary sensing apparatus 300 of FIG. 3 comprises a frame 302 and a cantilevered proof mass assembly 304 sealed between a base 305 and a capping wafer 306 using, in one variant, a gold thermo-compression wafer bonding technique. As will be appreciated by those skilled in the arts, many other fabrication methods may be used, including but not limited to gold-tin eutectics or other eutectics, glass-fit bonding, fusion bonding, electrostatic bonding, etc.

The frame and the proof mass each comprise an electron tunneling electrode assembly, which together form a digital switch structure 310 shown in the inset (magnified view) 313 in FIG. 3. The switch structure is in this embodiment formed by one or more pairs of opposing electron tunneling electrodes, such as the reference electrode assembly 318 disposed on the frame 302 and the sensing electrode assembly 320, disposed on the proof mass assembly 304. In the absence of external forcing (zero force state), the top electrode 314 of the assembly 318 is configured so as to be aligned with the top electrode 314 of the assembly 320. The bottom electrode 312 of the assembly 318 is configured so as to be aligned with the bottom electrode 312 of the assembly 320, as shown in the inset 313 in FIG. 3.

The electrodes 312, 314 comprise a layer of conductive material (such as e.g., doped poly-silicon, or a thin metallization such as platinum, chromium, aluminum, tungsten, etc.) separated by an insulating layer 316 (such as e.g., silicon oxide, or silicon on insulator) disposed in-between, as shown in FIG. 3. The reference electrode assembly 318 is disposed on the bulk silicon element of the silicon frame 302, and the sensing electrode assembly 320 is disposed on the bulk silicon element 328 of the proof mass assembly 304.

As will be appreciated by those skilled in the arts given the present disclosure, a wide variety of other electrode assembly configurations exist which may be used consistent with the invention, including for example electrodes 312, 314 of different thickness, material, position, and/or shape.

At the zero force position, the electrode pairs 312, 314 are aligned horizontally and separated by a narrow gap. In the embodiment of FIG. 3, the gap 322 is on the order of 1 nanometer (nm) in width. In one variant, the gap is selected to fall in the range from about 1 nm to about 50 nm. Yet other values may be substituted.

The close proximity of the electrodes within each electrode pair 312, 314 causes an electron tunneling discharge across the gap. As a brief aside, electron tunneling was originally developed for use in Scanning Tunneling Microscope (STM). In the STM, a sharp metallic tip is positioned about 10 Angstroms above a metallic surface. Electron tunneling has been previously applied to inertial measurements. Tunneling based accelerometers typically comprise a fixed cantilever scanning tunneling microscope (STM), with the cantilever acting as a proof mass. Tunneling devices take advantage of the relationship between tunneling current and tip-to-surface distance in order to measure the proof mass deflection. When a DC voltage bias is applied between tip and surface, a tunneling current of about 1 nano-ampere (nA) can be measured. Small variations (1 Angstrom) in the tip-surface separation appear as large variations (e.g., 10-80%) in the tunneling current.

Returning now to the embodiment of FIG. 3, in order to create a tunneling switch, the tunneling electrodes of the opposing switch sides are subjected to different electric potentials. That is, the tunneling electrodes 314, 312 of the reference electrode assembly 318 are subjected to a DC potential (DC charge) that is different from the DC potential of the respective electrodes 314, 312 of the sensing electrode assembly 320. In one variant, the electrodes 312, 314 of the sensing electrode assembly 320 are grounded (zero potential), and the electrodes of the reference assembly are charged to a specific positive voltage, for example 30V. Typically, voltage difference across the electrodes 312, 314 is less that 50 V, which is sufficient to produce a pulse of current across the gap in the range between 1 nm and 50 nm.

It is appreciated by those skilled in the art given the present disclosure that other charge configurations are compatible with the invention, such as for example: (i) grounded reference electrodes and charged sensing electrodes, or (ii) one positively charged and one negatively charged electrode, etc.

Furthermore, it is noted that gap width and electrode material selection will generally affect working range of the charge voltage, with wider gaps requiring a higher difference in voltage potentials.

In one implementation, the sensor cavity (the volume between the base and the capping wafers) is at least partly evacuated, thus creating at least a partial vacuum. Vacuum reduces damping of the proof mass, thereby increasing the Q-factor of the oscillator, although this is by no means a requirement of practicing the invention. In alternate implementations, the sensor cavity may be backfilled with an inert gas such as nitrogen or argon.

The aforementioned difference in the electrode potentials forms a charged electrode tip pair. Whenever these charged tips pass through the reference position (such as, the zero force point), a high electric field region is temporarily formed between the charged tips, causing an electric discharge across the tunneling gap 322. The corresponding tunneling currents induced in the electrodes 312, 314 act as precise indicators of the electrode tip alignment, thus serving as the mechanism for measuring external forcing. The magnitude of external forcing can be estimated using a variety of methods, including but not limited to, the methods described with respect to FIGS. 1-2A. For instance, in one embodiment, the force is computed by dividing the resonant frequency period of the proof mass by the measured time between the pulses, corresponding to the zero force point.

It is noted that in the embodiment of the inertial sensing apparatus shown in FIG. 3, the tunneling effect is only used as the trigger mechanism (generating a tunneling current when the electrode pairs 312, 314 are aligned) in order to indicate when the oscillating proof mass passes through the trigger points. Other approaches may be used as well, however.

The proof mass (and therefore, the sensing electrode assembly 320) are configured to oscillate in a direction (as indicated with the arrow 311 in FIG. 3) that is substantially perpendicular to the plane of the sensor 300. The illustrated electrode configuration of FIG. 3 advantageously allows for much a wider separation between the electrode tips (1 nm vs. 1-10 Angstrom), as the device does not need to measure the actual distance between the electrode tips. A wider gap further prevents accidental tip-to-tip contact, thereby increasing robustness and longevity of the device. Moreover, such an electrode configuration does not limit electrode displacement to the Angstrom-level, thereby greatly increasing the dynamic range (and utility) of the inertial sensing device as compared to, inter alia, prior art tunneling sensors.

Furthermore, no feedback loop closures of any kind are required for proper operation of the device. The larger surface area of the electrodes 312, 314, which is primarily due to a larger lateral extent of the conductive layers (such as, in the dimension indicated by the arrow 307 in FIG. 3), advantageously results in a larger tunneling current as compared to typical STMs; e.g., those that use a needle-type sensing electrode. Because the tunneling mechanism is used as a switch in the sensing apparatus of FIG. 3, it is also impervious to tunneling tip degradation, provided that the tunneling current remains above the noise floor of the front-end amplifier, which is $3 \times 10^{-15}$ A in one exemplary variant.

Depending on the specific sensor application requirements of the sensing application, the forcing frequency is in the range from about 100 Hz to about 200 kHz. The corresponding maximum amplitude of the proof mass oscillations is between about 10 nm and about 50 µm.

The size of the exemplary sensing device 300 is selected based on various specification or operational parameters including, but not limited to, resonant frequency, thermal noise floor, sensor dynamic range, power consumption, configuration (e.g., one axis, two axes), and cost. In one embodiment, the proof mass assembly is between 50 µm and 500 µm in width, and between 100 µm and 9 mm in length. The sensor frame is constructed to be sufficiently large to house the proof mass while allowing for wafer level bonding and electrical interconnects (typically requiring additional 100-500 µm around the perimeter of the proof mass).

The foregoing exemplary dimensions underscore yet another advantage of the present invention; i.e., extremely high performance within a very spatially conservative form factor. This enables not only host devices to be made smaller and less costly, but also the use of many sensors collectively (e.g., in an array) in a space efficient manner.

Notwithstanding, it will be appreciated by those skilled in the arts that the above dimensions are merely exemplary, and the sensing device could be made larger or smaller as required by the application or other considerations.

Figure 3:
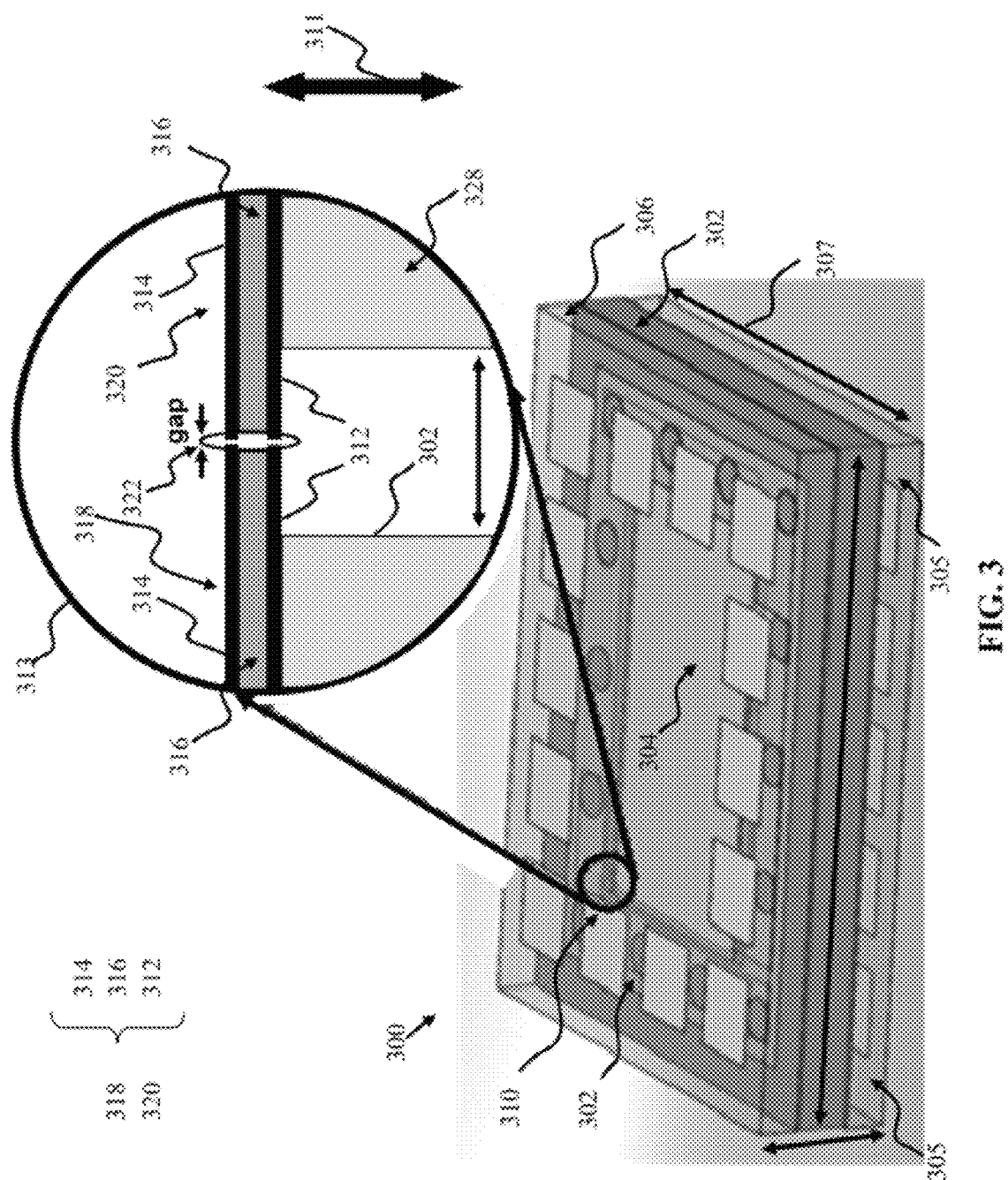
Figure 3A:
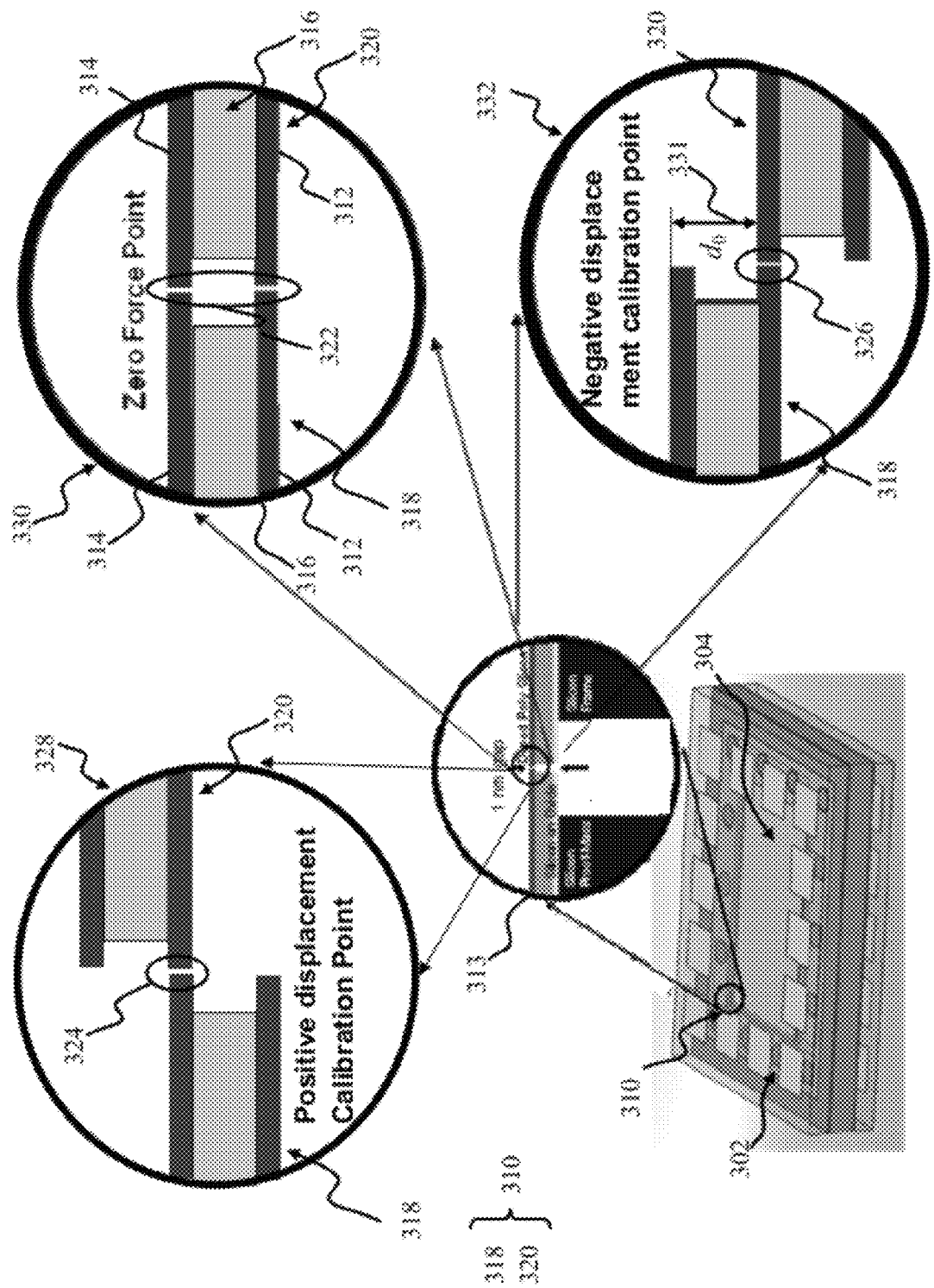
FIG. 3A is an illustration depicting three (3) exemplary reference states of the tunneling position indicator switch of FIG. 3.

Referring now to FIG. 3A, one embodiment of the electrode trigger configuration of the sensing apparatus 300 of FIG. 3 is shown and described. As discussed with respect to FIG. 3, the force sensing apparatus comprises: (i) an oscillator (the proof mass assembly 304) and (ii) the dual-tip switch 310, formed by the dual-tip reference electrode assembly 318 (disposed on the frame 302) and the dual-tip sensing electrode assembly 320 (disposed on the proof mass assembly).

Switch assemblies of the type described herein can be positioned within the force sensing apparatus in a variety of configurations. The sensor 300 comprises a single dual-tip switch 310 (comprised of the electrode pairs 312, 314) disposed along a transverse edge of the proof mass that is opposite from the mass attachment point 333 to the frame, as shown in greater detail in FIG. 3B-1. Such switch placement advantageously maximizes the displacement of the sensing electrode assembly 320 during operation.

Figures 1, 3B:
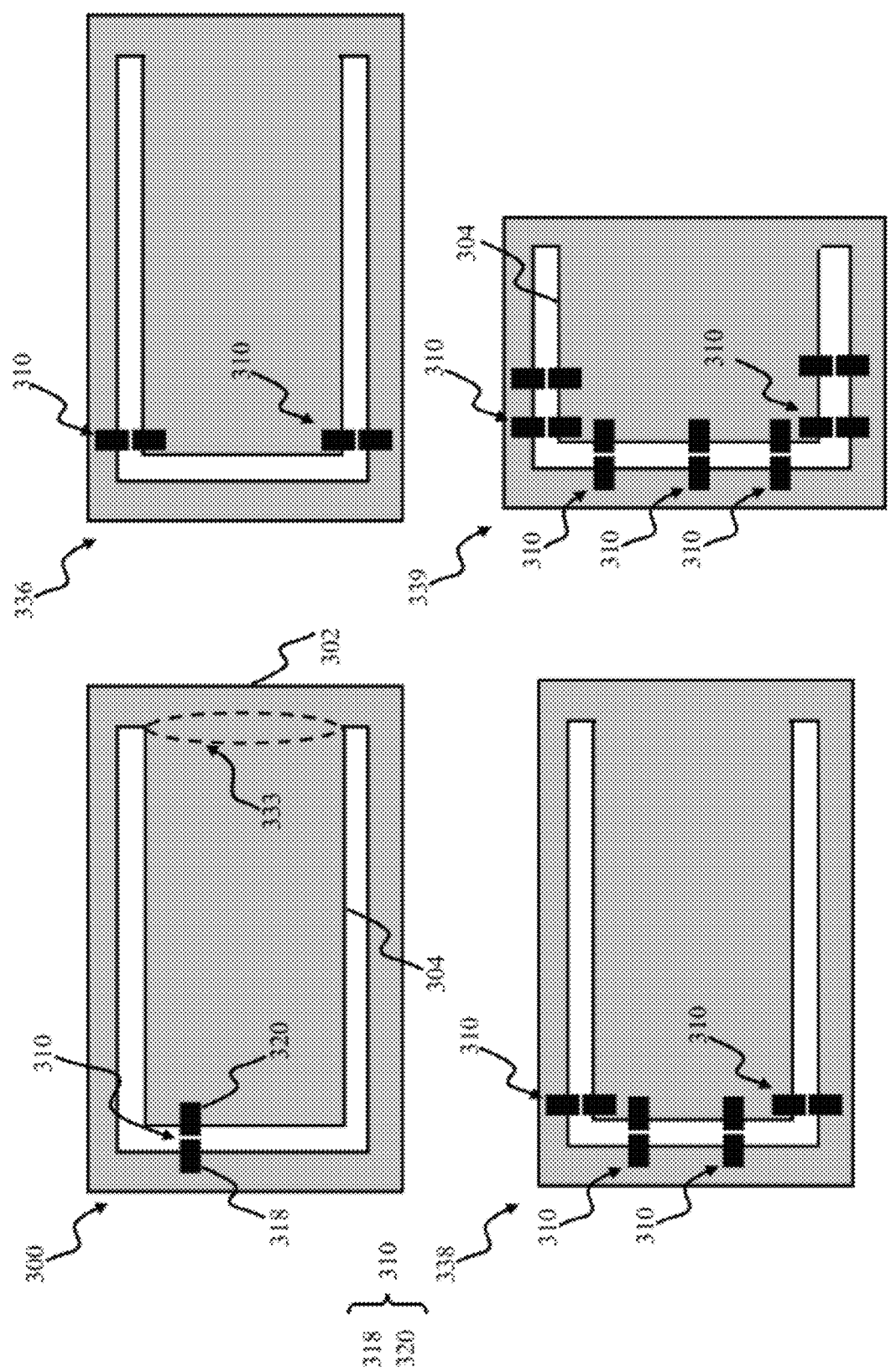
Figures 2, 3B:
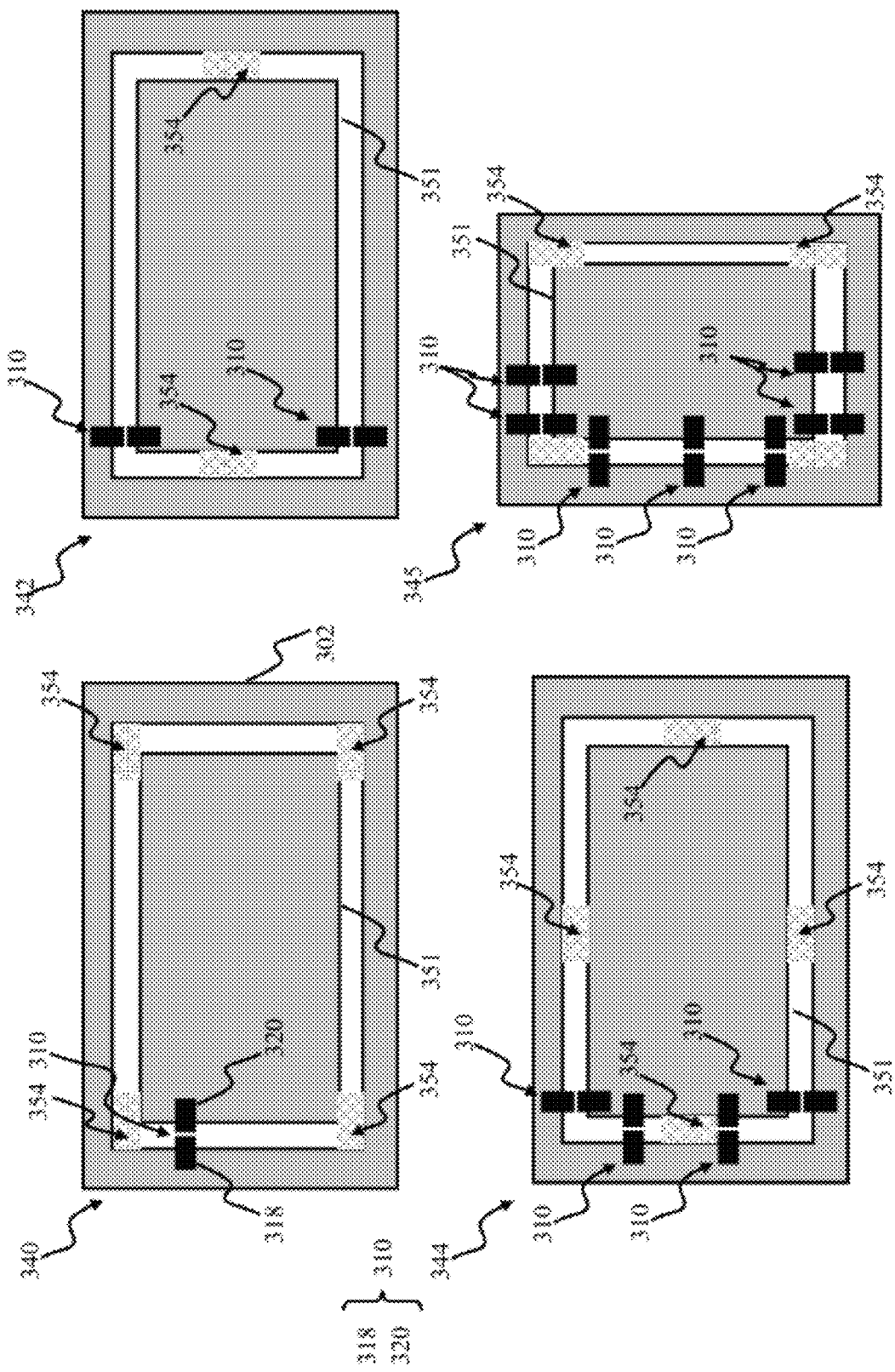

In other embodiments, the sensing apparatus 336, 338, 339 comprise multiple sets of switches 310, disposed in various configurations as shown in FIGS. 3B-1 and 3B-2. In one such alternate embodiment, the force sensor 339 comprises an arrays of switches disposed along the perimeter of the proof mass cantilever 304. Each switch within the array can be composed of multiple tunneling tips stacked on one another and separated by a dielectric of spacing $d_0$, as shown in the sensor embodiment 346 of FIG. 3C.

Figure 3C:
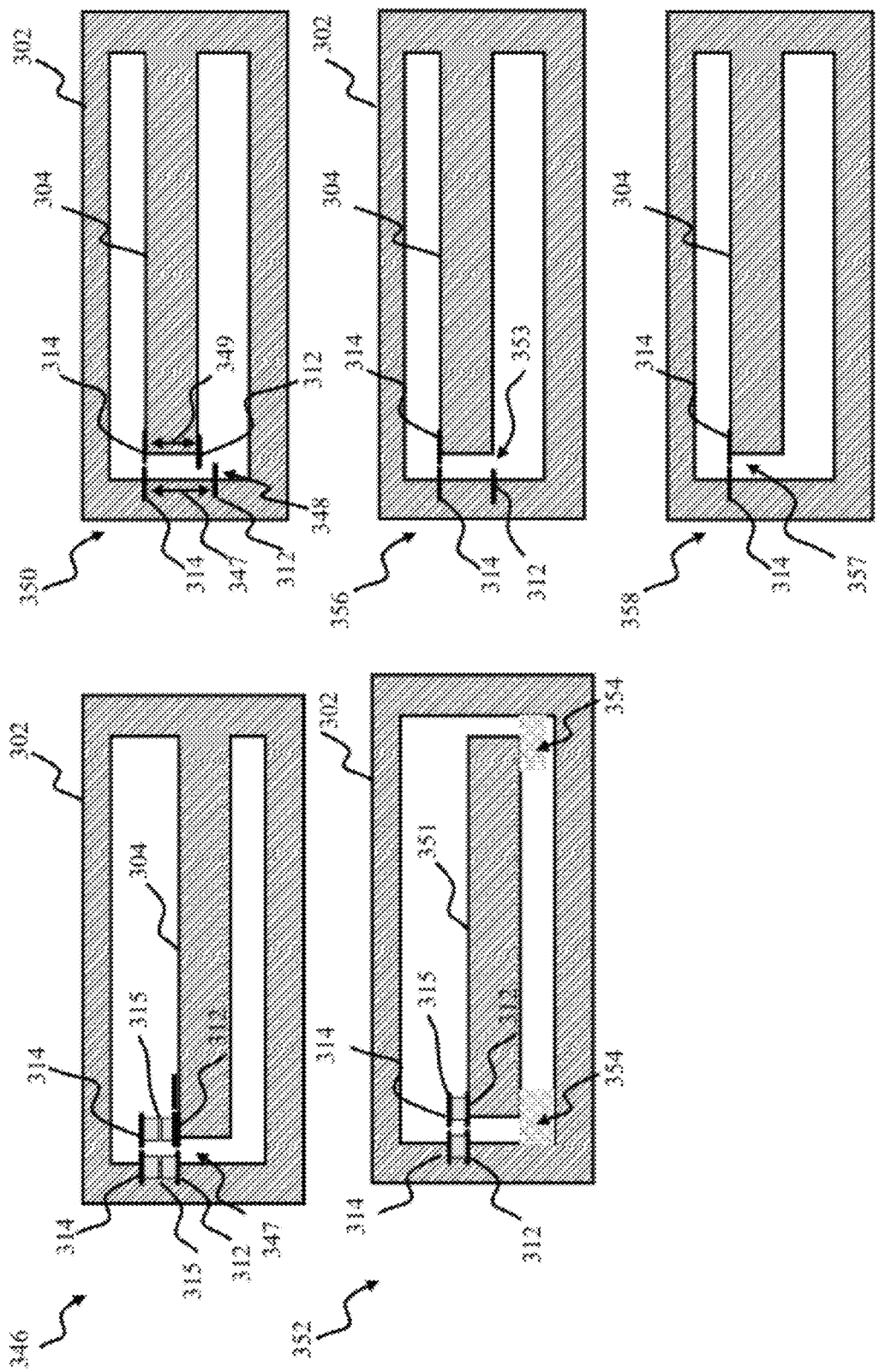
FIG. 3C is a side cross-section view illustrating various embodiments of trigger point configurations for use with the time-domain sensing apparatus of the invention.

FIG. 3C provides cross-sectional views of various different embodiments of switches useful with the time-domain oscillatory apparatus of the invention. The illustrated switch 347 of the first illustrated oscillatory apparatus 346 comprises three layers of tunneling electrodes (the top 314, the middle 315 and the bottom 312), spaced by the same distance.

In yet other embodiments, the oscillatory apparatus 350 comprises a switch 348 with different electrode spacing 347 between the electrodes 312, 314 of the reference electrode assembly (which is mounted on the sensor frame), as compared to the spacing 349 of the sensing electrode assembly (which is mounted on the cantilevered proof mass assembly). In one such implementation, the oscillatory apparatus 356 comprises a switch 353 that uses two reference electrodes and a single sensing electrode. In another such implementation, the apparatus 358 comprises a switch 357 that a single reference electrode and a single sensing electrode, as illustrated in FIG. 3C.

Some of the switch array embodiments shown in FIG. 3B (e.g., the sensors 300, 336, 338, 339) comprise a cantilevered proof mass assembly 304. In another approach, the sensors 340, 342, 344, 345 comprise a proof mass structure 351 that suspended using spring supports 354. As shown in FIG. 3B, the supports 354 can be arranged in a variety of configurations around the perimeter of the oscillating structure 355. FIG. 3C depicts a cross sectional view of the sensor apparatus 352 comprising a proof mass 351 that is suspended via spring support elements 354. Yet other mechanisms or approaches to creating an oscillator (proof-mass based or otherwise) will be appreciated by those of ordinary skill given the present disclosure.

Although only a single set of electrodes is required for operation of the force sensing apparatus (e.g., the apparatus 330 of FIG. 3A), additional electrode sets offer redundancy, thereby increasing sensor resolution, accuracy, and precision by providing additional data and improving sensor reliability. Furthermore, given the very small size of the tunneling tips (1 nm to 50 nm in thickness, and 100 nm to 10 μm in width in one exemplary embodiment), tens or hundreds of tunneling tips per oscillator can easily be fabricated. It will be appreciated by those skilled in the art when provided this disclosure that various other switch configurations may be used, including for instance using switch sets that have different vertical spacing between the electrodes. The additional information provided by these additional sets of tips and/or configurations aids in extending the dynamic range, and to decrease digitization errors, of the force sensing apparatus.

Returning now to FIG. 3A, in the absence of external forcing, the electrode pairs 312, 314 are configured in an aligned position, and form two tunneling trigger junctions 322. Such configuration is referred to as the reference or a zero-force point 330, and it corresponds to the reference trigger point 104 described with respect to FIGS. 1 and 1A.

The proof mass assembly 304 is driven by an oscillating signal, as described in greater detail below, which causes the proof mass to undergo harmonic oscillations relative the reference point 330. When the proof mass 304 is displaced downward from the reference position 330 by the distance $d_0$ (which corresponds to the vertical spacing 331 between the electrodes 312 and 314), the top electrode 314 of the sensing assembly 320 is aligned with the bottom electrode 312 of the reference assembly 318, thus forming a single tunneling trigger junction 326. Such configuration is referred to as the first known calibration point 332, and it corresponds to the negative trigger point 108 described with respect to FIGS. 1 and 1A.

Similarly, when the proof mass 304 is displaced upward from the reference position 330 by the distance $d_0$, the bottom electrode 312 of the sensing assembly 320 is aligned with the top electrode 314 of the reference assembly, thus forming a single tunneling trigger junction 324. Such configuration is referred to as the second known calibration point 328, and it corresponds to the positive trigger point 106 described with respect to FIGS. 1 and 1A.

As the proof mass oscillates, the electrodes 312, 314 pass through the three trigger configurations 328, 330, 332, thereby causing generation of the triggering events, such as e.g., the trigger events 130, 133, 134 described with respect to FIG. 1A.

Figure 3D:
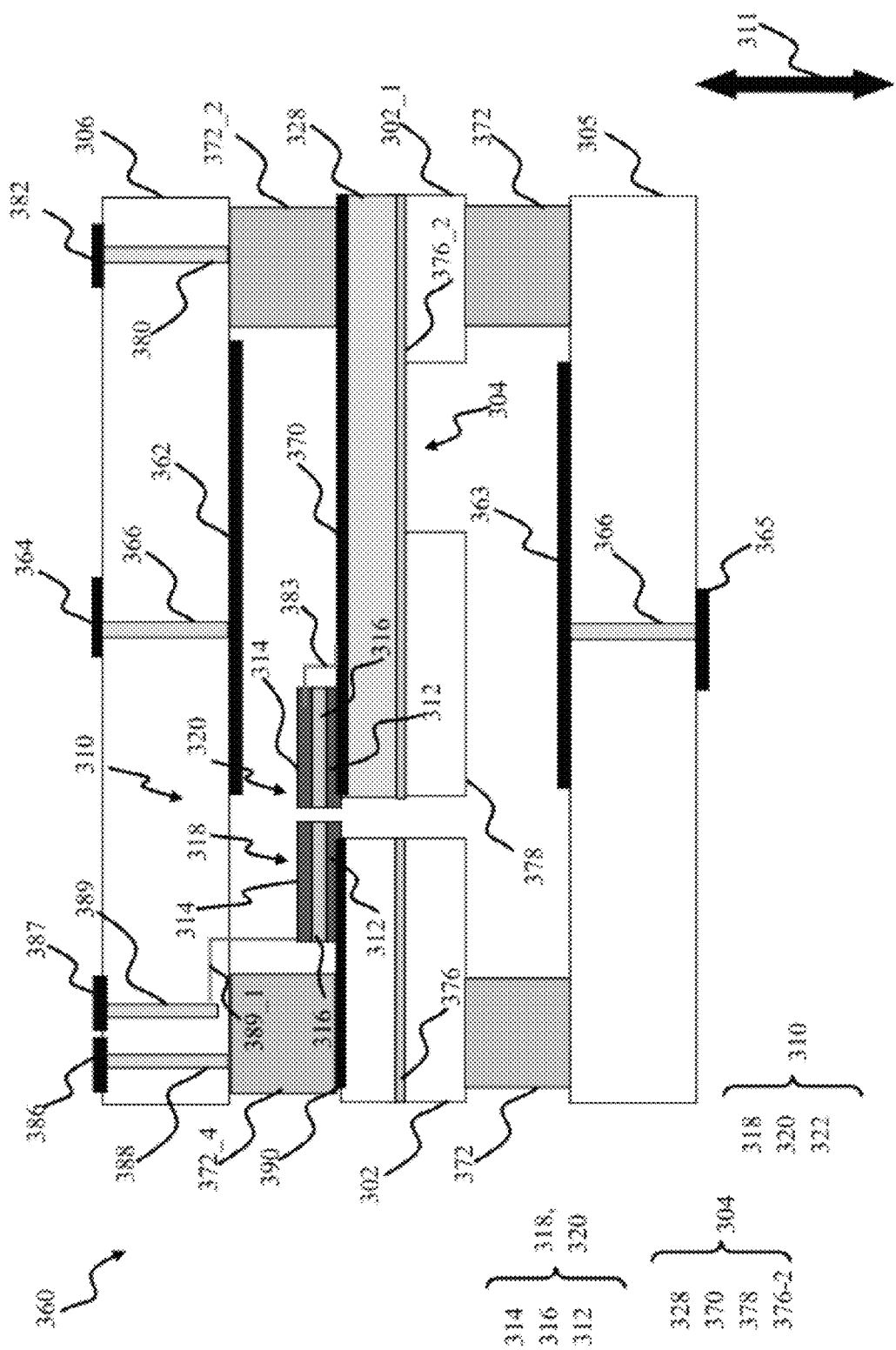
FIG. 3D is a side cross-section view illustrating one embodiment of a time-domain sensing apparatus comprising a dual-electrode switch according to the invention.

FIG. 3D shows a cross-sectional view of another embodiment of the time-domain sensing apparatus according to the invention. The sensor 360 of FIG. 3D comprises the frame 302 and a cantilevered proof mass assembly 304. The proof mass assembly comprises a beam structure 328 affixed to the frame element 302_1 on one end, and a proof mass 378 disposed on the opposing end of the beam 328. The frame 302 and the proof mass assembly 304 are sealed between the base wafer 305 and the capping wafer 306 using the intermediate structures 372. It will be appreciated that while a cantilever-type approach is used to "suspend" the proof mass and sustain oscillations thereof in the illustrated embodiment, any number of different approaches or mechanisms can be substituted to provide the desired oscillatory functionality, the cantilever being only one possibility. For example, a proof mass assembly that is suspended using spring supports may be used as well, as described with respect to FIG. 3B and FIG. 3C.

In one variant, the beam 328 is fabricated using conductive material and is electrically connected to the sensor ground pad 382 via a conductive element 380 (that penetrates through the capping wafer 306) and the gold composite bonding layer 372_2. The beam 328 is electrically isolated from the proof mass 378 and the frame element 302_1 by a nonconductive layer 376_2. The conductive beam 328 acts as the proof mass ground plane, and it serves two functions: (i) providing ground to effect the proof mass oscillations; and (ii) providing ground potential for the tunneling discharge.

In another variant, a conductive element 370 is disposed on the top surface of the beam 328. The conductive element 370 is electrically connected to the sensor ground pad 382 via a conductive element 380 (that penetrates through the capping wafer 306) and the gold composite bonding layer 372_2. In this variant, the insulating layer 376_2 may be omitted.

The sensing apparatus 360 comprises a digital switch assembly 310 that is disposed proximate the oscillating end of the proof mass assembly 304 as shown in FIG. 3D. The switch 310 comprises the sensing electrode assembly 320 and the reference electrode assembly 318, as is described in detail with respect to FIGS. 3-3A. The electrode 312, 314 of the sensing electrode assembly 320 is electrically connected to the proof mass ground plane via conductors 383. The bottom electrode 312 of the reference electrode assembly 318 is electrically connected to the conductive element 390 which, in turn, is connected to the first sensor charge pad 386 via a conductive element 388 (that penetrates through the capping wafer 306) and the gold composite bonding layer 372_4. The top electrode 314 of the reference electrode assembly 318 is electrically connected to the second sensor charge pad 387 via the conductor 389 (that penetrates through the capping wafer 306) and the conductor portion 389_1. The top and the bottom electrodes 312, 314 are separated by a nonconductive layer 316. A nonconductive layer 376 is used to insulate the reference electrode assembly from the sensor frame 302.

The charge pads 386, 387 and the ground pad 382 are used to provide the charge voltage and to sense the tunneling current during sensor operations.

The sensor 360 comprises the top 362 and the bottom 363 driving electrodes that are connected to the sensor drive pads 364, 365 via conductive elements 366 that penetrate through the base and the capping wafers, as is shown in FIG. 3D. The driving electrodes in the illustrated embodiment are driven with a harmonic driving signal of frequency $f_{drv}$ such that the signal applied to the electrode 362 is 90° out of phase from the driving signal applied to the electrode 363, as described in detail elsewhere herein. Because the proof mass is grounded, the capacitive coupling between the ground plane 370 and the electrodes 362, 363 creates electrostatic attractive forces which force the proof mass of the sensor 360 into periodic oscillation at the driving frequency $f_{drv}$.

Figure 3E:
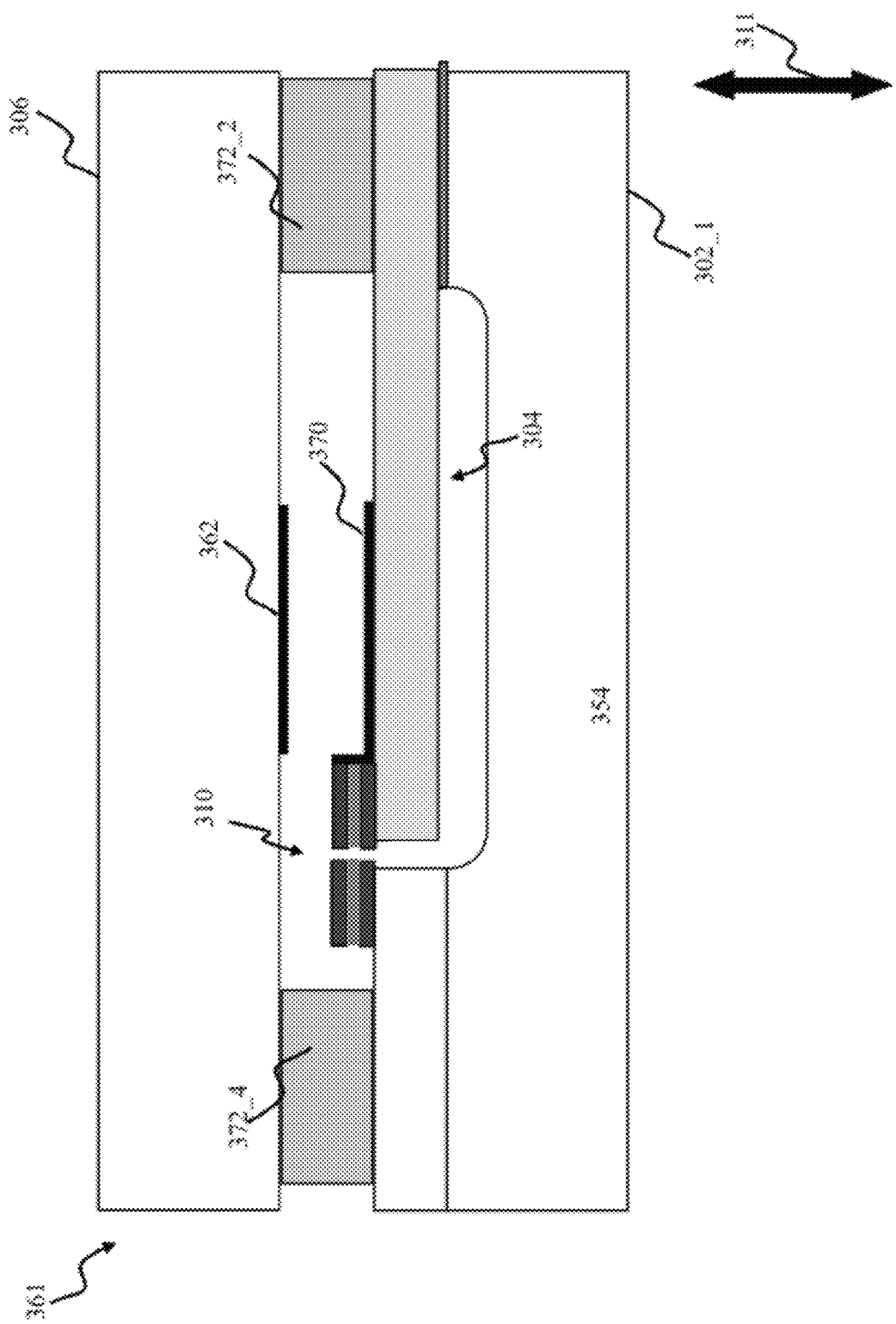
FIG. 3E is a side cross-section view illustrating another embodiment of a time-domain sensing apparatus comprising a dual-electrode switch according to the invention.

In an alternate embodiment shown in FIG. 3E, only one driving electrode (the top electrode 362) is used for induce oscillations of the proof mass. The sensor 361 comprises the capping wafer and an integral frame/base wafer assembly 302_1. Although the top driving electrode 362 is shown in FIG. 3E, a bottom mounted driving electrode (e.g., 363, not shown) may be used instead in the single-electrode sensor configuration.

Referring now to FIGS. 3F through 3I, various alternate embodiments of the time-domain oscillatory apparatus of the invention are presented. The apparatus 367 shown in FIG. 3F comprises a floating proof mass 351 that is suspended within the frame 302 via spring supports (not shown) and two sets of switches (such as the dual-tip switches 310).

Figure 3G:
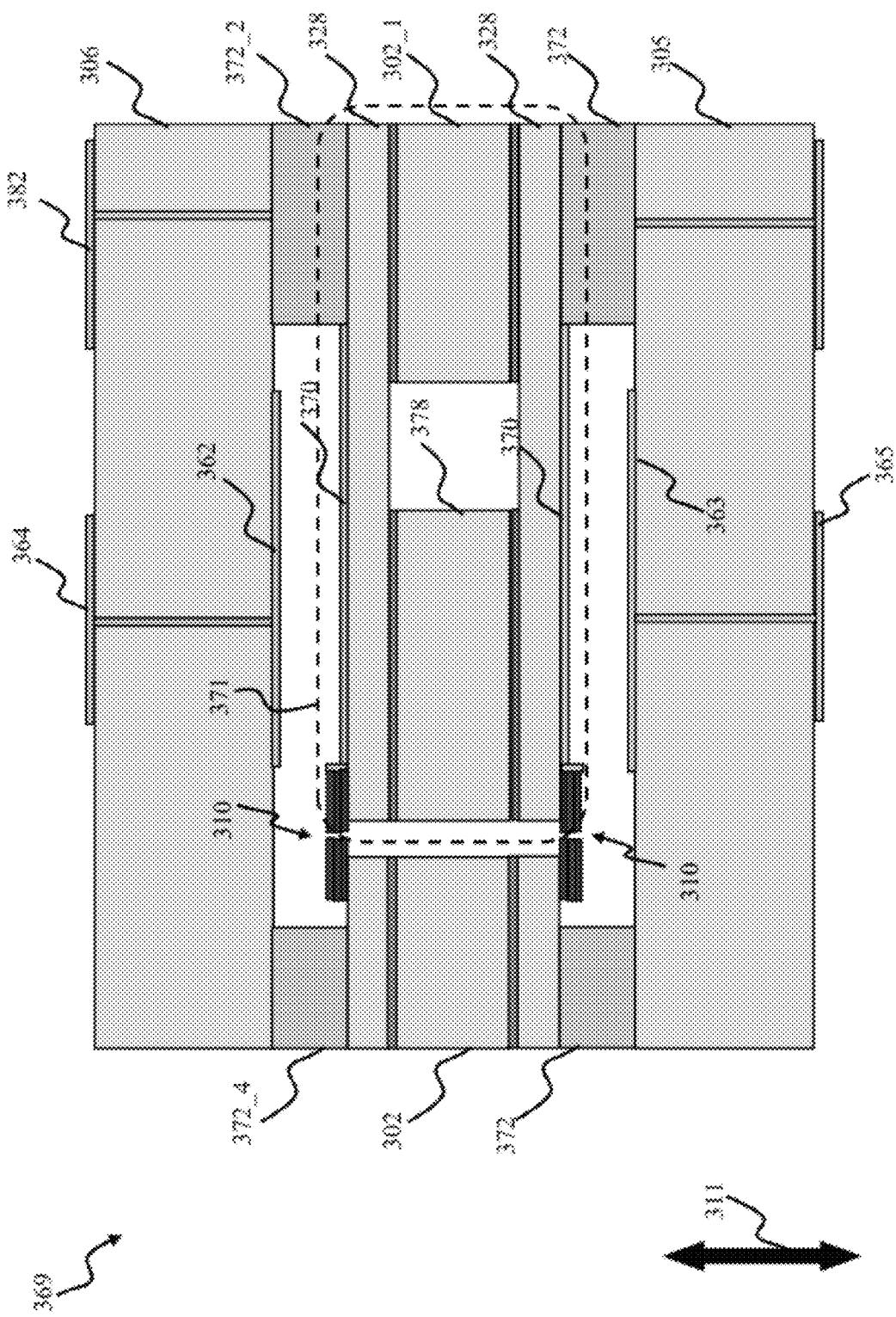
FIG. 3G is a side cross-section view illustrating one embodiment of a time-domain sensing apparatus comprising a dual cantilever proof mass assembly and two sets of dual-electrode switches according to the invention.

The apparatus 369 shown in FIG. 3G, comprises a dual cantilever proof mass assembly 371 (depicted by the dashed rectangle) comprising the proof mass 378 (that is 'sandwiched' between the two cantilevers 328), and two sets of switches 310.

Figure 3H:
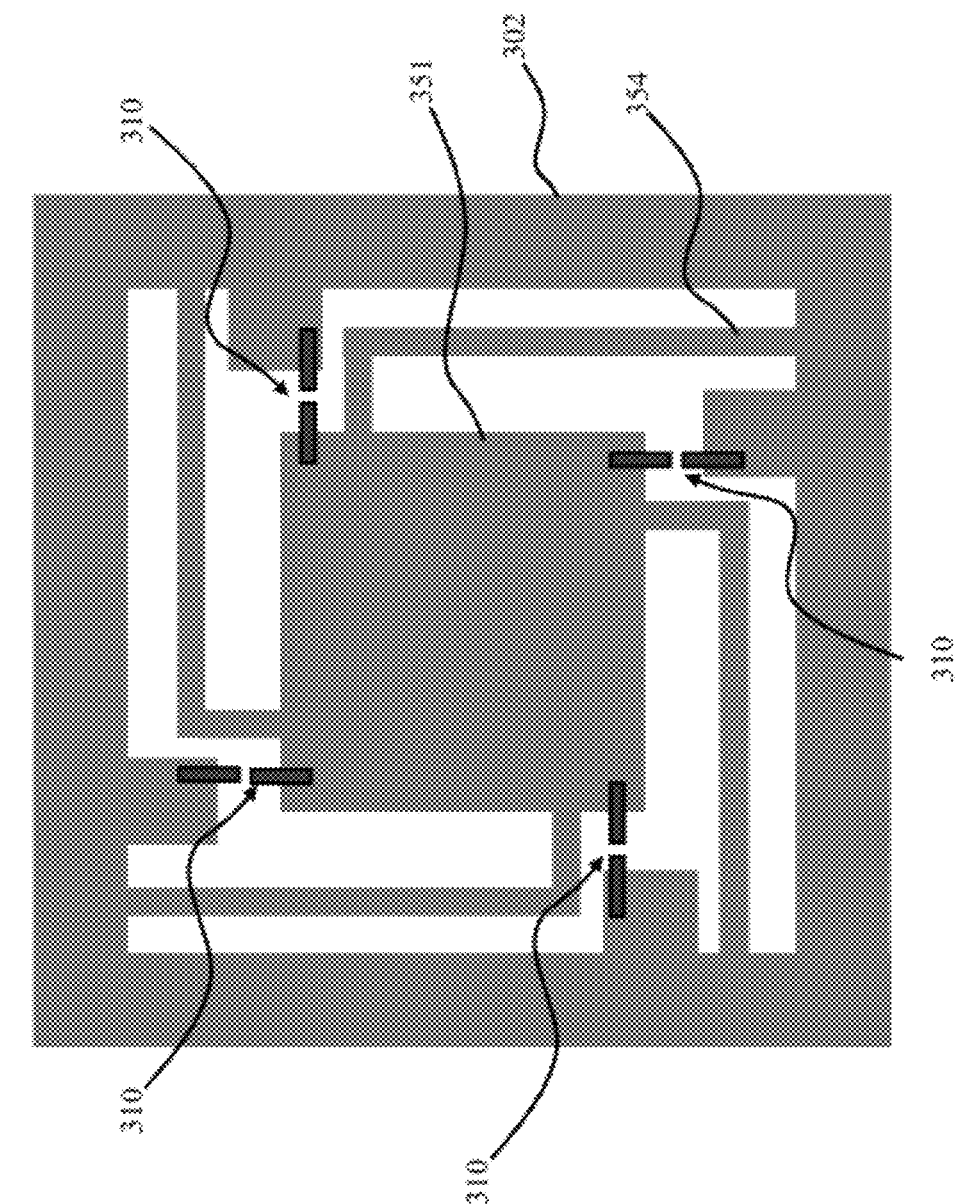
FIG. 3H is a top plan view illustrating another embodiment of a time-domain sensing apparatus comprising a suspended proof mass assembly and multiple sets of dual-electrode switches according to the invention.

The apparatus 373 shown in FIG. 3H comprises a floating proof mass 351 that is suspended within the frame 302 via spring supports 354, and multiple sets of switches (such as the dual-tip switches 310).

Figure 3I:
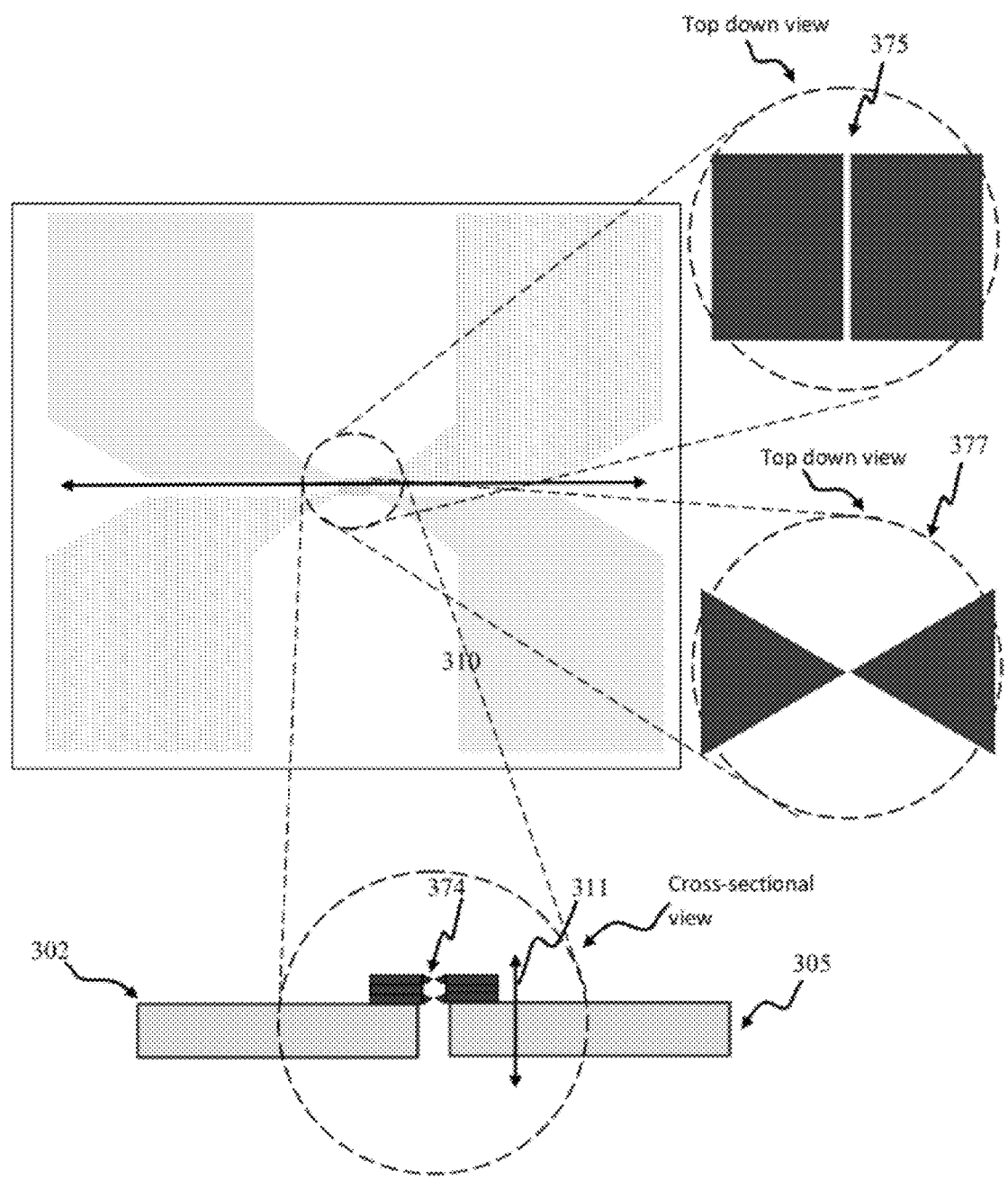
FIG. 3I is a set of top plan and cross-sectional views illustrating multiple different electrode tip embodiments useful with the various time-domain sensing apparatus embodiments described herein.

FIG. 3I illustrates different exemplary embodiments of electrode tips useful with the invention. While the electrode tips of the embodiments of FIGS. 3-3H are shown as having a right prism shape (such as tips 375 in FIG. 3I), the tips can be formed in a variety of shapes that are selected based on the application requirements. Generally, narrowing tips (such as triangular, conical or a trapezoidal) reduce the tip extent proximate to the tunneling gap. Triangular-shaped electrode tips 374 reduce tip vertical extent (that is in the direction of the oscillator motion as referenced by the arrow 311 in FIG. 3I). Such configurations therefore reduce the vertical extent over which the tunneling discharge can occur, thereby increasing repeatability of the proof mass position measurements.

In a different embodiment (denoted by the arrow 377 in FIG. 3I), the electrode tips comprise lateral triangular shapes in a direction that is perpendicular to the direction of motion (such as the direction indicated by the arrow 307 in FIG. 3). The lateral triangle tip 377, while still having the same thickness as the rectangular shaped tip 375, reduces the tunneling discharge area, and, therefore, probability that the tunneling location will change. Overall, narrowing tips (such as the triangular-shaped tips 374, 377), whether defined laterally or vertically, tend to aid in localizing the tunneling location.

The triangular shaped tips, however, may in certain cases limit the maximum tunneling current, because the tunneling is confined to a smaller surface area. One approach to increase tunneling current is to extend the tip dimension in a direction that is perpendicular to the direction of motion (that is, along the dimension indicated by the arrow 307 in FIG. 3). Additionally, higher DC bias voltage and/or higher sensitivity amplifiers may be used to compensate for the reduced surface area of the triangular or similarly shaped tips. While rectangular-shaped tips support larger tunneling current (for the same transverse tip dimension), the tunneling in the rectangular tip can occur at any point across the vertical extent (the height) of the tip. This is potentially undesirable, because the point of tunneling may change with time or other parameters, which may change the stability or accuracy of the switch.

Referring now to FIG. 4, a functional block diagram of one embodiment of an oscillator and electrode system 400 for use with the time domain inertial sensing apparatus (such as the apparatus 300 or 340) is shown. The system 400 comprises two sets of dual-tip switches (Such as, for example, the switch 310 of FIG. 3A). Although only a single set of switches is required for operation of the system 400, additional switches offer, inter alia, redundancy, thereby increasing sensor precision by providing additional data and improving sensor reliability, as previously described with respect to FIG. 3B.

Each dual-tip switch 410 comprises the reference dual-tip electrode assembly 418 disposed on the frame 402, and the sensing dual-tip electrode assembly 420 disposed on the proof mass assembly 404. Each switch assembly 418, 420 comprises a pair of electrodes 412, 414 that are separated by a layer of insulating material 416.

The proof mass assembly 404 comprises two conductive layers 406, 471 (that, similarly to the conductive element 370 shown in FIG. 3D, act as ground planes) disposed on the top and the bottom sides of the proof mass silicon element 428. In another embodiment (not shown), the silicon element 428 is conductive and acts as the ground plane. In a different embodiment (shown in FIG. 4B, below), a single conductive layer 470 is used as the ground plane. The electrodes 412, 414 of each sensing electrode assembly 420 are electrically connected to the top ground plane 406, which is connected to the sensor ground 482. A voltage potential is applied to each of the top 414 and the bottom electrodes 412 of the reference electrode assemblies 320 from a DC source 421.

A pair of conductive plates 462, 463 is disposed on the sensor base and the capping wafers (not shown), respectively, of the apparatus 400. The plates 462, 463 act as the driving electrodes. During operation of the system 400, a sinusoidal (harmonic) driving signal of frequency $f_{drv}$, is generated by the driving circuit 430, and is supplied to the driving plates 462, 463. In the embodiment of FIG. 4, the driving signal that is applied to the plate 463 is shifted by 90° by the phase shift circuit 432, such that the signal that is driving to the bottom plate 463 is 90° out of phase from the signal driving the top plate 462, although other phase shifts/relationships (including time-variant ones) may be used. In one variant, the driving frequency is selected to match the proof mass resonant frequency thereby allowing for a reduced driving duty cycle and reduced power draw of the sensor. In another variant, the proof mass is driven with an off-resonance driving frequency, where $f_{drv.} \neq f_0$. In yet another variant, the duty cycle and/or the driving frequency is used to dynamically adjust the device (e.g., sensor 400, 470) dynamic range, thereby producing a device (e.g., sensor) with an expanded and selectively tunable dynamic range.

Depending on the specific sensor requirements, the driving frequency is in the range from about 100 Hz to about 200 kHz. The corresponding maximum amplitude of the proof mass oscillations is between 10 nm and about 50 μm In another embodiment, (not shown) the oscillation of the proof mass are caused by using a stepped electrostatic force to initiate harmonic oscillation The electrostatic force is short in duration compared to the resonant frequency of the oscillator thus providing a "pushing" reinforcement that keeps the oscillator in resonance. This force is periodically repeated as necessary to ensure that the amplitude of the oscillator stays above a minimum value at which point another electrostatic pulse or "ping" is applied.

For every cycle of the proof mass oscillation, whenever the electrodes 412, 414 are in any of the three aligned configurations (such as, for example, the configurations 328-332 described with respect to FIG. 3A), tunneling discharge currents (indicated by the arrows 415, 417) are induced across the gaps 423 in one or both electrode pairs. These discharge currents generated by the top and/or the bottom electrodes induce brief current pulses, which are sensed and amplified by the low-noise current amplifiers 422, 424, respectively, as shown and described in further detail with respect to FIG. 4A, below.

The width of the tunneling discharge pulse can be of very short duration due to the exponential behavior of the quantum tunneling effect given by Eqn. 11:

$$I = KUe^{-\beta d} \tag{Eq. 11}$$

where:
I is output current;
U is the applied tunneling bias voltage;
d is the tunneling gap width;
K is a constant describing density of available states both source and destination; and
β is a constant describing the electron work function or the energy that is required to free an electron to vacuum potential.

This very short impulse helps to precisely pinpoint the exact moment in time the oscillating mass passes the reference location, which underscores a salient benefit of the present invention (i.e., the ability to accurately pinpoint the position of the oscillating element as a function of time).

Figure 4:
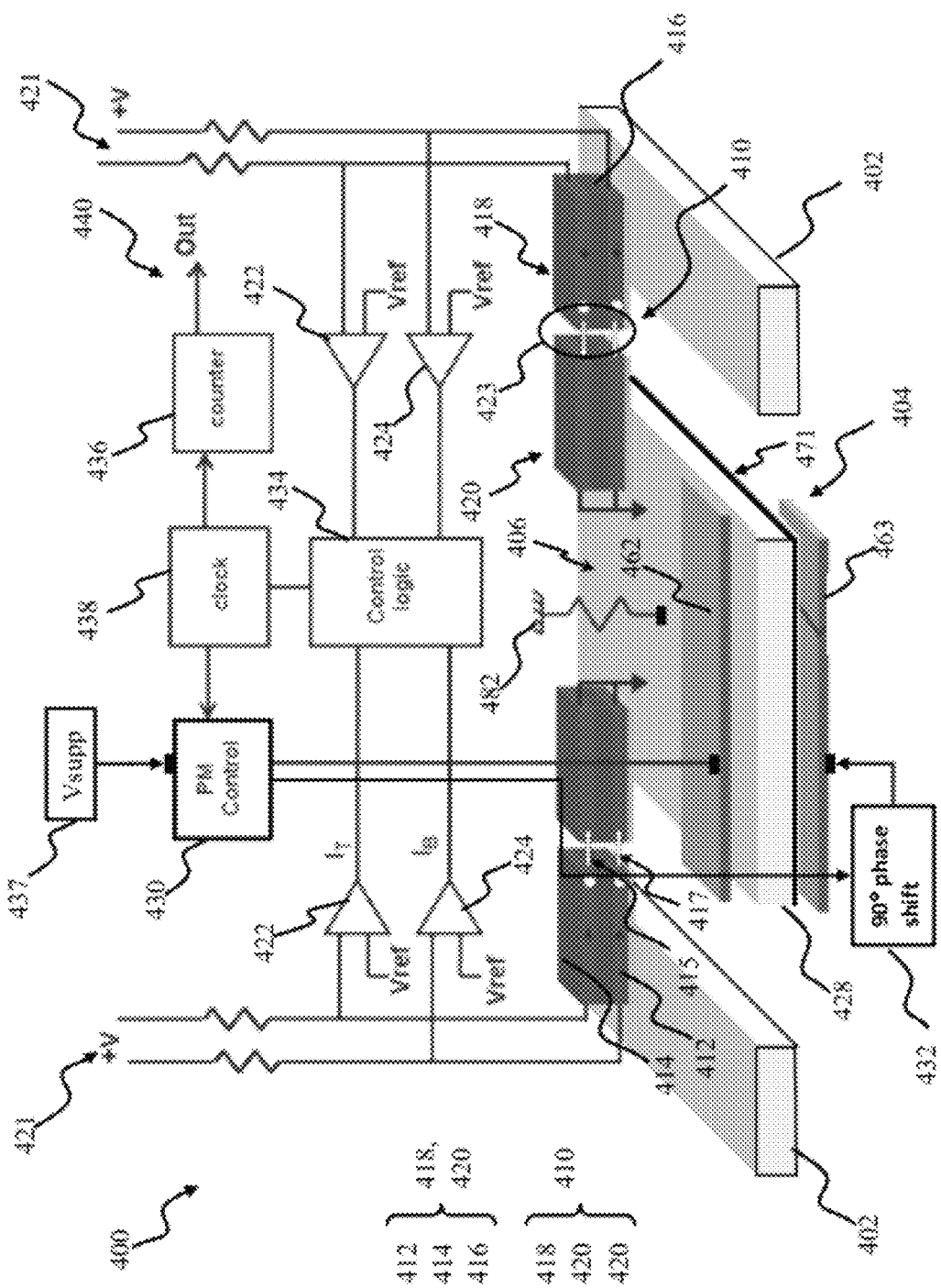
Figure 4A:
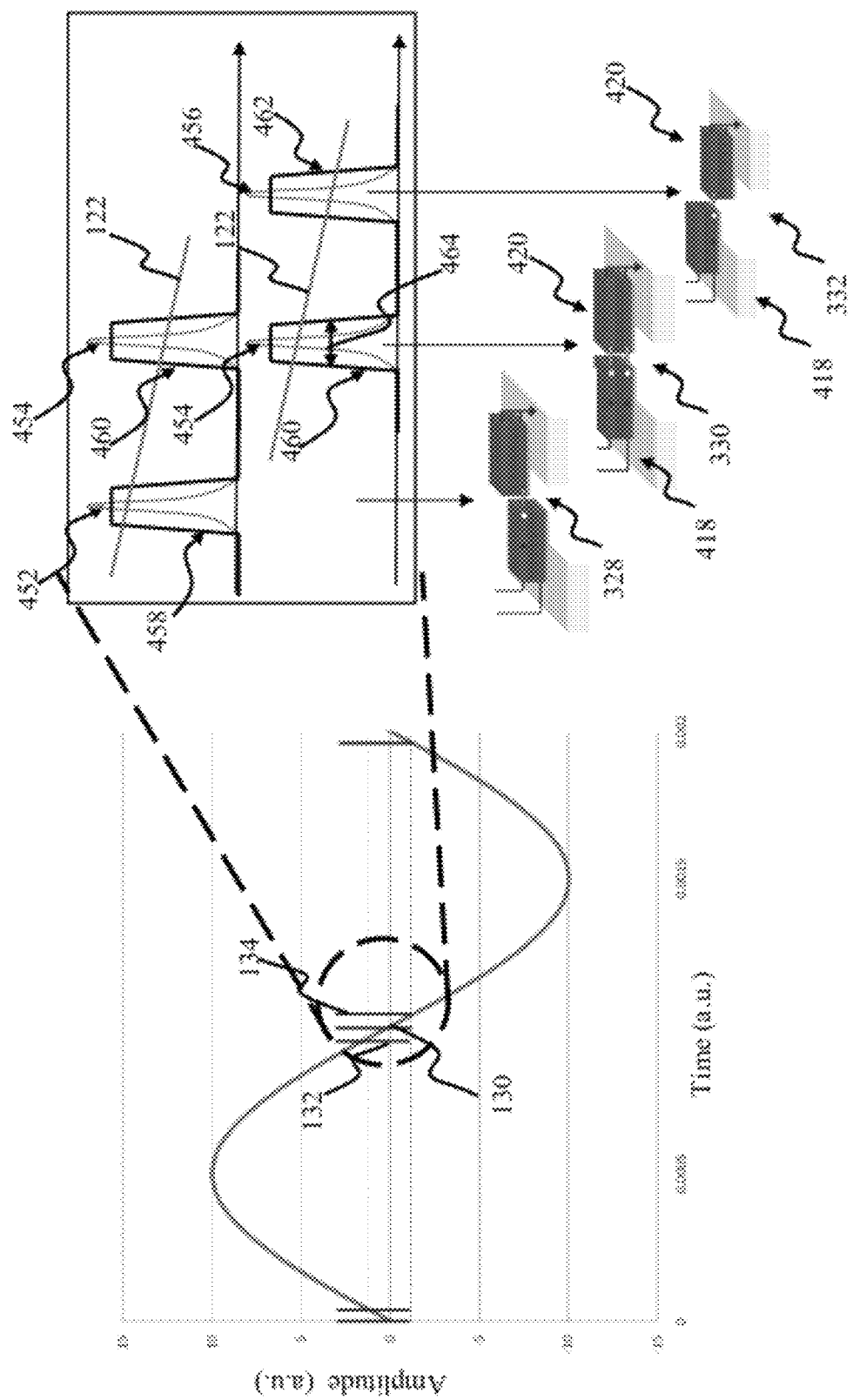
FIG. 4A is a graphical illustration depicting amplification of tunnel current pulses generated by the sensing apparatus of the embodiment of FIG. 4.

As shown in FIG. 4A, the tunneling discharge pulses 452-456 are generated when the proof mass electrode assembly is at the following positions with respect to the reference electrode: $-d_0$, $+d_0$, and at the zero force point (points 328-332, respectively, in FIGS. 3A and 4A). As the pulses 452-456 may differ in amplitude due to, for example, variations in applied tunneling voltage (voltage noise) and/or tunneling distance, the low noise current amplifiers 422, 424 are used to amplify the discharge pulses 452-456 to the rail (that is the maximum current level value of the sensing circuit) so as to produce the amplified pulses 458-462, which exhibit substantially rectangular shapes. Although the amplitude information is lost, the amplified square pulses 458-462 are advantageously well suited for interfacing with digital circuits, such as for example the control logic 434 and the counter 436 in FIG. 4, and/or yet other more sophisticated devices such as digital signal processors.

Furthermore, provided that the amplifier (such as the amplifier 422, 424) is characterized by a constant time delay (which may include zero time delay), the relative timing of the amplified pulses (such as the pulses 458-462 in FIG. 4A) is preserved. The counter 436 is toggled on/off upon detecting the leading edge of the amplified pulse using, in one variant, a comparator circuit, although other solutions will readily be recognized by those of ordinary skill given the present disclosure. When the counter 436 is toggled on, it starts a counting sequence, which continues until the next input pulse is received and the counter is read and/or toggled off. During the "on" state, the counter counts timing pulses provided by a reference clock signal generated by a reference timing unit (TU) 438. The output of the counter is available on channel 440 for use by an external interface, in one implementation of the system 400.

In the embodiment of FIG. 4, a bipolar driving mechanism is used in order to induce harmonic oscillations of the proof mass. Such configuration allows for more flexible control of driving voltages, as well as reduces the impact of charge buildup on the oscillator. To further reduce the charge build up, the proof mass ground layer 406 is electrically connected to the sensor ground 482.

Figure 4B:
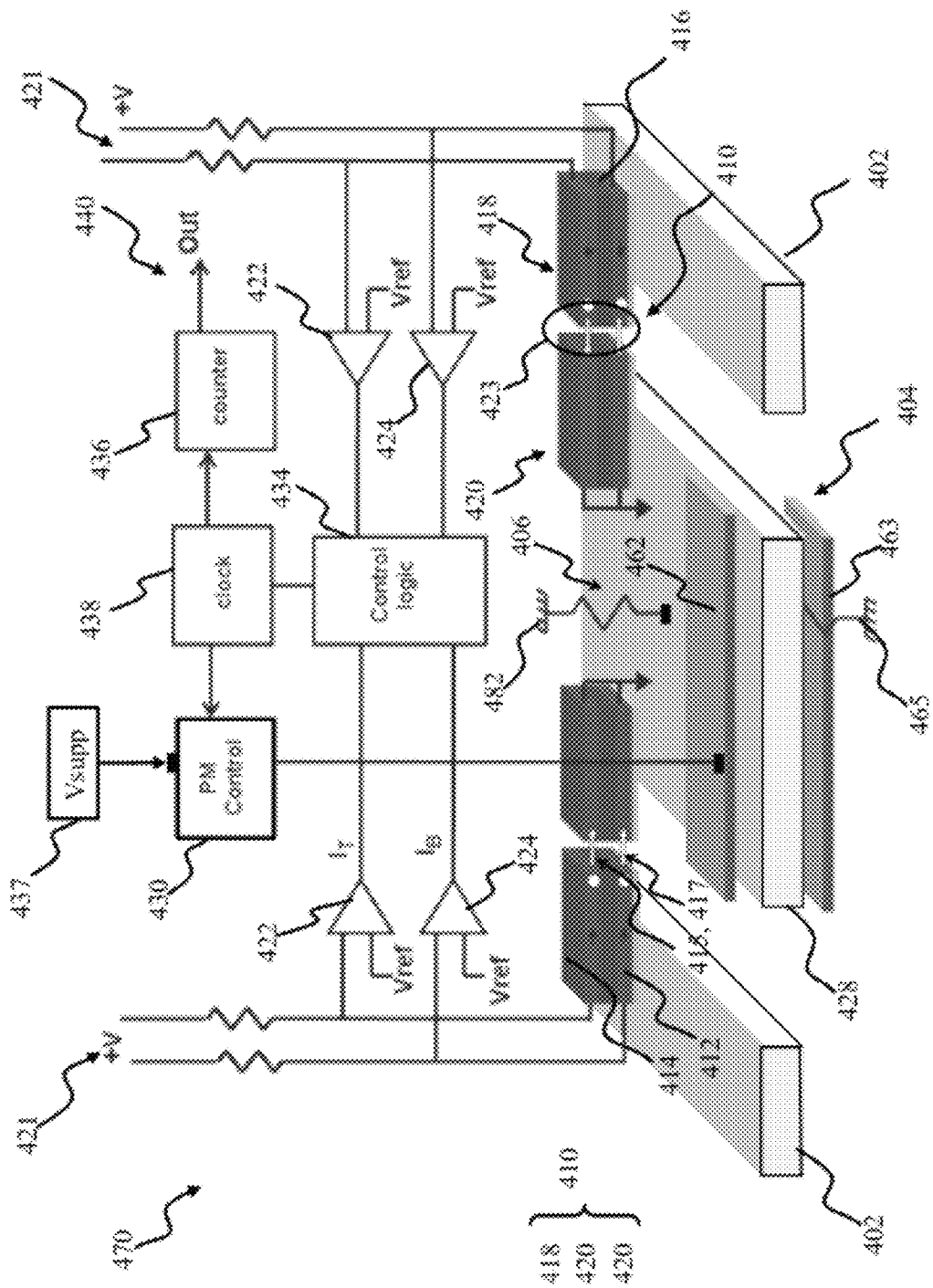
FIG. 4B is a block diagram depicting one embodiment of a time-domain sensing apparatus according to the invention, comprising two dual-electrode switches and a unipolar driver apparatus.

In another embodiment, shown in FIG. 4B, the sensor system 470 comprises a unipolar driving circuit. That is, one of the driving electrodes (the plates 463) is connected to the ground 465 while the other driving electrode (the plate 462) is driven with the sinusoidal driving signal. The configuration shown in FIG. 4B, simplifies the sensor driving circuit.

Electrically driven oscillators used in the force sensing systems 400, 470 (FIGS. 4, 4B respectively) almost inevitably generate unwanted electromagnetic radiation during operation, due to, for example, noise in the voltage supply, digital pulses being generated by various components (such as the controller 430), etc. In order to prevent coupling of electrical noise into the tunneling current (and hence force) measurements, a pulsed driving mechanism is used.

The proof mass (PM) controller 430 of the force sensing system 400, 470 briefly turns on and off the sinusoidal drive signal thus creating a pulsed train, where each N cycles of sinusoidal oscillations are separated by M cycles of no driving. When the drive signal is briefly turned on, the proof mass oscillations are reinforced. The duty cycle of the drive signal (determined as N/(N+M)) is selected based on the sensor specific design parameters (such as the oscillator damping), and is typically in the range from 0.001 to 0.1. The low damping characteristics of the proof mass oscillator ensure that the oscillation amplitude does not decrease substantially between the driving pulsed events. Furthermore, the use of three triggering points (such as the points 104, 106, 108 in FIG. 1A) enable accurate measurements of the proof mass deflection regardless of the oscillation amplitude (provided that the amplitude of oscillations is kept above trigger point 106 and below trigger point 108), which is readily attainable with the driving duty cycle of 1 very short pulse every 10-1000 oscillator cycles. Ideally the pulse is an impulse so the narrower the better. The more often we pulse the larger we drive the amplitude of the oscillator. The oscillator position measurements are performed by the force sensor systems 400, 470 when the driving signal to the oscillator is turned off, and therefore no noise is coupled from the electrical drive circuitry to the position sensing circuit of the sensor apparatus. The driver configuration (such as shown and described with respect to FIG. 4 and FIG. 4B) ensure that no feedback force need be applied to the proof mass assembly during the actual measurement of external force.

As those skilled in the art will recognize, the above-described exemplary driving and sensing configurations are provided herein merely to illustrate the broader principles of the invention. Various other sensor driving configurations may be used, such as manually excitation of the resonance by mechanically "pinging", or driving the oscillator with a sinusoidal mechanical driving force. In the case of an electric oscillator system, negative feedback is used to keep the oscillator operational.

Figure 4C:
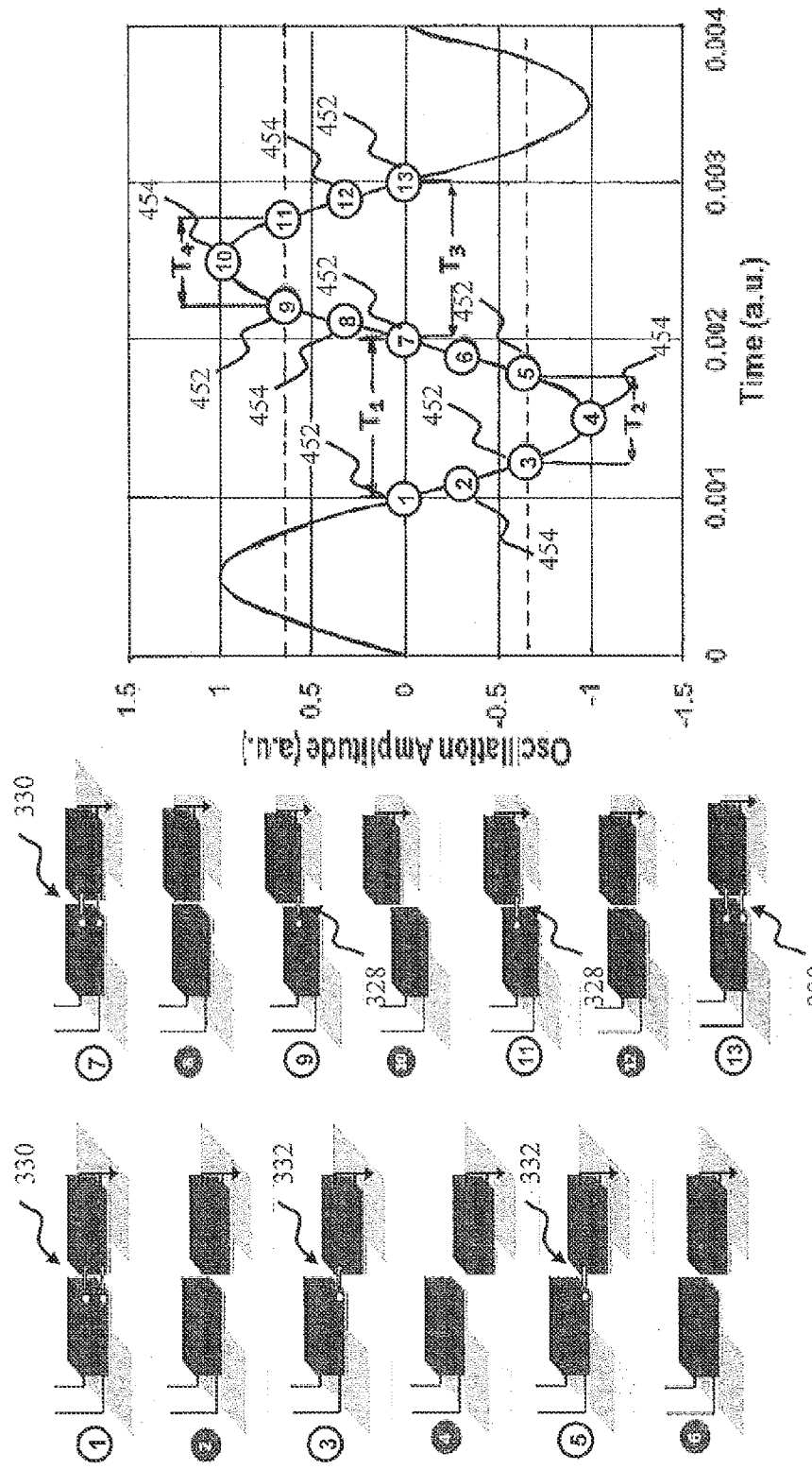
FIG. 4C is a graphical illustration depicting exemplary trigger events and dual electrode switch positions for the time-domain sensing apparatus of FIGS. 4 and 4B.
Figure 5:
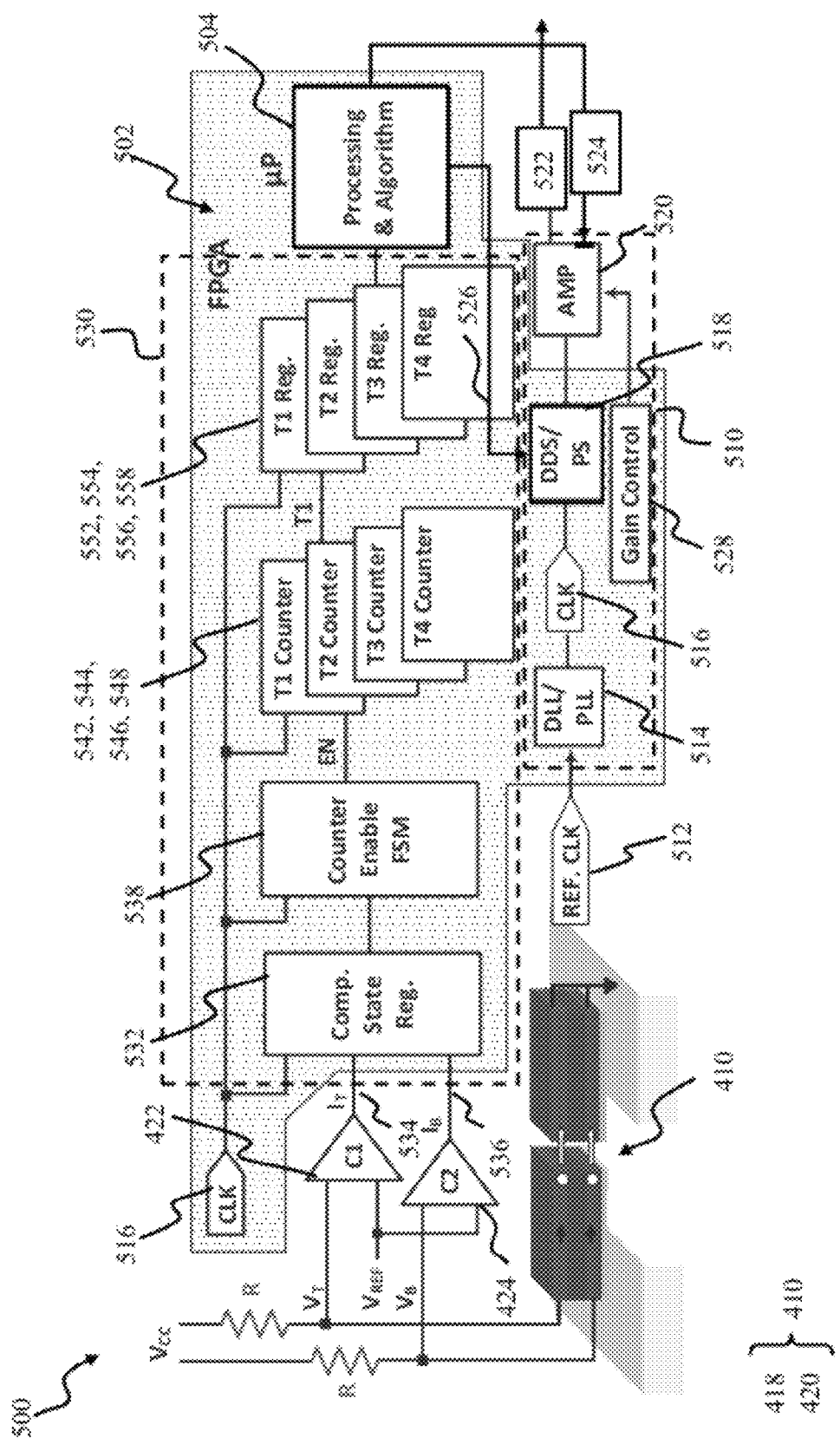
Figure 6:
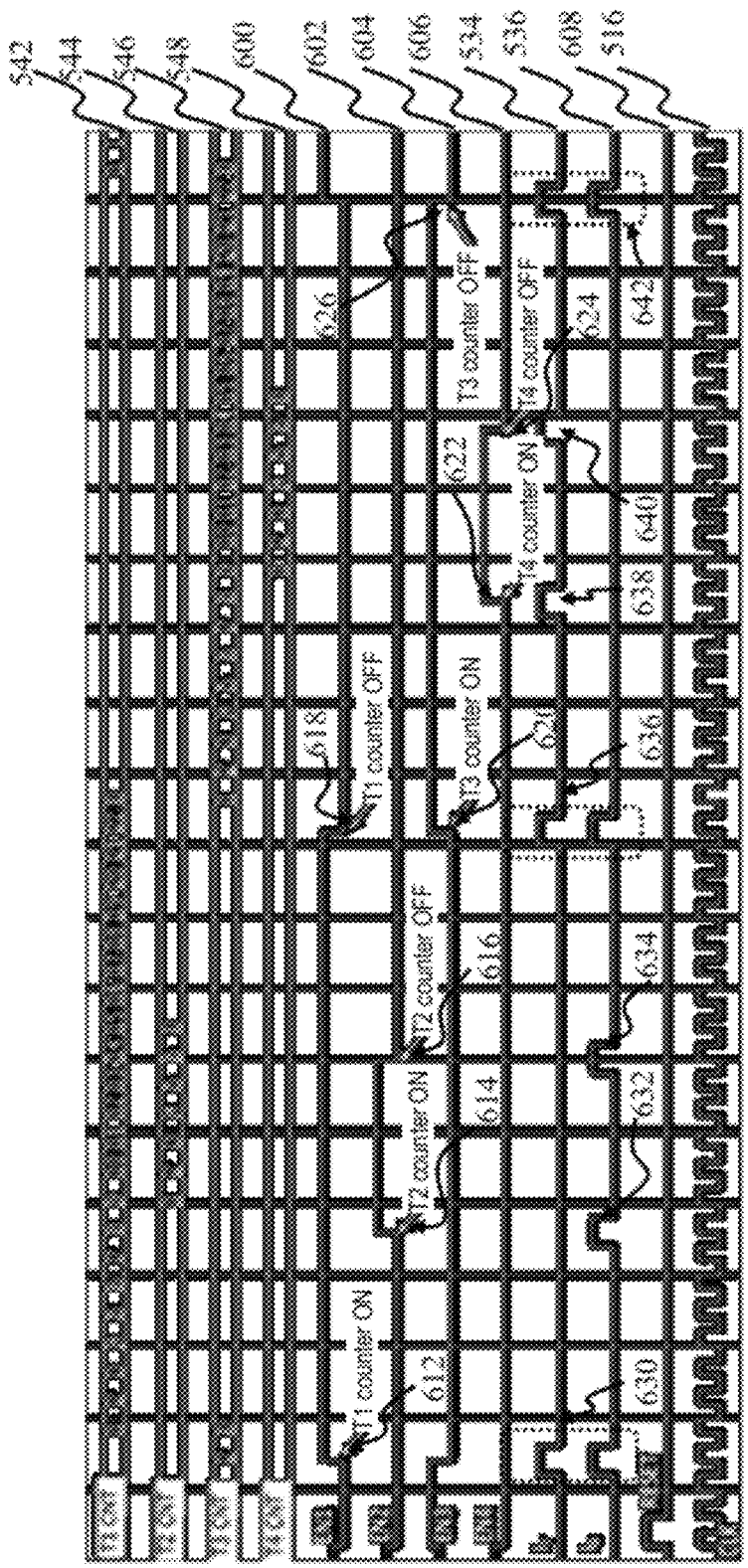

In the embodiments of FIGS. 4 and 4B, the control logic 434 is configured to differentiate between the incoming tunneling pulses based on whether the incoming pulse arrives on the top, the bottom, or both amplifier channels 422, 424, thus corresponding to the proof mass positions 328-332 of FIG. 3A, respectively. In one variant, the control logic detects incoming pulses using a comparator. FIG. 4C and Table 1 illustrate an exemplary sequence of the tunneling pulse generation, comprising one complete cycle of the proof mass oscillation. The white circles 452 in FIG. 4C on the oscillation profile indicate the tip positions where a conducting path is established for current flow (i.e., the comparator output is a logical "1"). The shaded circles 454 correspond to positions where there is no conducting current (i.e., the comparator output is a logical "0").

When the proof mass is in the zero force position 330 (denoted with the designators 1, 7, 13), both electrodes of the electrode assemblies 418 and 420 are aligned, hence causing current pulses on both amplifier channels 422, 424 as indicated by numeral 1 in columns labeled $I_T$ and $I_B$, respectively, in Table 1. When the proof mass is in the negative displacement position 332 (denoted with the designators 3, 5), the bottom electrode 412 of the switch 410 reference electrode assembly 418 causes the current pulse on the bottom amplifier channel 424, as indicated by numeral 1 in columns labeled $I_B$, in Table 1 below. Similarly, when the proof mass is in the positive displacement position 328 (denoted with the designators 9, 11), the top electrode 412 of the switch 410 reference electrode assembly 418 causes the current pulse on the top amplifier channel 422, as indicated by numeral 1 in columns labeled $I_T$, in Table 1. When the proof mass in the positions denoted with the designators 2, 4, 6, 8, 10, and 12, no current pulses are generated by the electrodes 412, 414.

TABLE 1

| Proof mass position in FIG. 4C | Proof mass position in FIG. 3A | Triggering Event of FIG. 1 | $I_T$ channel 422 | $I_B$ channel 424 |
|---|---|---|---|---|
| 1 | 330 | 110 | 1 | 1 |
| 2 | | | 0 | 0 |
| 3 | 332 | 114 | 0 | 1 |
| 4 | | | 0 | 0 |
| 5 | 332 | 114 | 0 | 1 |
| 6 | | | 0 | 0 |
| 7 | 330 | 110 | 1 | 1 |
| 8 | | | 0 | 0 |
| 9 | 328 | 112 | 1 | 0 |
| 10 | | | 0 | 0 |
| 11 | 328 | 112 | 1 | 0 |
| 12 | | | 0 | 0 |
| 13 | 330 | 110 | 1 | 1 |

The proof mass positions 5, 7, 9 correspond to the triggering events 114, 110, 112, respectively, described with respect to FIGS. 1-1A. Whenever triggering events 110, 112, 114 occur (that is, whenever pulses 452-456 toggle the counter 434), the counter begins counting pulses of the reference clock signal.

As shown in FIG. 4A, the periods $T_1$-$T_4$ are computed as follows:

$T_1$ is the counter value at the second reference trigger point event (proof mass position 7) minus the counter value at the first reference trigger point event (proof mass position 1);

$T_2$ is the counter value at the second negative trigger point event (proof mass position 5) minus the counter value at the first negative point trigger event (proof mass position 3);

$T_3$ is the counter value at the second positive trigger point event (proof mass position 11) minus the counter value at the first positive point trigger event (proof mass position 9); and $T_4$ is the counter value at the third reference trigger point event (proof mass position 13) minus the counter value at the second reference point trigger event (proof mass position 7).

As seen from FIG. 4C and Eqns. 3 and 4 above, the dual tip switch (such as the switch 410 of FIG. 4, comprising 4 electrodes) provides three predetermined trigger points (110, 112, 114), thus enabling the sensing system 400 to obtain two estimates of the oscillator deflection (and hence the force) every period (or twice per cycle). Such switch configuration can be used to increase sensor system frequency response, or to improve sensor system precision by averaging successive measurements and reducing measurement uncertainly. A switch comprising two trigger points (such as, for example, the three electrode switch 348 of FIG. 3C) enables one measurement of the oscillator deflection every period. Both above measurement configurations (e.g., using switches 310, 348) are advantageously insensitive to the oscillator amplitude.

Assuming that the oscillator amplitude is known (by for example using a factory calibration table relating oscillator displacement to the supplied drive voltage), a switch comprising a single electrode pair may be used to estimate oscillator deflection. While this approach relies on the accurate knowledge the proof mass amplitude, under most practical conditions it provides measurement performance that is well in excess of the presently available sensor implementations. Furthermore, similarly to the dual electrode switch configuration (e.g., the switch 410 in FIG. 4, the single electrode pair sensor utilizes the width 464 (that is the time between the leading edge and the falling edge, as shown in FIG. 4A) of the amplified pulses 458-462, in combination with the electrode thickness, thus obtaining additional timing information required to obtain oscillator displacement measurements independently from the oscillation amplitude. In this instance, the pulse width is serving effectively the same purpose as the electrode spacing $d_0$ of the dual-electrode switch embodiment shown, for example, in FIGS. 3, 3A, 3D. That is, it provides a fixed distance between two events that are used to toggle a counter on/off.

In one embodiment of the system, four separate counters are used to measure the periods $T_1$ through $T_4$, as shown and described with respect to FIG. 5. The time-domain inertial sensor control block 500 comprises a programmable logic apparatus 502 (depicted by a polygon filled with a dotted pattern in FIG. 5) such as field programmable gate array FPGA, programmable logic device (PLD), microcontroller, or any other computerized apparatus configured to execute machine readable code. In one variant, the control logic is implemented within an FPGA that supports an embedded microprocessor or digital processor 504. The apparatus 502 comprises a drive sub-block 510, a sensing sub-block 530, and a reference clock 512. The drive sub-block 510 comprises a delay lock loop/phase lock loop (DLL/PLL) module 514 configured to generate a drive clock signal 516. The direct digital synthesizer/power supply (DDS/PS) module 518 generates drive waveforms (such as the waveform 202 in FIG. 2), which are amplified by the amplifier 520. The amplifier 520 provides the harmonic oscillation signal 522 to the driving electrodes (such as the electrodes 462, 463 of FIG. 4).

As described with respect to FIG. 4A discussed, in order to minimize potential noise cross-coupling from the driving signal into tunneling current measurements, the driving sinusoidal signal 522 is pulsed—that is, briefly turned on and off. When the signal 522 is briefly turned on, the proof mass is oscillations are reinforced. The drive pulsing is controlled by the control logic module 504 via the control signal path 524 in this embodiment.

The waveform generation by the DDS/PS module 518 is controlled by the control logic module 504 via the path 526. The gain control module 528 controls the amplifier gain in order to adjust the amplitude of the oscillator.

The sensing sub-block 530 is configured to determine positions of the oscillating proof mass. The sensing sub-block 530 comprises the comparator bank 532 coupled to the output channels 534, 536 of the top 422 and the bottom 424 current amplifiers. The logic states of the comparator 532 are fed to the counter finite state machine (FSM) 538, the latter which controls operation of four period counters 542-548, corresponding to the periods $T_1$ through $T_4$, respectively, of FIGS. 1A and 4C. The counter outputs are coupled to the four registers 552-558, configured to store period duration counts $T_1$ through $T_4$, respectively. Without any external force acting on the proof mass, the mass oscillates with a zero deflection bias. When there is external force acting on the proof mass, the oscillating trajectory of the mass changes due to a non-zero deflection bias (as illustrated in FIG. 1A). The sensing sub-block is configured to detect the proof mass deflection using different trigger point events (such as the events 110-112 in FIG. 1), and determine the force using Eqns. 3-6 described above.

As described above with respect to FIG. 4A, the comparators of the comparator bank 532 are used to detect the presence of the tunneling current pulses. The truth table for the relationship of the comparator 532 logic states to the tunneling electrode tip positions is given in Table 1. Note that the numeral '1' denotes tunneling current being generated, and numeral '0' corresponds to no current.

An exemplary counting sequence, corresponding to the mass oscillation depicted in FIG. 4A and used in the exemplary force sensor of the embodiment shown in FIG. 5 is presented in FIG. 6. The comparator bank 532 detects current pulses 630 on both channels 534, 536, corresponding to the reference trigger position of the proof mass (point 1 in FIG. 4C). At this instant, the counter state machine 538 starts the counter 542 by setting the enable signal EN1 high (edge 612) on channel 600. When the tunneling current pulse 632 is received on the bottom channel 536 by the comparator bank 532 corresponding to the negative trigger point event (for example, the proof mass position 3 in FIG. 4A), the counter 544 is started by setting the enable signal EN2 high (edge 614) on channel 602. When the next negative trigger point event is detected by the comparator 532 (i.e., the pulse 634 is received on channel 536), for example corresponding to the proof mass position 5 in FIG. 4A), the enable signal 602 is set low (edge 616) and the counter 544 is stopped. The content of the counter 544 (corresponding to the period $T_2$) is then stored in the register 554, and the counter 544 is reset.

When the second reference point trigger event is detected by the comparator bank by sensing the current pulses 636 on both channels 534, 536, (for example, the event corresponding to the proof mass position 7 in FIG. 4A), the counter 542 is stopped by setting the EN1 signal 600 low (edge 618) and the counter 546 is started by setting the EN3 signal 604 high (edge 620). The content of the counter 542 (corresponding to the period $T_1$) is stored in the register 552, and the counter 542 is reset.

When the tunneling current pulse 638 is received on the top channel 534 by the comparator 532 (corresponding to the positive trigger event, for example corresponding to the proof mass position 9 in FIG. 4A), the counter 548 is started by setting the EN4 signal 606 high (edge 622).

When the next positive trigger point event is detected by the comparator 532 receiving the pulse 640 on channel 534, (for example, corresponding to the proof mass position 11 in FIG. 4A), the counter 548 is stopped by setting the EN4 signal 606 low (edge 624), the content of the counter. 548 (corresponding to the period $T_4$) is stored in the register 558, and the counter 548 is reset.

When the next reference trigger point event is detected when the comparator receives current pulses 642 on both channels 534, 536 (for example the event corresponding to the proof mass position 13 in FIG. 4A), the counter 546 is stopped by setting the EN3 signal 604 low (edge 626), the content of the counter (corresponding to the period $T_3$) is stored in the register 556, and the counter 546 is reset. If the next counting sequence is scheduled to commence, the counter 542 is started. The timing operation of the system 500 is controlled by the clock 516 and reset signal 508 is used to initiate (or reset) the counting sequence of FIG. 6.

In another embodiment (not shown), a single counter instance (for example, the counter 542) is used for all of the counting operations, and is combined with several registers that serve as memory buffers. In this implementation, by way of example, the counting sequence begins with the receipt of the reference trigger point event by the counter 542. When the first negative trigger event is received (for example corresponding to the proof mass position 3 in FIG. 4A), the current value of the sequence count is stored in the negative trigger event_start register. When the second negative trigger event is received (for example the event corresponding to the proof mass position 5 in FIG. 4A), the current value of the counter 542 sequence count is stored in the negative trigger event_end register. When the second zero reference level trigger event is received (for example corresponding to the proof mass position 7 in FIG. 4A), the current value of the sequence count is stored in the reference trigger event_end register. Similarly, the counter sequence values corresponding to the proof mass positions 9, 11 are stored in the respective registers. Other variations are possible, such as stopping and starting the counting sequence for each incoming pulse.

Referring now to FIG. 6 a timing diagram illustrating an exemplary operational sequence for the time-domain force sensing system of FIG. 5 is shown.

The accuracy of the force measurements produced by the sensing system 400, or 470 is largely determined by accuracy of the clock rate. The more accurately that the periods $T_1$ through $T_4$ are resolved, the more accurately the deflection d, and, therefore, the quasi-static force acting on the harmonic oscillator, are determined.

Because the periods $T_1$ through $T_4$ are measured using a digital counter which keeps track of the clock cycles between the trigger events, the accuracy, stability and precision of the sensor are substantially dependent upon the input clock rate to the counter, and the long-term stability of the clock source. By an analogy with other digital sensing devices, the sensor system 400 resolution and dynamic range may be described by a number of bits which is related to the total number of the effective clock cycles contained within one period of the harmonic oscillator.

Some trigger events may occur between clock cycles, thereby potentially impacting precision of the measured time periods. These timing errors may result in a quantization noise which limits the resolution and precision of the sensor, but not the stability or accuracy. Several techniques may be used consistent with the invention in order to improve resolution of the sensor. In one approach, time quantization noise is reduced through the use of Vernier interpolators of the type known in the art. In another approach, dithering techniques are applied that introduce an intentional jitter into the reference clock (e.g., on the order of a half clock cycle) such that low frequency inertial forces applied to the sensor can be averaged over time. Given that the periods $T_1$ through $T_4$ are computed using differences between successive counter values, as described with respect to FIG. 4C, the absolute accuracy (drift) of the reference clock is cancelled, hence making the sensing apparatus of the embodiment of FIG. 4 less susceptible to long term clock drift errors.

Bias instability, on the other hand, is ultimately determined by the instability of the clock source. This is true because any other mechanical instability can be accounted for based on the fact that a harmonic oscillator will always have a zero mean in the absence of an applied external force. Electrical drift, due to e.g., charging of the proof mass, can be eliminated or at least significantly mitigated by alternating positive and negative "pings" to the oscillator, thus providing a net zero charge. In addition, any measurement of the position can be performed during a period when there is no applied electrical force.

Sensing Apparatus Calibration

A dual set of tunneling tips (such as, for example, the electrodes 314, 312 of the electrode assemblies 318, 320 in FIG. 3A), separated by a predefined physical gap, $d_0$, provides a convenient configuration for in situ calibration of the inertial sensing apparatus (such as for, example, the apparatus 300 in FIG. 3). In this case, $d_0$ is the physical spacing between the tunneling tips, and is precisely defined during the fabrication process. The final measurement of the electrode spacing is performed during device factory calibration. The spacing $d_0$ advantageously does not change over time, since it is based on a physical device configuration (layer deposition), and not on dynamic properties of the oscillator. Thus, the calibration is effectively "built-in" into the operation of the sensor, and no subsequent calibration need be performed. All parameters required to measure acceleration are either fixed (e.g. $d_0$), or are measured every oscillation period (e.g., $T_1$ through $T_4$ and P). Therefore, there are no parameters that can drift, and there is no need for recalibration. The parameters that could drift are measured every period. This is yet another salient advantage over the prior art provided by the present invention.

Exemplary Uses and Applications

The time-domain oscillatory (TDO) apparatus and methods described herein advantageously provide a digital time-based output, compared to analog signal output typically provided by prior art MEMS devices. The accuracy of TDO devices of the invention is, therefore, dependent only on the consistency of the trigger events, the oscillation properties (e.g., harmonic oscillation of the proof mass), and timing measurement accuracy of the trigger events. Since the time separation between the triggering events is based on the physical dimensions established during fabrication, the sensing apparatus of the embodiments of the invention does not require continuing calibration, as discussed above.

Furthermore, the sensing employed by the various exemplary embodiments described herein is based on non-contact triggering events, which are generated without any physical contact between the oscillator and the sensor frame. This approach advantageously reduces oscillator damping and wear, increases sensor longevity and long-term accuracy, and reduces power consumption (as the oscillator may be driven with lower power due to reduced damping). Measurement of external force is performed without any electrostatic or feedback force applied to the proof mass element, thereby improving measurement accuracy while reducing sensor complexity.

Most existing inertial MEMS sensors rely on the dynamic characteristics of the sensing apparatus (such as, the oscillating frequency $f_0$, or amplitude A, for example) in order to measure effects of external forcing. These dynamic properties are dependent on the sensor parameters (such as the elastic constant k) which change in time due to sensor aging, 'annealing' of the cantilever, etc. Such changes result in reduced sensor accuracy with time, and necessitate periodic calibrations.

On the contrary, the accuracy of the time-domain apparatus constructed in accordance with the principles described herein only depends on the physical spacing of the sensing elements (which is defined by the sensor manufacturing process), thus dramatically improving sensor long term stability accuracy, and obviating the need for recalibrations. As a result, the accuracy and stability of the oscillatory apparatus described herein significantly exceeds accuracy of any available device (MEMS or otherwise), for a given device size, manufacturing precision, sensor operating bandwidth, and sensor cost target. Moreover, by changing the amplitude of the oscillations, the dynamic range of the oscillatory apparatus of the invention is dynamically adjusted and may even be made user- or controller-selectable.

Because prior art tunneling-based accelerometers measure the proof mass deflection using the relationship between the tunneling current and the tip-to-surface distance, their dynamic range is limited. In contrast, an exemplary force sensing apparatus constructed in accordance with the principles of the present invention uses tunneling discharge only to generate triggering events. It, therefore, advantageously offers a greatly increased dynamic range of measurements (e.g., from $1 \times 10^{-4}$ $g_0$ to 2 $g_0$ in one fixed amplitude oscillator implementation), compared to the previously available force sensing tunneling devices. Furthermore, dynamic oscillation amplitude adjustment allows for a further increase of the dynamic range as previously indicated.

As referenced above, certain sensor embodiments described herein measure force based on a ratio of clock frequency to proof mass oscillation frequency, thereby making the sensor accuracy insensitive to clock drift (to the first order). Additionally, measurements averaged over multiple oscillation cycles enable the filtering out of unwanted noise.

While primarily discussed in the context of the electron tunneling sensing tip elements, the present invention is not so limited. In fact, many other physical switching mechanisms are useful with the sensor apparatus and methodologies described herein, including but not limited to: optical (based on an alignment between a light source, such as a light emitting diode (LED) and a light detector (such as a photo detector), magnetic (based on an alignment between two ferrous elements, such as in a reed switch), piezoelectric, thermal, capacitive, chemical, biological, etc.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A method comprising the steps of:
generating a triggering event when a first element of a switch passes a second element of the switch, wherein the first element is disposed on a proof mass assembly and the second element is disposed on a frame fixed in location with respect to the proof mass assembly, wherein the first element is an oscillator in harmonic oscillation, wherein when the oscillator is displaced from a reference position the oscillator experiences a restoring force proportional to the displacement, and the second element is located at a fixed trigger position of one or more fixed trigger positions within the amplitude range of the oscillation, wherein the fixed trigger positions are predefined physical locations with respect to a reference position of the first element;
determining at least one time period between successive triggering events; and
using the at least one time period and the fixed trigger position of the second element to determine one or more parameters of the oscillation.

2. The method of claim 1, wherein the first element and the second element comprise electron tunneling electrodes and the triggering event is a tunneling current between the first element and the second element.

3. The method of claim 1, wherein the parameters of oscillation include parameters caused by an external force acting upon the first element.

4. The method of claim 1, wherein the step of using the at least one time period to determine one or more parameters of the oscillation comprises using a time period between successive triggering events with respect to the same fixed trigger position.

5. The method of claim 1, wherein the step of using the at least one time period to determine one or more parameters of the oscillation comprises using more than one time periods between successive triggering events with respect to the same fixed trigger position.

6. The method of claim 1, wherein the step of using the at least one time period to determine one or more parameters of the oscillation comprises using a time period between successive triggering events with respect to a first fixed trigger position and using a time period between successive triggering events with respect to a second fixed trigger position.

7. The method of claim 1, wherein the step of using the at least one time period to determine one or more parameters of the oscillation comprises using the time period to estimate a deflection of the first element.

8. The method of claim 7 further comprising the step of using the estimated deflection of the oscillation to determine an acceleration of the oscillation.

9. The method of claim 1, wherein the step of using the at least one time period to determine one or more parameters of the oscillation comprises using the time period to estimate an amplitude shift of the oscillation.

10. The method of claim 1, wherein the step of using the at least one time period to determine one or more parameters of the oscillation comprises using the time period to estimate a phase shift of the oscillation.

11. The method of claim 1, wherein the step of using the at least one time period to determine one or more parameters of the oscillation comprises using the time period to estimate a change in period of the oscillation.

12. The method of claim 1, wherein the step of using the at least one time period to determine one or more parameters of the oscillation comprises using the time period to estimate damping of the oscillation.

13. A method comprising the steps of:
generating a triggering event each time a first element of a switch passes a second element of the switch, wherein the first element is disposed on a proof mass assembly and the second element is disposed on a frame fixed in location with respect to the proof mass assembly, wherein the first element is an oscillator in harmonic oscillation and the second element is located at one of more than one fixed trigger positions within the amplitude range of the oscillation, wherein when the oscillator is displaced from a reference position the oscillator experiences a restoring force proportional to the displacement, wherein the fixed trigger positions are each at a fixed predefined physical location with respect to a reference position of the first element of the switch;
determining at least one time period between successive triggering events; and
using the at least one time period and the physical locations of the fixed trigger positions to determine one or more parameters of the oscillation including parameters caused by an external force acting upon the oscillator.

14. The method of claim 13, wherein the step of using the at least one time period to determine one or more parameters of the oscillation comprises using a time period between successive triggering events with respect to the same fixed trigger position.

15. The method of claim 13, wherein the step of using the at least one time period to determine one or more parameters of the oscillation comprises using more than one time periods between successive triggering events with respect to the same fixed trigger position.

16. The method of claim 13, wherein a first fixed trigger position is a reference trigger position, a second fixed trigger position is a positive trigger position, and a third fixed trigger position is a negative trigger position, wherein the parameters comprise a deflection of the oscillator's oscillation, wherein the deflection of the oscillator's oscillation comprises a positive deflection $d_+$ around an oscillation maximum, where $$d_+ = A_+ \cos\frac{\pi T_1}{P}, \text{ where } A_+ = \frac{d_{0+}}{\cos\frac{\pi T_2}{P} - \cos\frac{\pi T_1}{P}},$$

and a negative deflection $d_-$ around an oscillation minimum, where $$d_- = A_- \cos\frac{\pi T_3}{P}, \text{ where } A_- = \frac{d_{0-}}{\cos\frac{\pi T_4}{P} - \cos\frac{\pi T_3}{P}},$$

where $d_{0+}$ is the distance between the reference trigger position and the positive trigger position, $d_{0-}$ is the distance between the reference trigger position and the negative trigger position, $A_+$ is the amplitude of the oscillations at the oscillation maxima, $A_-$ is the amplitude of the oscillations at the oscillation minima, P is the period of oscillations defined as $P=T_1+T_3$, where $T_1$ is the upswing reference trigger position crossing period, $T_2$ is the positive trigger position crossing period, $T_3$ is the downswing reference trigger position crossing period, and $T_4$ is the negative trigger position crossing period.

17. The method of claim 16, wherein the step of estimating a deflection of the first element's oscillation comprises separately using both $d_+$ and $d_-$ for each cycle of oscillation to provide two separate deflection estimates per cycle of oscillation.

18. The method of claim 16, wherein the step of estimating a deflection of the first element's oscillation comprises averaging $d_+$ and $d_-$ for each cycle of oscillation to provide one deflection estimate per cycle of oscillation.

19. A method comprising the steps of:

generating a triggering event when a first element of a switch passes a second element of the switch, wherein the first element is disposed on a proof mass assembly and the second element is disposed on a frame fixed in location with respect to the proof mass assembly, wherein the first element is a harmonic oscillator in oscillation, wherein oscillations of the harmonic oscillator are substantially harmonic, wherein when the oscillator is displaced from a reference position the oscillator experiences a restoring force proportional to the displacement, wherein the second element of the switch is located at a fixed trigger position of one or more fixed trigger positions within the amplitude range of the oscillation, wherein the fixed trigger positions are predefined physical locations with respect to a reference position of the first element;

determining at least one time period between successive triggering events; and using the at least one time period and the fixed trigger position of the second element to determine one or more parameters of the oscillation.

* * * * *